(12) United States Patent
Hachimine et al.

(10) Patent No.: US 7,105,394 B2
(45) Date of Patent: Sep. 12, 2006

(54) SEMICONDUCTOR DEVICE AND A METHOD OF MANUFACTURING THE SAME

(75) Inventors: Kiyota Hachimine, Mitaka (JP); Akihiro Shimizu, Fussa (JP); Nagatoshi Ooki, Shimizu (JP); Satoshi Sakai, Yokohama (JP); Naoki Yamamoto, Kawaguchi (JP)

(73) Assignees: Renesas Technology Corp., Tokyo (JP); Hitachi ULSI Systems Co., LTD, Tokyo (JP)

( * ) Notice: Subject to any disclaimer, the term of this patent is extended or adjusted under 35 U.S.C. 154(b) by 114 days.

(21) Appl. No.: 10/331,883

(22) Filed: Dec. 31, 2002

(65) Prior Publication Data

US 2003/0181005 A1 Sep. 25, 2003

(30) Foreign Application Priority Data

Mar. 19, 2002 (JP) .............................. 2002-076182

(51) Int. Cl.
*H01L 21/336* (2006.01)
*H01L 21/8234* (2006.01)

(52) U.S. Cl. ...................... 438/197; 438/585; 438/592

(58) Field of Classification Search ................ 438/197, 438/585, 592
See application file for complete search history.

(56) References Cited

U.S. PATENT DOCUMENTS 5,464,783 A * 11/1995 Kim et al. .................. 438/591
5,677,249 A * 10/1997 Fukui et al. ................. 438/128
6,057,241 A * 5/2000 Matsuda et al. ............ 438/689
6,559,012 B1 * 5/2003 Shukuri et al. ............. 438/275
6,646,313 B1 * 11/2003 Shukuri et al. ............. 257/392
6,661,096 B1 * 12/2003 Takayama et al. .......... 257/763
6,727,187 B1 * 4/2004 Takeshima et al. ......... 438/745
6,808,951 B1 * 10/2004 Ikeda et al. ................... 438/41
6,809,399 B1 * 10/2004 Ikeda et al. .................. 257/536
2002/0081794 A1 * 6/2002 Ito ............................. 438/200
2003/0139025 A1 * 7/2003 Lee et al. .................... 438/528
2004/0090838 A1 * 5/2004 Kuroda et al. .............. 365/200

* cited by examiner

*Primary Examiner*—Matthew Smith
*Assistant Examiner*—Khiem Nguyen
(74) *Attorney, Agent, or Firm*—Antonelli, Terry, Stout and Kraus, LLP.

(57) ABSTRACT

A method of manufacturing a semiconductor device having an n-type FET and p-type FET, each formed over a semiconductor substrate, calls for (a) forming, over the n-type FET and p-type FET, a first insulating film, for generating a tensile stress in the channel formation region of the n-type FET, to cover gate electrodes of the FETs, while covering, with an insulating film, a semiconductor region between the gate electrode of the p-type FET and an element isolation region of the semiconductor substrate; (b) selectively removing the first insulating film from the upper surface of the p-type FET by etching; (c) forming, over the n-type and p-type FETs, a second insulating film, for generating a compressive stress in the channel formation region of the p-type FET, to cover gate electrodes of the FETs; and (d) selectively removing the second insulating film from the upper surface of the n-type FET.

21 Claims, 45 Drawing Sheets

○ NMIS GATE LENGTH: 0.14 μm
△ PMIS GATE LENGTH: 0.14 μm

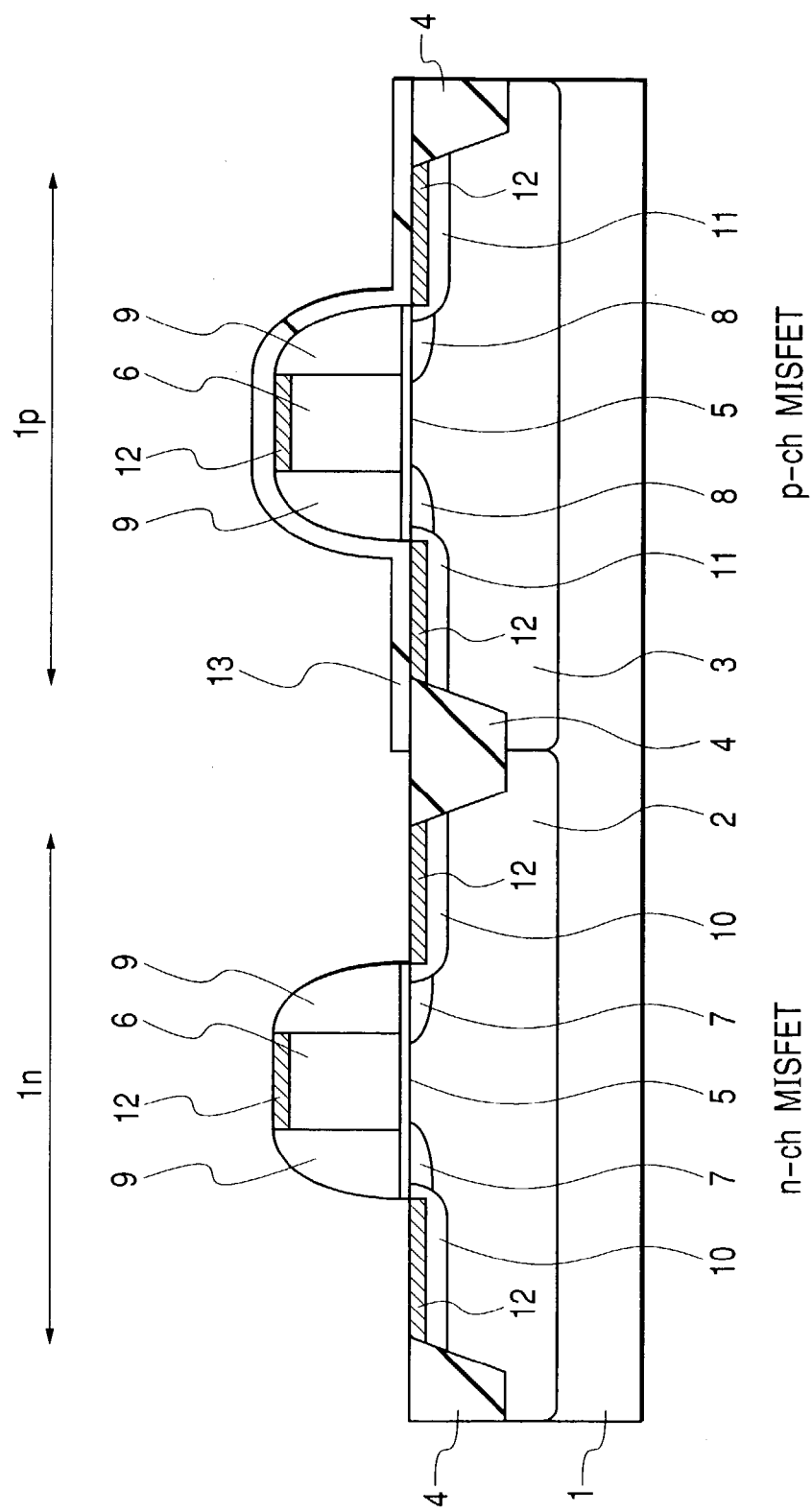

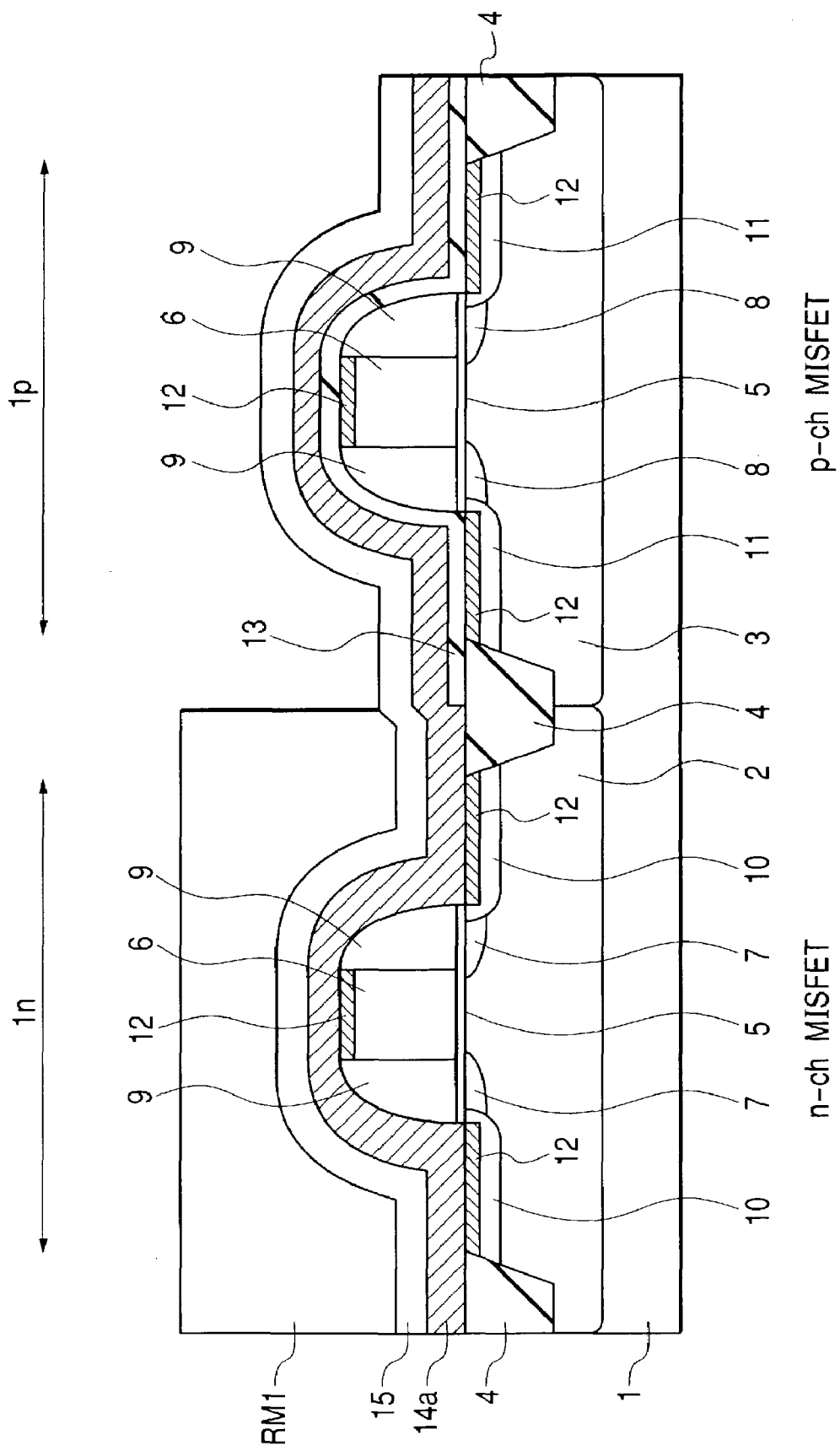

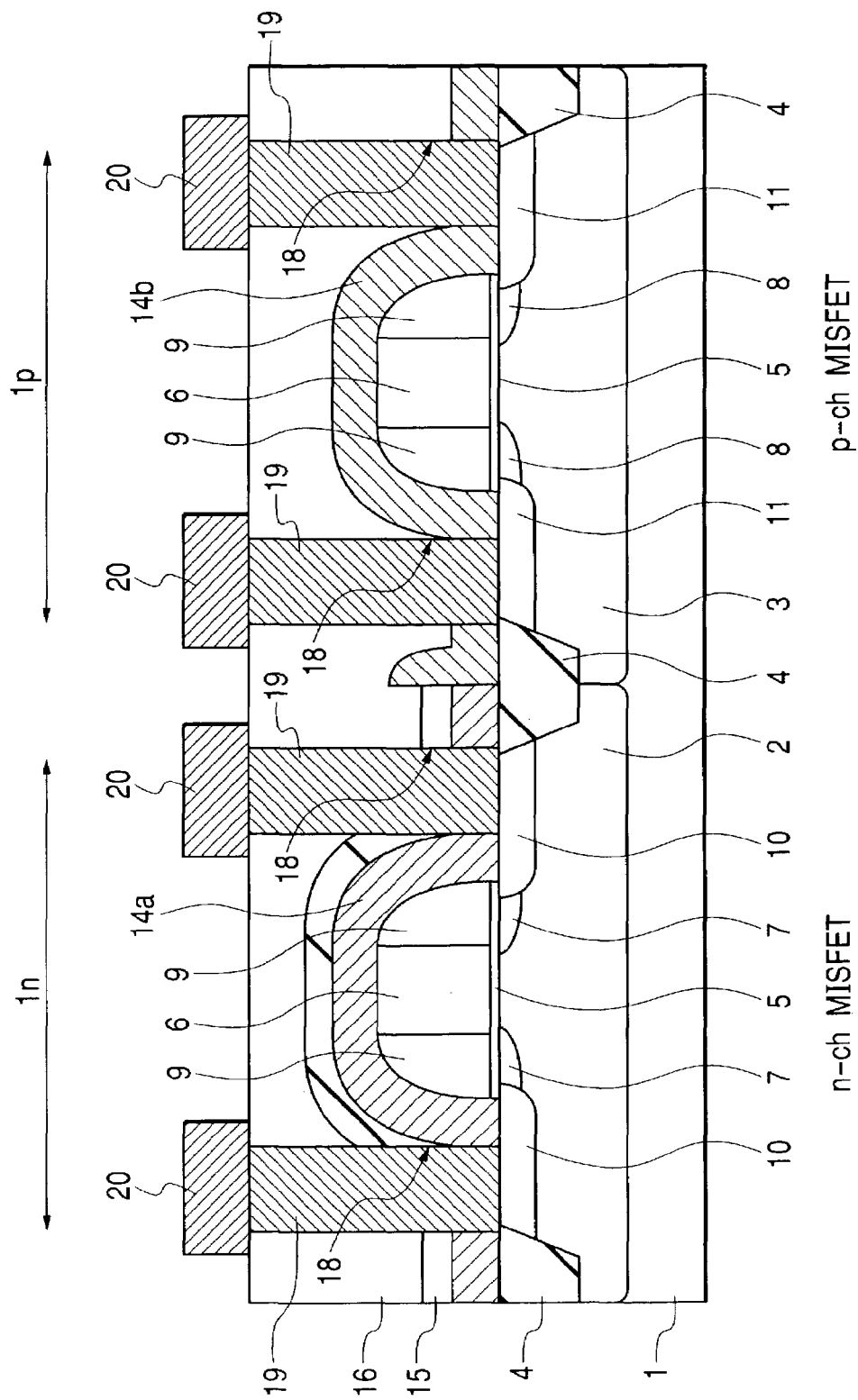

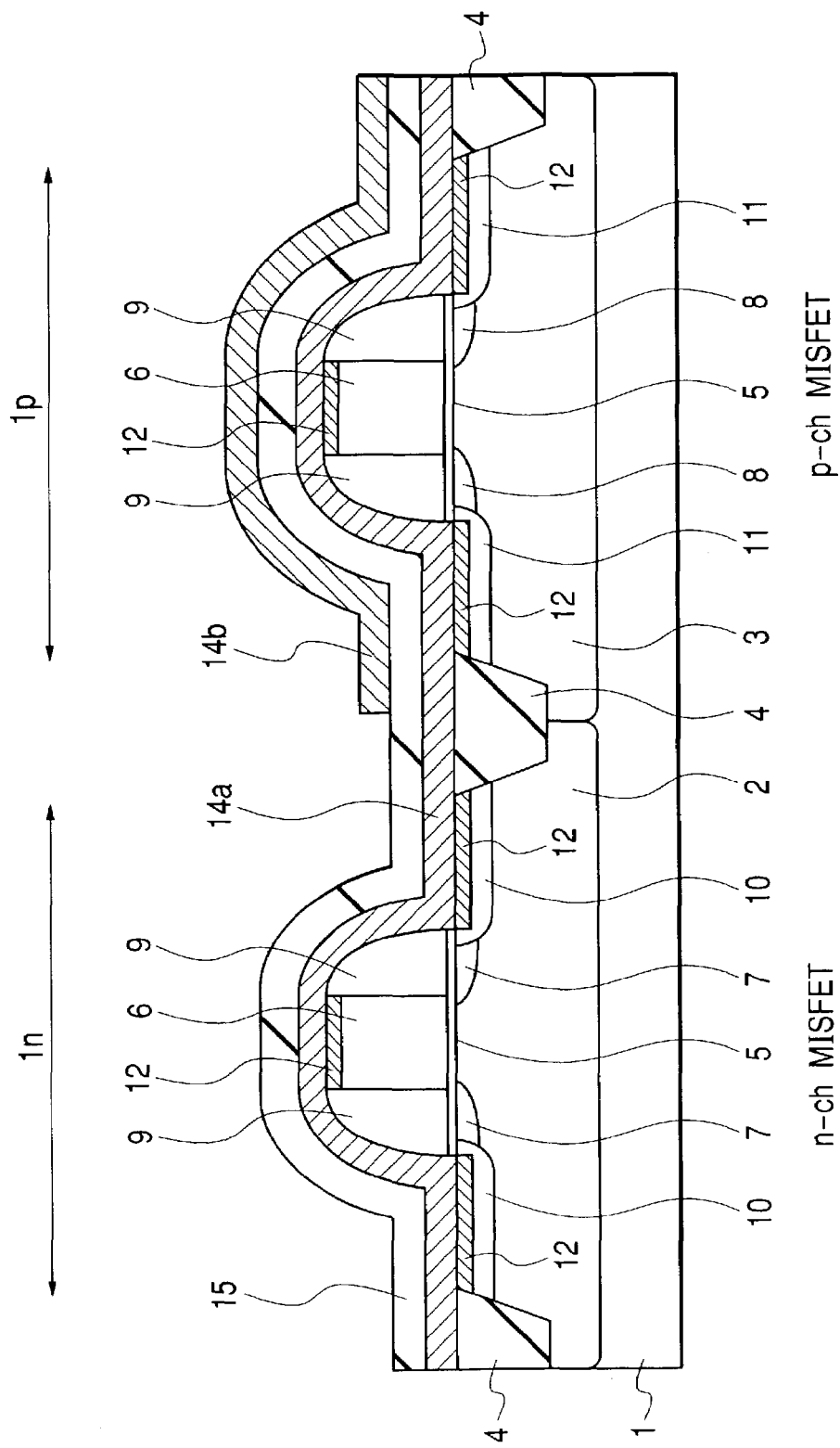

SEMICONDUCTOR DEVICE AND A METHOD OF MANUFACTURING THE SAME

TECHNICAL FIELD

The present invention relates to a semiconductor device and to a method of manufacture thereof; and, more particularly, the invention relates to a semiconductor device having, on the same substrate thereof, both an n-channel conductivity type field effect transistor and a p-channel conductivity type field effect transistor, and to a technique that is effective when applied to the manufacture of such a semiconductor device.

BACKGROUND OF THE INVENTION

One example of a field effect transistor installed on a semiconductor device is an insulated gate field effect transistor called a "MISFET" (Metal Insulator Semiconductor Field Effect Transistor). Owing to the characteristics of this MISFET that allow it to be readily applicable to high integration, it has been used widely as a circuit element constituting an integrated circuit.

Irrespective of whether it is of an n-channel conductivity type or p-channel conductivity type, a MISFET usually has a channel formation region, a gate insulating film, a gate electrode, a source region and a drain region. The gate insulating film is disposed in an element formation region on the circuit formation surface (main surface) of a semiconductor substrate, and it is formed, for example, of silicon oxide. The gate electrode is disposed over the element formation region of the circuit formation surface of the semiconductor substrate via the gate insulating film, and it is formed, for example, of a polycrystalline film having a resistance reducing impurity introduced therein. The channel formation region is disposed in a region (just below the gate electrode) of the semiconductor substrate opposite to the gate electrode. The source and drain regions are formed in semiconductor regions (impurity diffused regions) which are disposed on both sides of the channel formation region in the channel length direction.

A MISFET having, as a gate insulating film, a silicon oxide film is usually called a "MOSFET" (Metal Oxide Semiconductor Field Effect Transistor). The term "channel formation region" refers to a region in which a current passage (channel) connecting the source region and drain region is to be formed. A MISFET permitting a current flow in the thickness direction (depth direction) of the semiconductor substrate is called a "vertical type", while a MISFET permitting a current flow in the plane direction (surface direction) is called a "horizontal type". A MISFET permitting formation of a channel of electrons (conduction path) in the channel formation region between the source region and drain region (below the gate electrode) is called an n-type (or n-channel conductivity type), while that permitting formation of a channel of an electron hole is called a p-type (or p-channel conductivity type).

SUMMARY OF THE INVENTION

In the ultrafine CMIS (Complementary MIS) process in the range of 0.1 micron generation, the temperature has come to be set lower because of the introduction of a new material and suppression of a short channel effect of a MISFET. This tends to leave a process-induced residual stress in the element. The process-induced residual stress works on the surface layer portion of the circuit formation surface of a semiconductor substrate, that is, the channel formation region of a MISFET.

In the ordinarily employed CMIS (complementary MIS) process, the material used for the formation of an interlayer insulating film over the circuit formation surface of a semiconductor substrate is not different between the n-channel conductivity type MISFET and p-channel conductivity type MISFET. As a result, their stresses working on the channel formation region are substantially equal in one chip. It is the common practice to make a process-wise device in order to reduce the stress working on the channel formation regions of the n-channel conductivity type MISFET and p-channel conductivity type MISFET.

With regard to a change in the transistor characteristics depending on the stress of a channel formation region, when the stress is applied in a direction similar to that of the flow of the drain current (Id) (gate length direction), it is known that:

(1) the drain current of an n-channel conductivity type MISFET decreases owing to a compressive stress, while it increases owing to a tensile stress, and (2) the drain current of a p-channel conductivity type MISFET increases in response to a compressive stress, while it decreases in response to a tensile stress.

The change was, however, only several % or less (refer to the literature: IEEE TRANSACTIONS ON ELECTRON DEVICES, 38(4) APRIL, p 898–900 (1991)). In the process generation of a gate length size of 1 μm, such a small percentage is partly due to sufficient annealing at high temperatures for long hours.

An investigation by the present inventors has revealed that when the gate length of a MISFET is miniaturized to as small as 0.1 μm or so and the process is conducted at low temperatures, the residual stress heightens and the stress in the channel formation region has a large influence on the characteristics of the transistor.

For example, when a plasma CVD nitride film (a nitride film formed by plasma CVD) for self aligning contact, which film also serves as an interlayer insulating film, is formed under conditions varied after the formation of a MISFET, the stress in the film shows a change from a compressive direction toward a tensile direction, leading to a great change in the transistor characteristics of the MISFET. This change is shown in FIG. 2 as a dependence of drain current variation (%) on film stress. The value of the stress as in the drawing is not an internal stress of the channel formation region of a MISFET, but is the value of the interlayer insulating film itself found in terms of the warpage of the wafer after it is covered with the interlayer insulating film.

The influence of the stress shows a similar tendency to that described in the above-described literature, but the percent variation of the drain current is ±10 to 20%, a single digit increase. Depending on the stress of the film, the drain current of the n-channel conductivity type MISFET and that of the p-channel conductivity type MISFET exhibit opposite tendencies. In short, when the former increases, the latter decreases, and vice versa.

Accordingly, as the intensity of the internal stress changes with the conditions attendant to formation of an interlayer insulating film, the drain current of the n-type conductivity type MISFET and that of the p-type conductivity type MISFET exhibit opposite movements relative to each other. Thus, a simultaneous improvement in the drain currents of both elements cannot be accomplished.

On and after the 0.1 micron generation, a percentage variation in the drain current due to this tress reaches ±10 to 20% or greater, causing a change in the balance of the drain currents of the n-channel conductivity type MISFET and p-channel conductivity type MISFET.

Therefore, it is an object of the present invention to provide a technique that is capable of increasing the drain current of each of the n-channel conductivity type MISFET and p-channel conductivity type MISFET (increasing the current driving capacity).

Another object of the present invention is to provide a technique that enables free setting of a drain current ratio between the n-channel conductivity type MISFET relative to that of the p-channel conductivity type MISFET.

Of the features of the invention disclosed in the present application, an outline of typical aspects of the invention will be described briefly.

The gist of the present invention resides in the control, by the stress of the film, of stress working on the channel formation region of each of the n-channel conductivity type MISFET and the p-channel conductivity type MISFET, so as to increase their drain currents. In the n-channel conductivity type field effect transistor, when a tensile stress appears, along the flow direction of the drain current (gate length direction), on the channel formation region, the drain current increases. In the p-channel conductivity type field effect transistor, when a compressive stress appears, along the flow direction of the drain current (gate length direction), on the channel formation region, the drain current increases. In other words, the stress of a film is utilized to control tensile stress in the drain current direction to work on the channel formation region of the n-channel conductivity type field effect transistor, and a compressive stress in the drain current direction to work is utilized on the channel formation region of the p-channel conductivity type field effect transistor. This can be attained, for example, by the below-described method or device.

(1) A method of manufacturing a semiconductor device having an n-channel conductivity type field effect transistor and a p-channel conductivity type field effect transistor, each formed over a semiconductor substrate, which comprises:

(a) forming, over the n-channel conductivity type field effect transistor and p-channel conductivity type field effect transistor, a first insulating film for generating a tensile stress in the channel formation region of the n-channel conductivity type field effect transistor so as to cover gate electrodes of these transistors, while covering, with an insulating film, a semiconductor region between the gate electrode of the p-channel conductivity type field effect transistor and an element isolation region of the semiconductor substrate;

(b) selectively removing the first insulating film over the p-channel conductivity type field effect transistor by etching;

(c) forming, over the n-channel conductivity type field effect transistor and the p-channel conductivity type field effect transistor, a second insulating film for generating a compressive stress in the channel formation region of the p-channel conductivity type field effect transistor so as to cover the gate electrodes of the transistors; and (d) selectively removing the second insulating film over the n-channel conductivity type field effect transistor.

(2) A method of manufacturing a semiconductor device having an n-channel conductivity type field effect transistor and a p-channel conductivity type field effect transistor, each formed over a semiconductor substrate, which comprises:

(a) forming, over the n-channel conductivity type field effect transistor and p-channel conductivity type field effect transistor, a first insulating film for generating a compressive stress in the channel formation region of the p-channel conductivity type field effect transistor so as to cover gate electrodes of the transistors, while covering, with an insulating film, a semiconductor region between the gate electrode of the n-channel conductivity type field effect transistor and an element isolation region of the semiconductor substrate;

(b) selectively removing the first insulating film over the n-channel conductivity type field effect transistor by etching;

(c) selectively forming, over the n-channel conductivity type field effect transistor and the p-channel conductivity type field effect transistor, a second insulating film for generating a tensile stress in the channel formation region of the n-channel conductivity type field effect transistor so as to cover the gate electrodes of the transistors; and (d) selectively removing the second insulating film over the p-channel conductivity type field effect transistor.

(3) The method described above in (1) or (2) wherein:
the insulating film covering the semiconductor region includes sidewall spacers formed on the sidewalls of each of the gate electrodes and a deposited film formed to cover the sidewall spacers.

(4) The method described above in (1) or (2) wherein:
the insulating film covering the semiconductor region includes sidewall spacers formed on the sidewalls of each of the gate electrodes and a deposited film formed to cover the sidewall spacers; and
over the surface of the semiconductor region, a metal-semiconductor reacted layer formed in alignment with the sidewall spacers is disposed.

(5) The method described above in (1) or (2) wherein:
the insulating film covering the semiconductor region includes sidewall spacers formed on the sidewalls of each of the gate electrodes and a thermally oxidized film formed between the sidewall spacers and the element isolation region.

(6) The method described above in (1) or (2) wherein:
the insulating film covering the semiconductor region includes sidewall spacers formed on the sidewalls of each of the gate electrodes and a thermally oxidized film formed between the sidewall spacers and the element isolation region; and
over the surface of the semiconductor region, a metal-semiconductor reacted layer formed in alignment with the sidewall spacers is disposed.

(7) The method described above in (1) or (2) wherein:
the first and second insulating films are each a silicon nitride film formed by the LP-CVD (Low Pressure-Chemical Vapor Deposition) method, plasma CVD method, or single-wafer thermal CVD method.

(8) A method of manufacturing a semiconductor device having an n-channel conductivity type field effect transistor and a p-channel conductivity type field effect transistor, each formed over a semiconductor substrate, which comprises:

(a) forming first sidewall spacers over a semiconductor region between each of gate electrodes of the n channel conductivity type and p channel conductivity type field effect transistors and an element isolation region of the semiconductor substrate;

(b) forming, over the surface of the semiconductor region, a metal-semiconductor reacted layer in alignment with the first sidewall spacers;

(c) forming second sidewall spacers over the metal-semicondutor reacted layer in alignment with the first sidewall spacers, (d) forming, over the n-channel conductivity type and p-channel conductivity type field effect transistors, a first insulating film for generating a tensile stress in the channel formation region of the n-channel conductivity type field effect transistor so as to cover the gate electrodes of the transistors;

(e) selectively removing the first insulating film over the p-channel conductivity type field effect transistor by etching;

(f) forming, over the n-channel conductivity type field effect transistor and the p-channel conductivity type field effect transistor, a second insulating film for generating a compressive stress in the channel formation region of the p-channel conductivity type field effect transistor so as to cover the gate electrodes of the transistors; and (g) selectively removing the second insulating film over the n-channel conductivity type field effect transistor.

(9) A method of manufacturing a semiconductor device having an n-channel conductivity type field effect transistor and a p-channel conductivity type field effect transistor, each formed over a semiconductor substrate, which comprises:

(a) forming first sidewall spacers over a semiconductor region between each of gate electrodes of the n channel conductivity type and p channel conductivity type field effect transistors and an element isolation region of the semiconductor substrate;

(b) forming, over the surface of the semiconductor region, a metal-semiconductor reacted layer in alignment with the first sidewall spacers;

(c) forming second sidewall spacers over the metal-semicondutor reacted layer in alignment with the first sidewall spacers, (d) forming, over the n-channel conductivity type and p-channel conductivity type field effect transistors, a first insulating film for generating a compressive stress in the channel formation region of the p-channel conductivity type field effect transistor so as to cover gate electrodes of the transistors;

(e) selectively removing the first insulating film over the n-channel conductivity type field effect transistor by etching;

(f) forming, over the n-channel conductivity type field effect transistor and the p-channel conductivity type field effect transistor, a second insulating film for generating a tensile stress in the channel formation region of the n-channel conductivity type field effect transistor so as to cover the gate electrodes of the transistors; and (g) selectively removing the second insulating film over the p-channel conductivity type field effect transistor.

(10) The method described above in (8) or (9) wherein:

the first and second insulating films are each a silicon nitride film formed by the LP-CVD method, plasma CVD method, or single-wafer thermal CVD method.

(11) A method of manufacturing a semiconductor device having an n-channel conductivity type field effect transistor and a p-channel conductivity type field effect transistor, each formed over a semiconductor substrate, which comprises:

(a) forming a first insulating film having a tensile stress over the n-channel conductivity type field effect transistor and the p-channel conductivity type field effect transistor so as to cover the gate electrode of each of the transistors, (b) forming a second insulating film having a compressive stress greater in terms of absolute value than a tensile stress of the first insulating film over the n-channel conductivity type field effect transistor and the p-channel conductivity type field effect transistor so as to cover the gate electrode of each of the transistors; and (c) selectively removing the second insulating film over the n-channel conductivity type field effect transistor by etching.

The compressive stress of the second insulating film is at least twice as much as the tensile stress of the first insulating film.

The first and second insulating films are each a silicon nitride film formed by the LP-CVD method, plasma CVD method, or single-wafer thermal CVD method.

(12) A method of manufacturing a semiconductor device having an n-channel conductivity type field effect transistor and a p-channel conductivity type field effect transistor, each formed over a semiconductor substrate, which comprises:

(a) forming a first insulating film having a compressive stress over the n-channel conductivity type field effect transistor and the p-channel conductivity type field effect transistor so as to cover the gate electrode of each of the transistors, (b) forming a second insulating film having a tensile stress greater in terms of absolute value than a compressive stress of the first insulating film over the n-channel conductivity type field effect transistor and p-channel conductivity type field effect transistor so as to cover the gate electrode of each of the transistors; and (c) selectively removing the second insulating film over the p-channel conductivity type field effect transistor by etching.

The tensile stress of the second insulating film is at least twice as much as the compressive stress of the first insulating film.

The first and second insulating films are each a silicon nitride film formed by the LP-CVD method, plasma CVD method, or single-wafer thermal CVD method.

(13) A semiconductor device having an n-channel conductivity type field effect transistor and a p-channel conductivity type field effect transistor, each formed over a semiconductor substrate, which comprises:

a first insulating film having a tensile stress and being formed over the n-channel conductivity type field effect transistor and p-channel conductivity type field effect transistor so as to cover the gate electrodes of the transistors, and a second insulating film having a compressive stress greater in terms of absolute value than a tensile stress of the first insulating film and being formed over the p-channel conductivity type field effect transistor so as to selectively cover the gate electrode thereof.

The tensile stress of the second insulating film is at least twice as much as the compressive stress of the first insulating film.

The first and second insulating films are each a silicon nitride film formed by the LP-CVD method, plasma CVD method, or single-wafer thermal CVD method.

(14) A semiconductor device having an n-channel conductivity type field effect transistor and a p-channel conductivity type field effect transistor, each formed over a semiconductor substrate, which comprises:

a first insulating film having a compressive stress and being formed over the n-channel conductivity type field effect transistor and p-channel conductivity type field effect transistor so as to cover the gate electrodes of the transistors, and a second insulating film having a tensile stress greater in terms of absolute value than the compressive of the first insulating film and being formed over the n-channel conductivity type field effect transistor so as to selectively cover the gate electrode thereof.

The tensile stress of the second insulating film is at least twice as much as the compressive stress of the first insulating film.

The first and second insulating films are each a silicon nitride film formed by the LP-CVD method, plasma CVD method, or single-wafer thermal CVD method.

(15) A method of manufacturing a semiconductor device having an n-channel conductivity type field effect transistor and a p-channel conductivity type field effect transistor each formed over a semiconductor substrate, which comprises:

forming an insulating film having a tensile stress over the n-channel conductivity type field effect transistor and p-channel conductivity type field effect transistor so as to cover the gate electrodes of the transistors, and introducing an element into the insulating film over the p-channel conductivity type field effect transistor, thereby converting the insulating film into a film capable of generating a compressive stress in the channel formation region of the p-channel conductivity type field effect transistor.

The element is same with an element contained in the insulating film.

The introduction of the element is conducted by ion implantation of the element perpendicularly to the substrate or ion implantation of the element obliquely to the substrate.

The insulating film is a silicon nitride film formed by the LP-CVD method, plasma CVD method, or single-wafer thermal CVD method.

(16) A semiconductor device having an n-channel conductivity type field effect transistor and a p-channel conductivity type field effect transistor, each formed over a semiconductor substrate, which comprises:

a film formed over the n-channel conductivity type and p-channel conductivity type field effect transistors so as to cover the gate electrode thereof, the film having a first portion having a film stress for generating a tensile stress in the channel formation region of the n-channel conductivity type field effect and a second portion having a film stress for generating a compressive stress in the channel formation region of the p-channel conductivity type field effect transistor.

The second portion of the film has a higher element concentration than the first portion.

The film is a silicon nitride film formed by the LP-CVD method, plasma CVD method, or single-wafer thermal CVD method.

According to the above-described methods, a tensile stress and a compressive stress are applied to the channel formation regions of the n-channel conductivity type field effect transistor and p-channel conductivity type field effect transistor, respectively, resulting in an increase in the drain current of each of the n-channel conductivity type field effect transistor and p-channel conductivity type field effect transistor, depending on the intensity of the stress working on each of the channel formation regions of the n-channel conductivity type field effect transistor and p-channel conductivity type field effect transistor, as illustrated in FIG. 2.

The stresses working on the channel formation regions of the n-channel conductivity type field effect transistor and p-channel conductivity type field effect transistor, respectively, make it possible to freely control the drain current ratio of the n-channel conductivity type field effect transistor relative to the p-channel conductivity type field effect transistor.

The above-described film is an insulating film made of a silicon nitride film for self-aligning contact (SAC).

(17) A semiconductor device, which comprises:

a first field effect transistor formed over a semiconductor substrate and having a silicide layer over a semiconductor region between sidewall spacers disposed on the sidewalls of the gate electrode of said first transistor and an element isolation region of said semiconductor substrate;

a second field effect transistor formed over said semiconductor substrate and having no silicide layer over a semiconductor region between sidewall spacers disposed on the sidewalls of the gate electrode of said second transistor and an element isolation region of said semiconductor substrate;

a first insulating film for generating a stress in the channel formation region of said first field effect transistor and formed over said first field effect transistor so as to cover the gate electrode thereof, and a second insulating film for generating a stress in the channel formation region of said second field effect transistor and formed over said second field effect transistor so as to cover the gate electrode thereof; wherein:

between the semiconductor region of said second field effect transistor and said second insulating film, a third insulating film is disposed; and between the silicide layer of said first field effect transistor and said first insulating film, said third insulating film is not disposed.

The definitions of some terms used herein are set forth below.

The term "tensile stress working on the channel formation region of a field effect transistor" means a stress at which the lattice constant of Si exceeds its equilibrium in the case where the channel formation region is silicon (Si).

The term "compressive stress working on the channel formation region of a field effect transistor" means a stress at which the lattice constant of Si falls below its equilibrium in the case where the channel formation region is silicon (Si).

The term "tensile stress of a film" means a stress which generates a tensile stress in the channel formation region of a field effect transistor.

The term "compressive stress of a film" means a stress which generates a compressive stress in the channel formation region of a field effect transistor.

The gist of the present invention therefore resides in the fact that the interatomic distance of silicon atoms in the channel formation region differs between the n-channel conductivity type field effect transistor and the p-channel conductivity type field effect transistor, in other words, they are different in the size of distortion; and that the interatomic distance of silicon atoms is greater in the channel formation region of the n-channel conductivity type field effect transistor than in the channel formation region of the p-channel conductivity type field effect transistor.

The above-described objects, other objects and novel features of the present invention will be apparent from the description herein and the accompanying drawings.

The present inventors have found novel problems during the development of the present invention. These problems will be described later together with the description of the Embodiments to which the present invention is applied.

BRIEF DESCRIPTION OF THE DRAWINGS

FIGS. 26A and 26B are each a schematic cross-sectional view illustrating the semiconductor device of Embodiment 2 at a manufacturing step thereof;

FIGS. 30A and 30B are each a schematic cross-sectional view illustrating the rough constitution of a semiconductor device according to Embodiment 5 of the present invention;

FIG. 31 is a schematic cross-sectional view illustrating the rough constitution of a semiconductor device according to Embodiment 6 of the present invention;

DETAILED DESCRIPTION OF THE INVENTION

Figure 1:
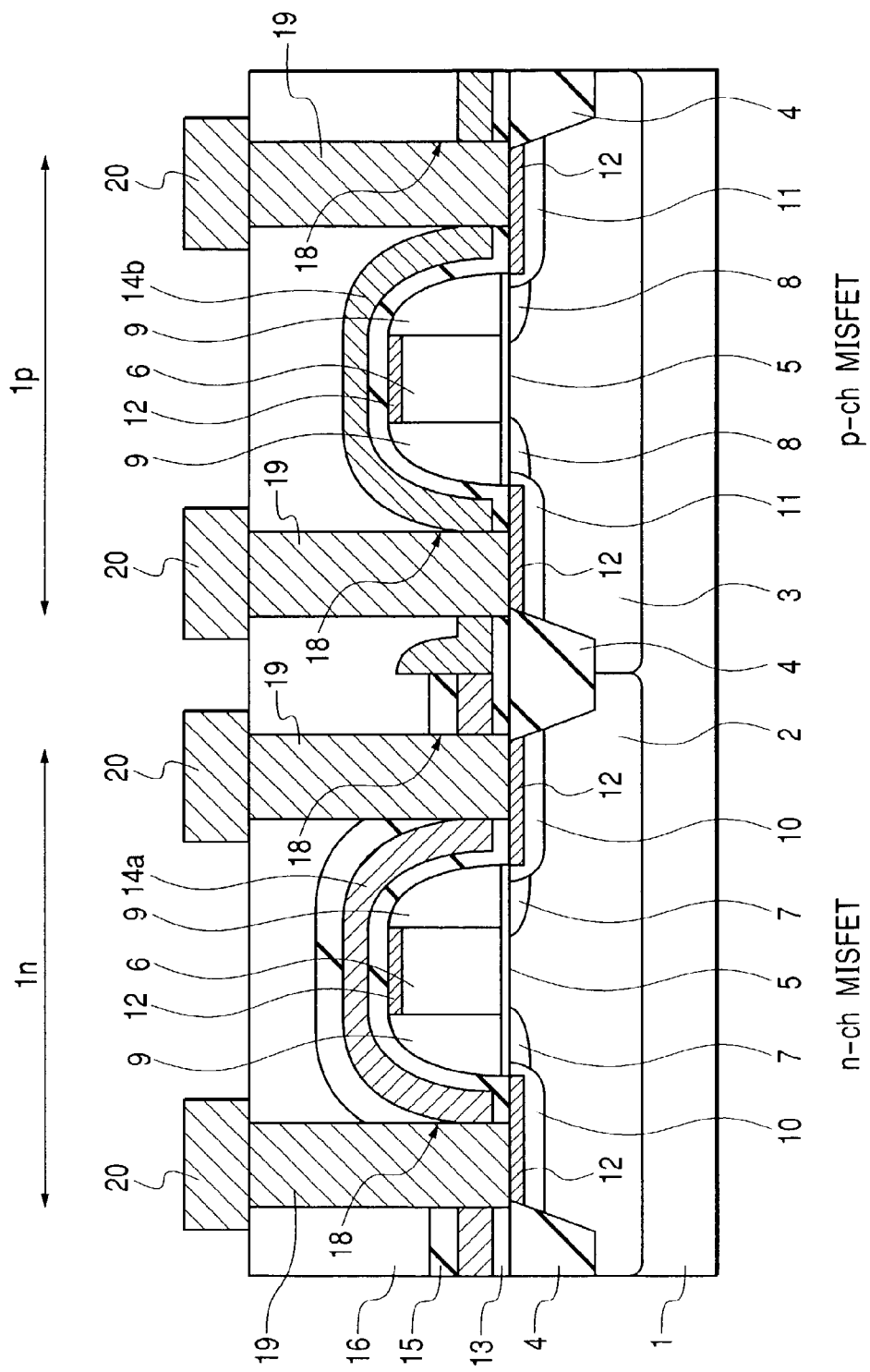
FIG. 1 is a schematic cross-sectional view illustrating the rough constitution of a semiconductor device according to Embodiment 1 of the present invention.
Figure 2:
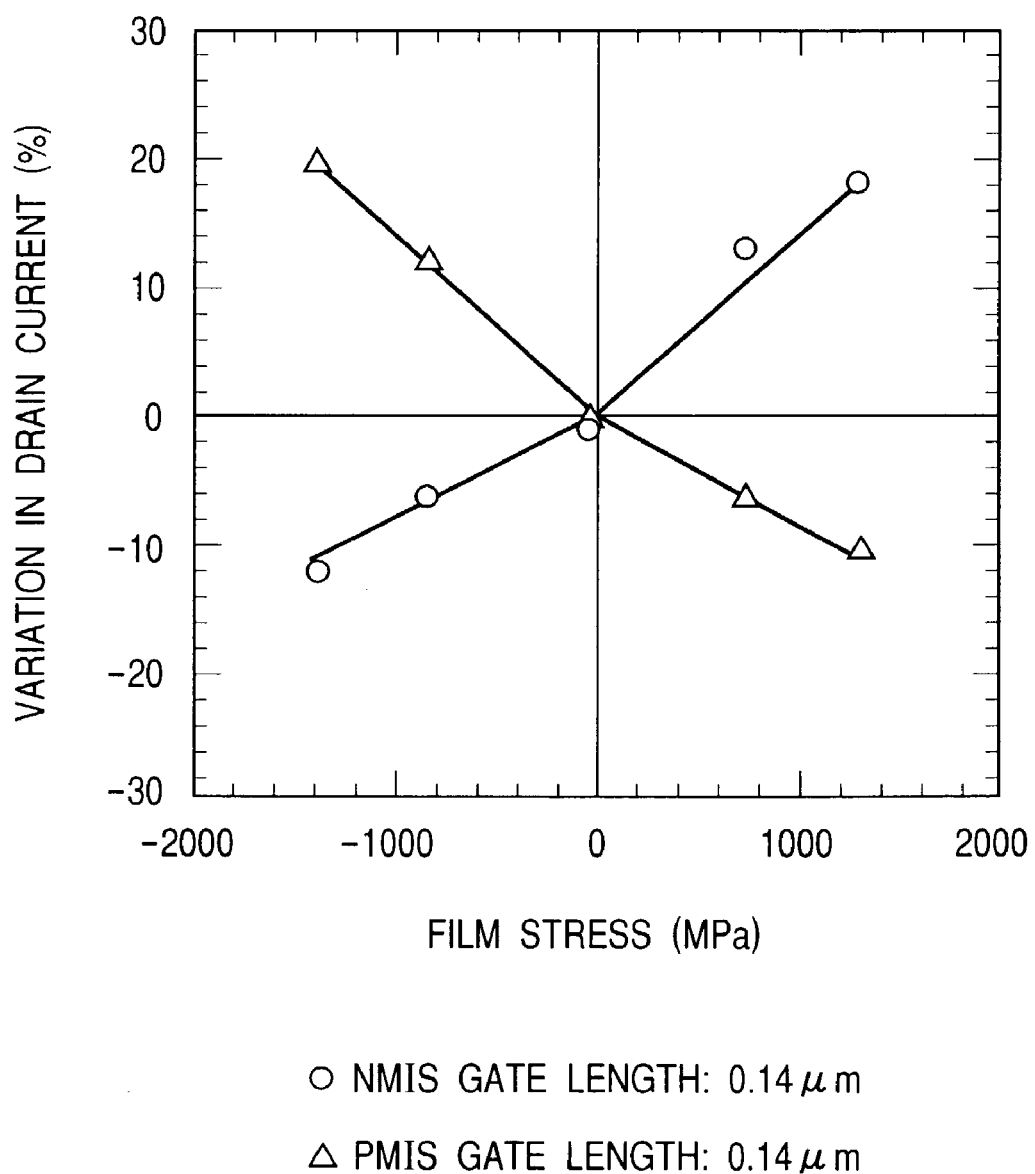
FIG. 2 is a characteristic chart showing dependence, on film stress, of a percent variation in drain current.

Embodiments of the present invention will be described in detail based on the accompanying drawings. In all of the drawings, members of a like function will be identified by like reference numerals and overlapping descriptions thereof will be omitted. In order to facilitate an understanding of the drawings, some cross-sections are not hatched.

Embodiment 1

In Embodiment 1, application of the present invention to a semiconductor device having a complementary MISFET structure and having a power-supply voltage of from 1 to 1.5V and a gate length of from 0.1 to 0.14 μm will be described.

In FIG. 1 and FIGS. 5 to 19, an n channel conductivity type MISFET (n-type MISFET) is illustrated on the left side, while a p channel conductivity type MISFET (p-type MISFET) is illustrated on the right side.

As illustrated in FIG. 1, the semiconductor device according to this Embodiment has a semiconductor substrate composed mainly of a p type silicon substrate (which will hereinafter simply be called a "p type substrate") made of, for example, single crystal silicon. The circuit formation surface (one main surface) of the p type substrate 1 has thereon an nMIS formation region (first element formation region) 1n and a pMIS formation region (second element formation region) 1p, and the nMIS formation region 1n is separated from the pMIS formation region 1p by an element isolation region, such as a shallow groove isolation (SGI) region 4. In the nMIS formation region 1n, a p type well 2 and an n channel conductivity type MISFET (which will hereinafter simply be called an "n-type MISFET") are formed, while in the PMIS formation region 1p, an n type well region 3 and a p channel conductivity type MISFET (which will hereinafter simply be called a "p-type MISFET") are formed. The shallow groove isolation region 4 is formed by making a shallow groove in the circuit formation surface of the p type substrate 1, and then selectively embedding the inside of the shallow groove with an insulating film (for example, a silicon oxide film). The n-type and p-type MISFETS of this Embodiment each has a horizontal structure permitting flow of an electric current in the plane direction of the p type substrate 1.

The n-type MISFET has mainly a channel formation region, a gate insulating film 5, a gate electrode 6, sidewall spacers 9, a source region and a drain region. The source and drain regions have n type semiconductor regions (extension regions) 7 and n type semiconductor regions 10. The n type semiconductor regions 7 are formed in self alignment with the gate electrode 6, while the n type semiconductor regions 10 are formed in self alignment with the sidewall spacers 9 disposed on the sidewalls of the gate electrode 6. The n type semiconductor regions 10 are formed to have a higher impurity concentration than the n type semiconductor regions 7.

The p-type MISFET has mainly a channel formation region, a gate insulating film 5, a gate electrode 6, sidewall spacers 9, a source region and a drain region. The source and drain regions have p type semiconductor regions (extension regions) 8 and p type semiconductor regions 11. The p type semiconductor regions 8 are formed in self alignment with the gate electrode 6, while the p type semiconductor regions 11 are formed in self alignment with sidewall spacers 9 disposed on the sidewalls of the gate electrode 6. The p type semiconductor regions 11 are formed to have a higher impurity concentration than the p type semiconductor regions 8.

Over the surface of each of the gate electrode 6, n type semiconductor regions 10 and p type semiconductor regions 11, a silicide layer (metal-semiconductor reaction layer) 12 is formed in order to lower the resistance. The silicide layer 12 disposed over the surface of the gate electrode 6, the silicide layer disposed on the surface of each of the n type semiconductor regions 10 and p type semiconductor regions 11 is formed in self alignment with the sidewall spacers 9 disposed over the sidewalls of the gate electrode 6. These silicide layers 12 are formed, for example, by the salicide (Self Aligned Silicide) technique. The n-type and p-type MISFETS of this Embodiment each has a salicide structure.

Over the circuit formation surface of the p type substrate 1, an interlayer insulating film 16 is formed, for example, from silicon oxide. This interlayer insulating film 16 is formed to cover the circuit formation surface of the p type substrate 1. Between the n-type MISFET and interlayer insulating film 16, there is formed, for example, a silicon nitride film 14a, which is a first nitride film serving to generate a tensile stress on the circuit formation surface of the p type substrate 1. Between the p type MISFET and interlayer insulating film 16, there is formed, for example, a silicon nitride film 14b, which is a second nitride film serving to generate a compressive stress on the circuit formation surface of the p type substrate 1. In this Embodiment, the silicon nitride film 14a is selectively formed over the n-type MISFET to cover its gate electrode 6, while the silicon nitride film 14b is selectively formed over the p-type MISFET to cover its gate electrode 6.

Between the n-type MISFET and silicon nitride film 14a, and between the p-type MISFET and silicon nitride film 14b, an insulating film 13 made of, for example, silicon oxide is formed. This insulating film 13 is formed on the circuit formation surface of the p type substrate 1 to cover each of the n-type and p-type MISFETs.

Between the silicon nitride film 14a and the interlayer insulating film 16, an insulating film 15 made of, for example, silicon oxide is formed. This insulating film 15 is formed over the silicon nitride film 14a selectively to cover this silicon nitride film 14a.

Over the n type semiconductor regions 10 and p type semiconductor regions 11, contact holes 18 for source-drain are formed so as to extend from the surface of the interlayer insulating film 16 to the silicide layer 12. Inside of these contact holes 18 for source-drain, a conductive plug 19 is embedded. The n type semiconductor regions 10 and p type semiconductor regions 11 are each electrically connected, via the silicide layer 12 and conductive plug 19, to an interconnect 20 which extends over the interlayer insulating film 16.

Although not illustrated, a contact hole for a gate, which hole extends from the surface of the interlayer insulating film 16 to the silicide layer 12, is formed over the gate electrode 6. A conductive plug 19 is embedded inside of this gate contact hole. The gate electrode 6 is electrically connected, via the silicide layer 12 and the conductive plug 19 inside of the gate contact hole, to an interconnect 20 extending over the interlayer insulating film 16.

The source-drain contact hole 18 and gate contact hole are each formed by the SAC (Self Aligned Contact Hole) technique using the silicon nitride films 14a, 14b as an etching stopper. In other words, the silicon nitride films 14a, 14b serve as an insulating film for self aligned contact.

These silicon nitride films 14a, 14b are formed, for example, by the plasma CVD (Chemical Vapor Deposition) method. The stress to be generated on the circuit formation surface of the p type substrate 1 can be controlled by changing the conditions present in the forming of these silicon nitride films 14a, 14b (reactive gas, pressure, temperature, RF power, etc.). In this Embodiment, a stress generated on the circuit formation surface of the p type substrate 1 is controlled toward a tensile stress by forming the silicon nitride film 14a under the conditions of an RF power lowered to a range of from 300 to 400 W. On the other hand, a stress generated on the circuit formation surface of the p type substrate 1 is controlled toward a compressive stress by forming the silicon nitride film 14b under the conditions of an RF power heightened to a range of from 600 to 700 W.

A tensile stress of from about +700 to +800 Mpa exists in the silicon nitride film 14a and a compressive stress of from about −900 to −1000 Mpa exists in the silicon nitride film 14a, each formed in the above-described manner, so that a tensile stress appears in the channel formation region of the n-type MISFET and a compressive stress appears in the channel formation region of the p-type MISFET, resulting in a 10 to 15% improvement in the drain current of the n-type MISFET and a 15 to 20% improvement in the drain current of the p-type MISFET compared with the case in which the regions are not covered with the silicon nitride films 14a, 14b. As described above, these stresses are applied in a direction similar to that of the drain current (Id) flowing through the channel formation region (that is, the gate length direction).

Figure 3:
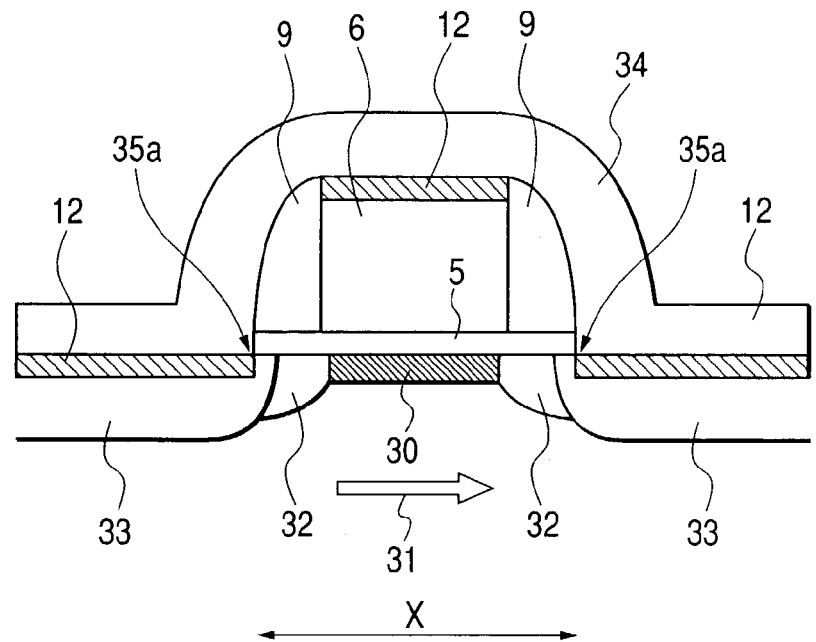
FIG. 3 is a schematic cross-sectional view illustrating the relationship between a current direction and a film stress direction.
Figure 4:
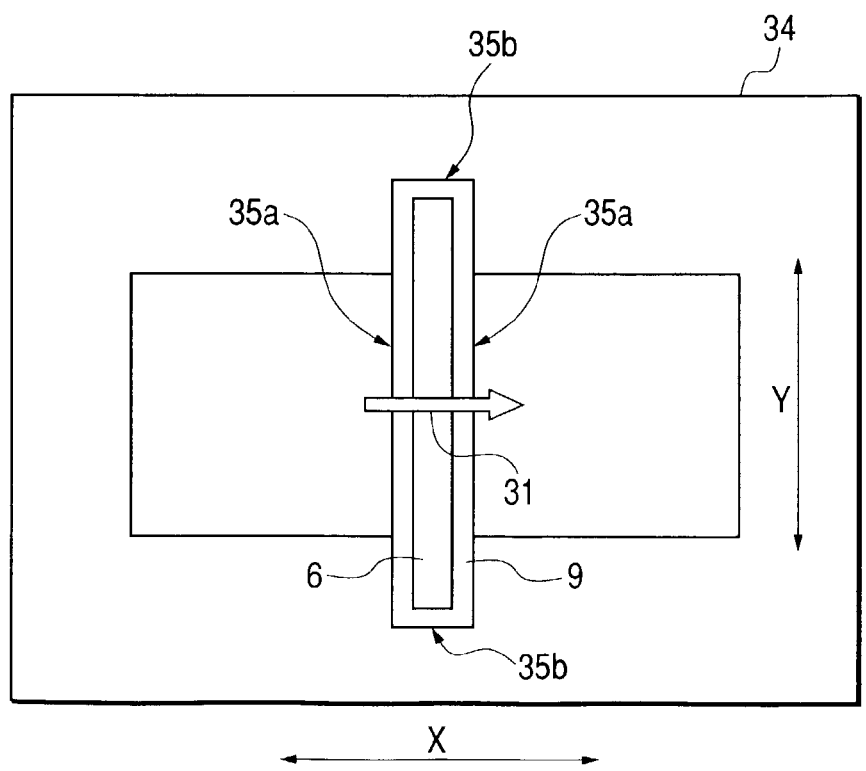
FIG. 4 is a schematic plane view illustrating the relationship between a current direction and a film stress direction.

A stress appearing in the channel formation region of the MISFET will next be described using a simplified drawing and reference numerals a little different from those of this Embodiment. The MISFET as illustrated in FIGS. 3 and 4 has a silicide structure similar to that of this Embodiment. As seen in these figures, the MISFET has a channel formation region 30, the arrow 31 indicating the direction of the drain current flowing through the channel formation region 30; a semiconductor region 32 formed in alignment with the gate electrode 6; a semiconductor region 33 formed in alignment with the sidewall spacer 9; a film 34 for generating a stress in the channel formation region 30; and step portions 35a and 35b.

As illustrated in FIGS. 3 and 4, the MISFET has sidewall spacers 9 disposed over the sidewalls of the gate electrode 6 to surround the gate electrode 6. The gate electrode 6 and sidewall spacers 9 protrude from the substrate so that step portions (35a, 35b) resulting from them appear. When a film 34 is formed over a MISFET having such a structure to cover the gate electrode 6 in order to generate a stress (tensile stress or compressive stress) in the channel formation region 30, the stress concentrates on the foot of the step portion 35a existing in the gate length direction X and on the foot of the step portion 35b existing in the gate width direction Y, so that the film stress in the gate length direction, which stress starts from the foot of the step portion 35a existing in the gate length direction X, acts on the channel formation region 30; and, at the same time, the film stress in the gate width direction, which stress starts from the foot of the step portion 35b existing in the gate width direction Y, acts on the channel formation region 30. In other words, when the stress produced by the film 34 is a tensile stress, the tensile stress appears in the channel formation region 30 in the gate length direction and gate width direction; while, when the stress produced by the film 34 is a compressive stress, the compressive stress appears in the channel formation region 30 in the gate length direction and gate width direction.

The length of the gate electrode 6 in the gate length direction X is by far smaller than its length in the gate width direction Y, so that the tensile stress or compressive stress in the gate width direction, which stress appears in the channel formation region 30 by a tensile stress or a compressive stress focused on the foot of the step portion 35b in the gate width direction Y, is markedly small. Accordingly, the stress appearing in the channel formation region 30 due to the film 34 can be regarded substantially as only a tensile stress or compressive stress in the gate length direction, in other words, as a tensile stress or compressive stress along the drain current direction 31.

It is reported that in the p type MISFET, a decrease in the drain current occurs when a compressive stress in the gate width direction is applied on the channel formation region 30. With regard to the control, by the film 34, of stress on the channel formation region 30, the drain current of the p-type MISFET can be increased efficiently, because, as described above, the compressive stress in the gate width direction, which stress appears in the channel formation region 30, is markedly small. Stress control of the channel formation region 30 by the film 34 is therefore particularly effective for the p-type electric field transistor.

Since the stress caused in the channel formation region 30 by the stress of the film 34 decreases as the starting point of the film stress departs from the channel formation region 30, it is desired to place the starting point of the film stress as close as possible to the channel formation region 30. In the above description, it is indicated that stress starts from the foot of the step portions (35a, 35b) resulting from the gate electrode 6 and sidewall spacers 9. In the case of MISFET without sidewall spacers 9, the foot of each of the sidewalls of the gate electrode 6 becomes a starting point of the film stress.

The fabrication of the semiconductor device of Embodiment 1 will be described next, based on FIGS. 5 to 19.

Figure 5:
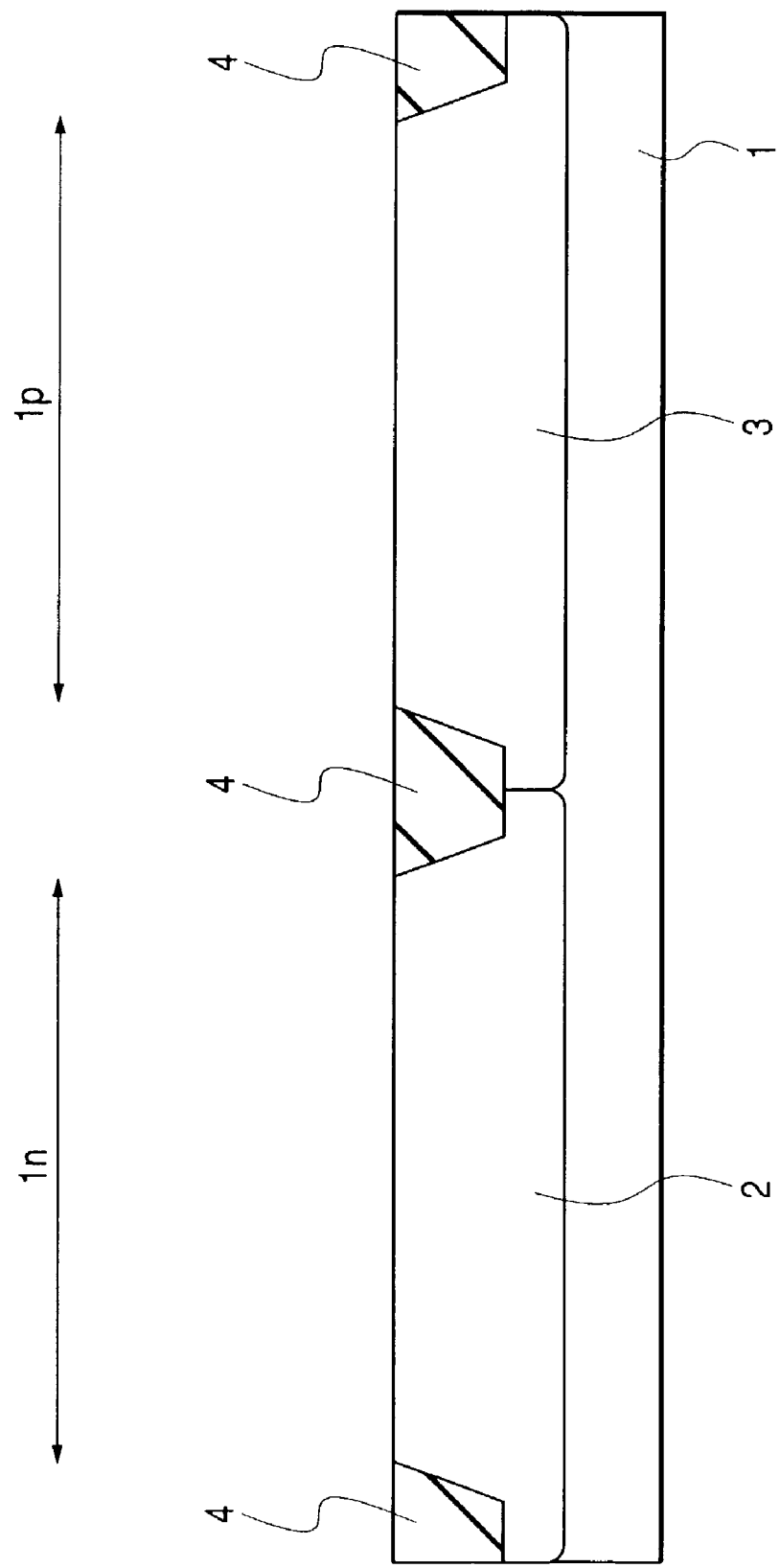
FIG. 5 is a schematic cross-sectional view of a semiconductor device of Embodiment 1 of the present invention at a manufacturing step thereof.

First, a p type substrate 1 made of single crystal silicon having a specific resistance of 10 ? cm is prepared; and, on the circuit formation surface of the p type substrate 1, a p type well region 2 and an n type well region 3 are formed selectively, as illustrated in FIG. 5.

Then, as illustrated in FIG. 5, a shallow groove isolation region 4 is formed on the circuit formation surface of the p type substrate 1 as an element isolation region for separating an nMIS formation region (first element formation region) 1n from a pMIS formation region (second element formation region) 1p. This shallow groove isolation region 4 is formed by forming a shallow groove (for example, a groove of about 300 nm deep) on the circuit formation surface of the p type substrate 1; forming, for example, a silicon oxide film as an insulating film over the circuit formation surface of the p type substrate 1 by CVD; and then planarizing the insulating film to leave it only inside of the shallow groove by CMP (Chemical Mechanical Polishing).

Figure 6:
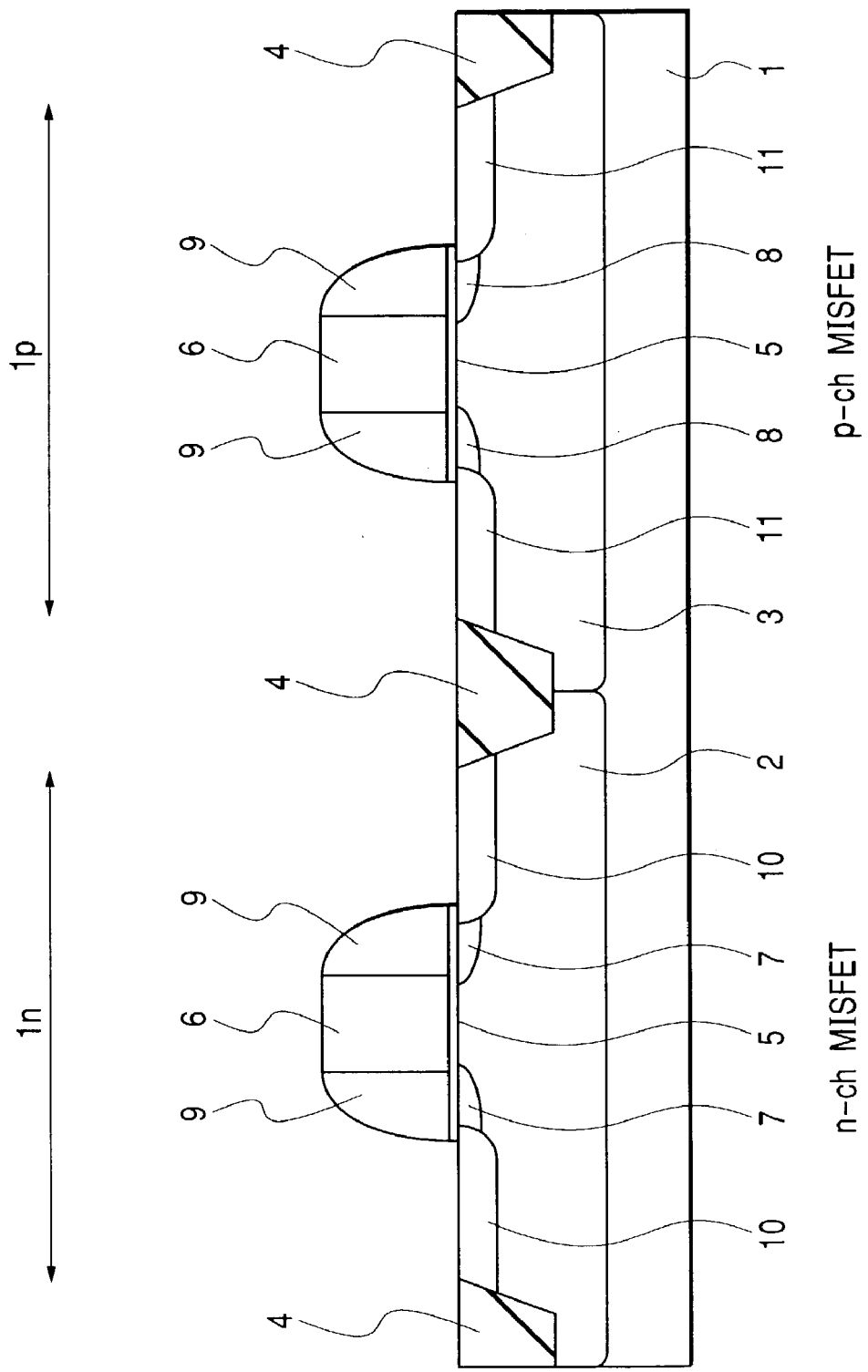
FIG. 6 is a schematic cross-sectional view of the semiconductor device at a manufacturing step following that of FIG. 5.

As illustrated in FIG. 6, a gate insulating film 5, that is made of, for example, a silicon oxide film of about 2 to 3 nm thick, is formed by heat treatment in the nMIS formation region 1n and pMIS formation region 1p on the circuit formation surface of the p type substrate 1. Then, a polycrystalline silicon film of about 150 to 200 nm thick is formed all over the circuit formation surface of the p type substrate 1 by CVD, followed by the formation of a gate electrode 6 by patterning of the polycrystalline silicon film. During or after deposition of the polycrystalline silicon film, an impurity to reduce the resistance is introduced therein.

As illustrated in FIG. 6, a pair of n type semiconductor regions (extension regions) 7 are formed by selectively introducing, by ion implantation, an impurity, such as arsenic (As), into an area of the p type well region 2 free of the gate electrode 6, followed by the formation of a pair of p type semiconductor regions (extension regions) 8 by selectively introducing, by ion implantation, an impurity, such as boron difluoride ($BF_2$), into an area of the n type well region 3 free of the gate electrode 6. The n type semiconductor regions 7 are formed while the pMIS formation region 1p is covered with a photoresist mask; while, the p type semiconductor regions 8 are formed while the nMIS formation region 1n is covered with a photoresist mask. Arsenic is introduced under the conditions of an acceleration energy of 1 to 5 KeV and a dose of 1 to $2\times10^{15}/cm^2$. Boron difluoride is introduced under the conditions of an acceleration energy of 1 to 5 KeV and a dose of 1 to $2\times10^{15}/cm^2$. The n type semiconductor regions 7 and p type semiconductor regions 8 are each formed in alignment with the gate electrode 6.

After introduction of an impurity to form the semiconductor regions (7,8), these semiconductor regions (7,8) are activated by heat treatment.

As illustrated in FIG. 6, sidewall spacers 9, for example, having a thickness in the gate length direction of about 50 to 70 nm thick, are formed on the sidewalls of the gate electrode 6. These sidewall spacers 9 are formed by forming an insulating film made of, for example, silicon oxide film or silicon nitride film by CVD all over the circuit formation surface of the p type substrate 1, and then subjecting the insulating film to anisotropic etching such as RIE (Reactive Ion etching). These sidewall spacers 9 are formed in alignment with the gate electrode 6.

As illustrated in FIG. 6, a pair of n type semiconductor regions 10 are formed by selectively introducing, by ion implantation, an impurity, such as arsenic (As), into an area of the p type well region 2 free of the gate electrode 6 and sidewall spacers 9, followed by the formation of a pair of p type semiconductor regions 11 by selectively introducing, by ion implantation, an impurity, such as boron difluoride ($BF_2$), into an area of the n type well region 3 free of the gate electrode 6 and the sidewall spacers 9. The n type semiconductor regions 10 are formed while the pMIS formation region 1p is covered with a photoresist mask; while the p type semiconductor regions 11 are formed while the nMIS formation region 1n is covered with a photoresist mask. Arsenic is introduced under the conditions of an acceleration energy of 35 to 45 KeV and a dose of 2 to $4\times10^{15}/cm^2$. Boron difluoride is introduced under the conditions of an acceleration energy of 40 to 50 KeV and a dose of 2 to $4\times10^{15}/cm^2$. The n type semiconductor regions 10 and p type semiconductor regions 11 are each formed in alignment with the sidewall spacers 9.

After introduction of an impurity to form the semiconductor regions (10, 11), these semiconductor regions (10, 11) are activated by heat treatment.

By the above-described steps, a source region and a drain region having the n type semiconductor regions 7 formed in alignment with the gate electrode 6 and the n type semiconductor regions 10 formed in alignment with the sidewall spacers 9 are formed; and a source region and a drain region having the p type semiconductor regions 8 formed in alignment with the gate electrode 6 and the p type semiconductor regions 11 formed in alignment with the sidewall spacers 9 are formed. Thus, horizontal n-type and p-type MISFETs are formed.

Figure 7:
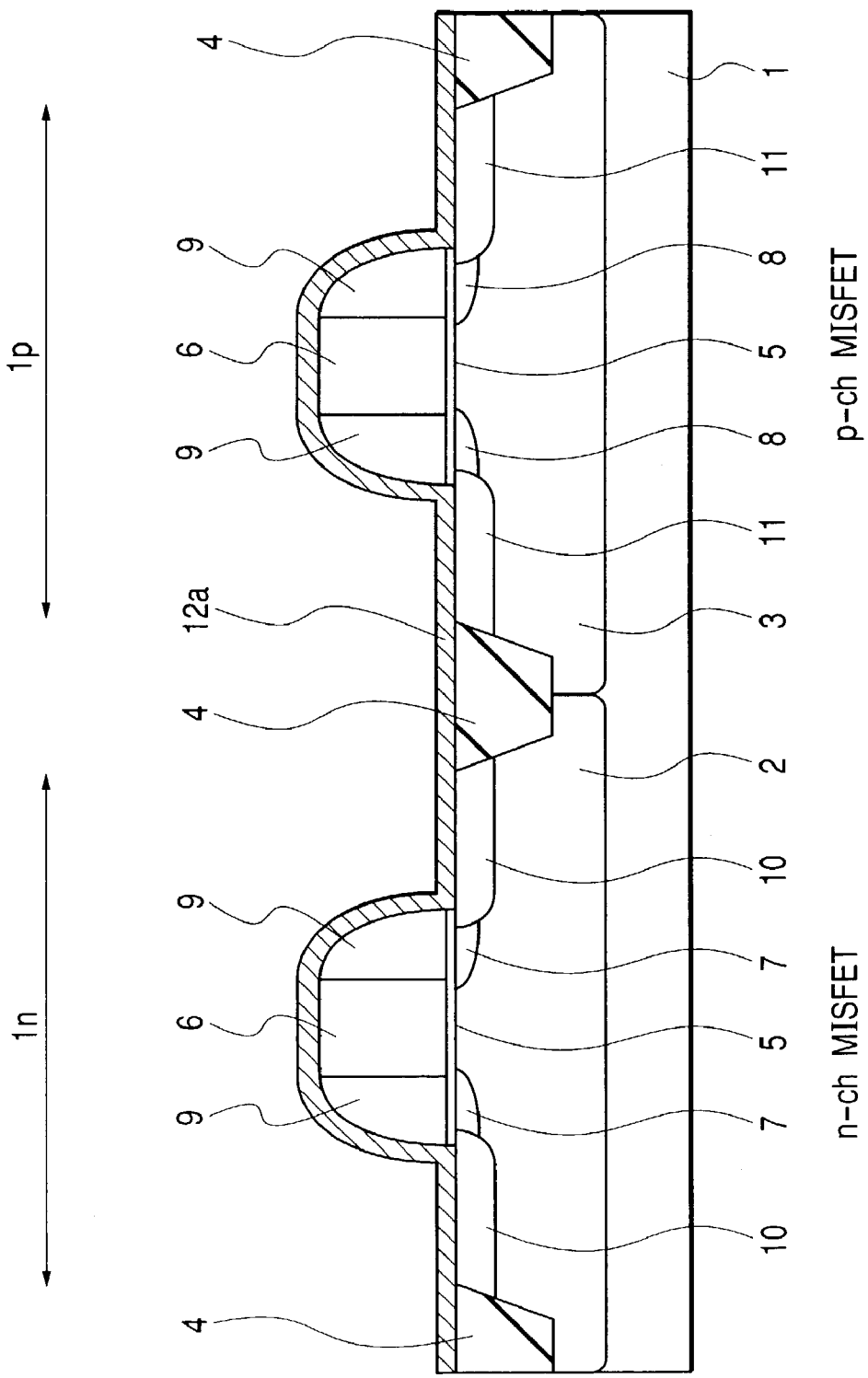
FIG. 7 is a schematic cross-sectional view of the semiconductor device at a manufacturing step following that of FIG. 6.
Figure 8:
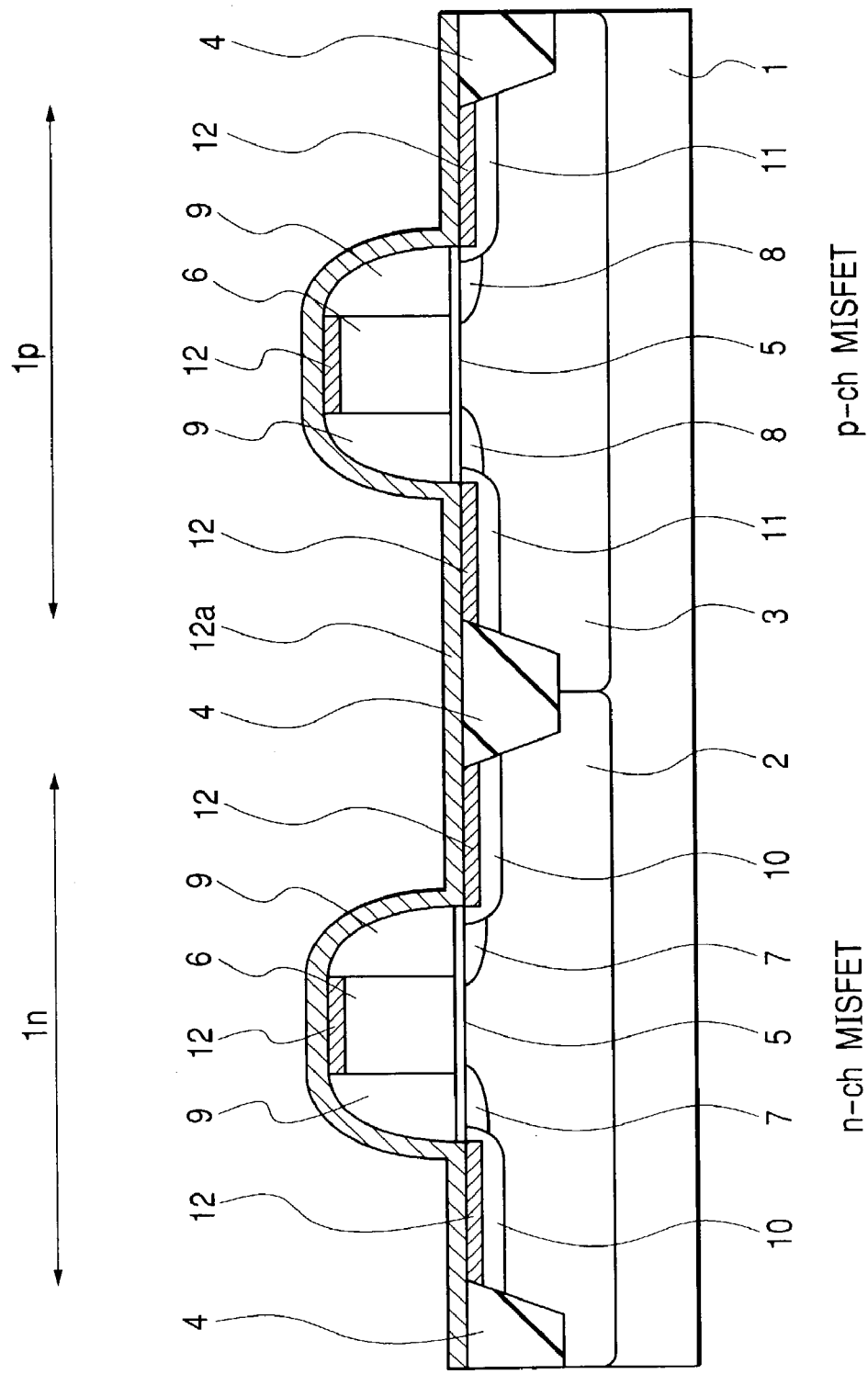
FIG. 8 is a schematic cross-sectional view of the semiconductor device at a manufacturing step following that of FIG. 7.
Figure 9:
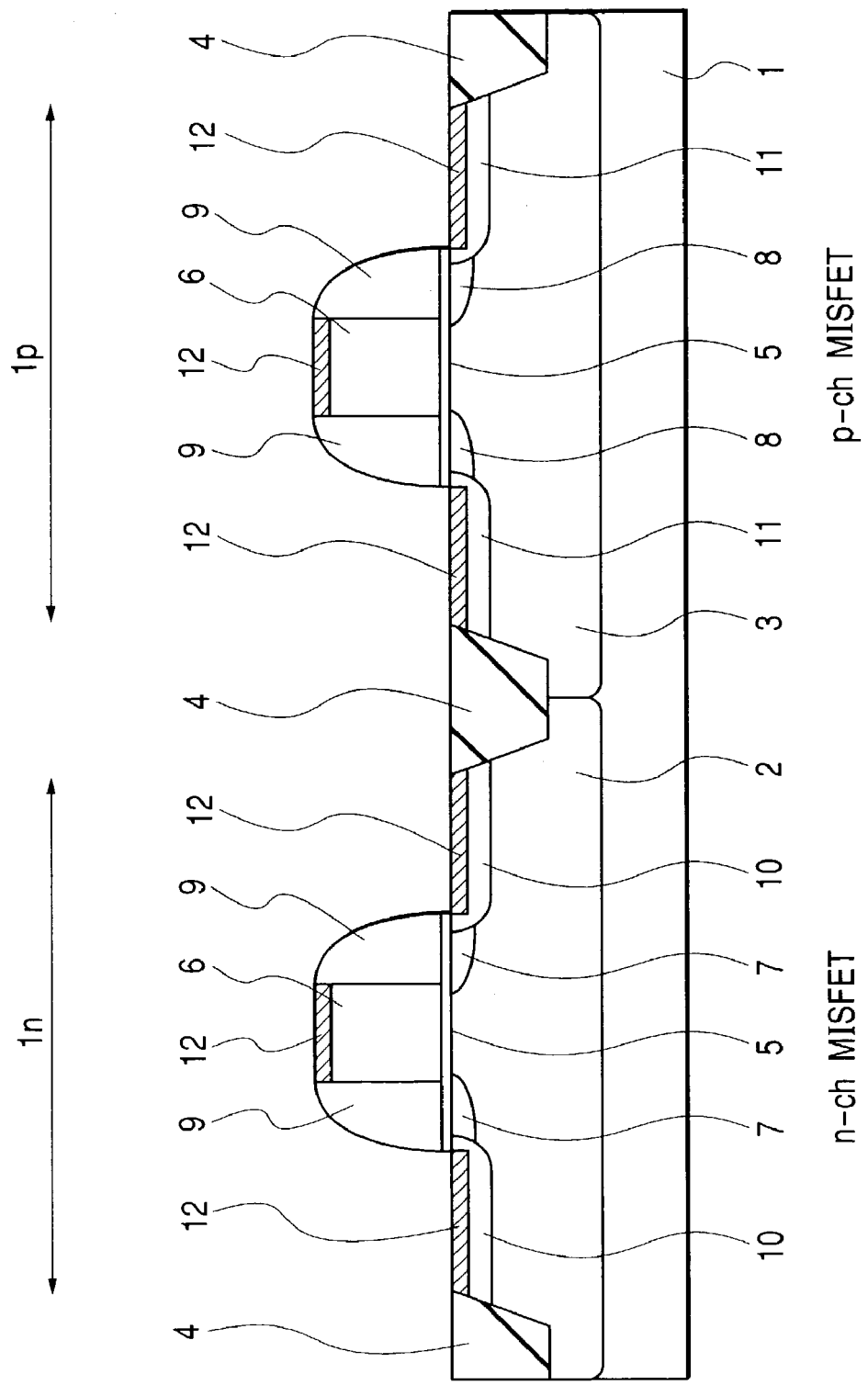
FIG. 9 is a schematic cross-sectional view of the semiconductor device at a manufacturing step following that of FIG. 8.

After the surfaces of the gate electrode 6 and semiconductor regions (10, 11) are exposed by removing a natural oxidation film, sputtering is conducted to form a cobalt (Co) film 12a as a refractory metal film all over the circuit formation surface of the p type substrate 1, including these surfaces, as illustrated in FIG. 7. Then, as illustrated in FIG. 8, heat treatment is conducted to react the silicon (Si) of the gate electrode 6 with the Co of the cobalt film 12, thereby forming a silicide ($CoSi_x$) layer 12 as a metal-semiconductor reacted layer on the surface of the gate electrode 6, and, at the same time, to react the Si of the semiconductor regions (10, 11) with the Co of the cobalt film 12a to form a silicide ($CoSi_x$) layer 12 on the surface of the semiconductor regions (10, 11). As illustrated in FIG. 9, an unreacted portion of the cobalt film 12a is selectively removed from a region in which no silicide layer 12 is formed, followed by activation of the silicide layer 12 by heat treatment.

By the above-described steps, the silicide layer 12 disposed over the surface of the gate electrode 6 and the silicide layer 12 disposed over the surface of the semiconductor regions (10, 11) are formed in alignment with the sidewall spacers 9. Thus, n-type and p-type MISFETs having a salicide structure are formed.

Figure 10:
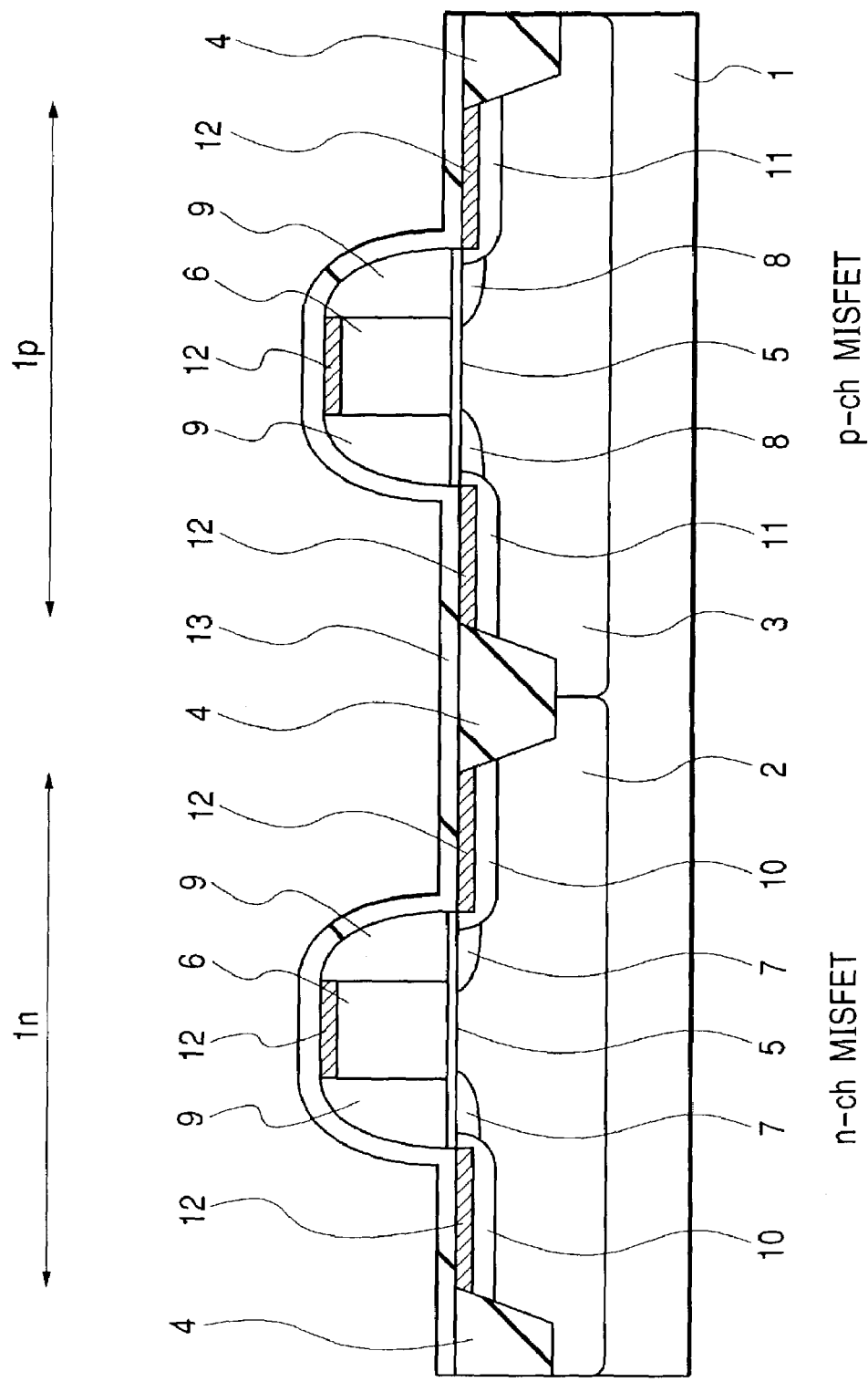
FIG. 10 is a schematic cross-sectional view of the semiconductor device at a manufacturing step following that of FIG. 9.

As illustrated in FIG. 10, an insulating film 13, that is made of, for example, a silicon oxide film of about 5 to 10 nm thick, is formed by CVD all over the circuit formation surface of the p type substrate 1, including the n-type and p-type MISFETs. By this step, the silicide layer 12 of the gate electrode 6, the silicide layer 12 of the semiconductor regions (10, 11) and sidewall spacers 9 are covered with the insulating film 13.

Figure 11:
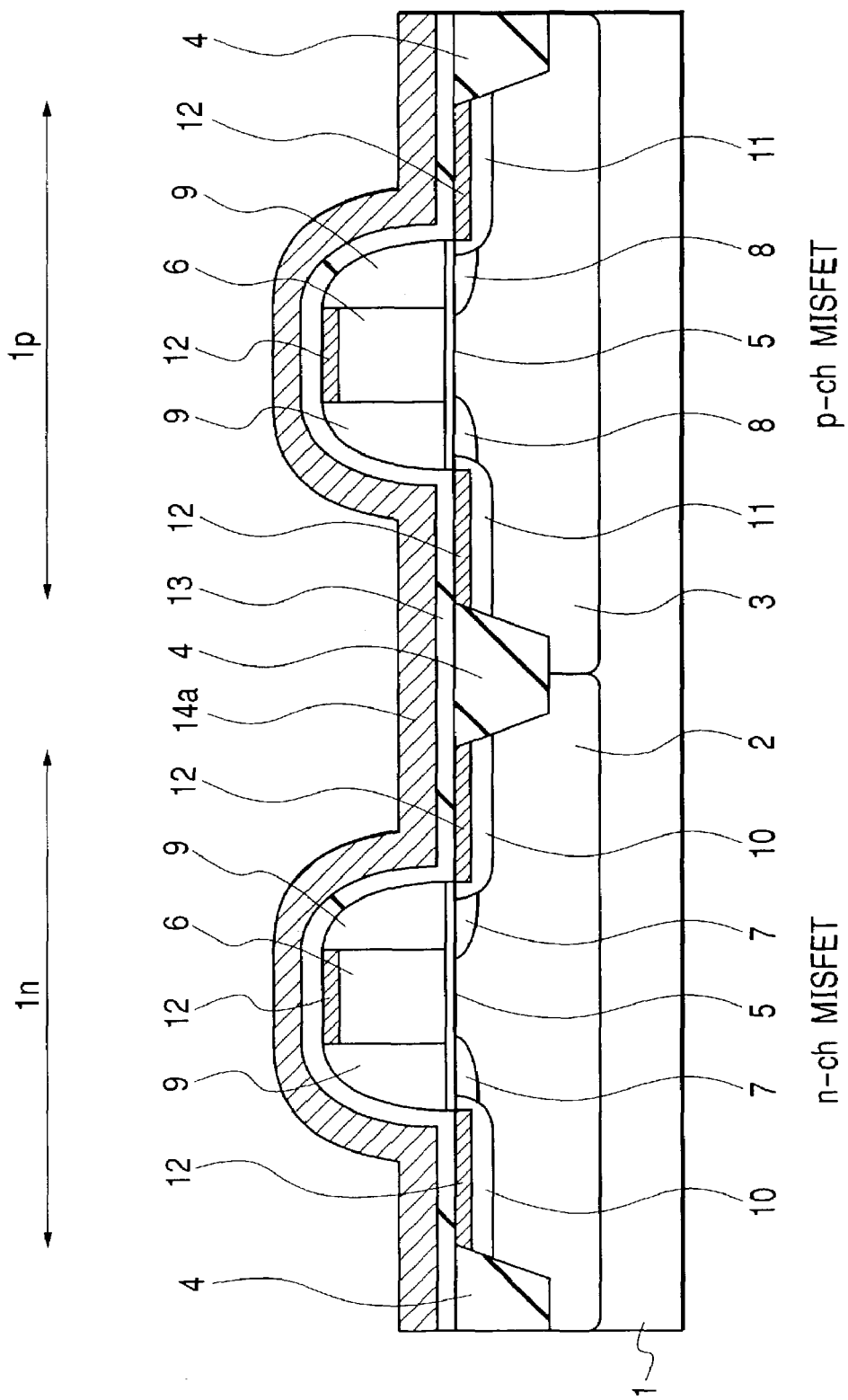
FIG. 11 is a schematic cross-sectional view of the semiconductor device at a manufacturing step following that of FIG. 10.

As illustrated in FIG. 11, a silicon nitride film 14a of about 100 to 120 nm thick is formed by plasma CVD as an insulating film all over the circuit formation surface of the p type substrate 1, including the n-type and p-type MISFETs. This silicon nitride film 14a is formed under the condition of, for example, RF power of 350 to 400 W or a chamber inner pressure of 300 to 350 Torr.

By the above-described step, the n-type and p-type MISFETs are covered with the silicon nitride film 14a; while the silicide layer 12 of the gate electrode 6, the semiconductor regions (10, 11) and sidewall spacers 9 are covered with the silicon nitride film 14a via the insulating film 13.

Figure 12:
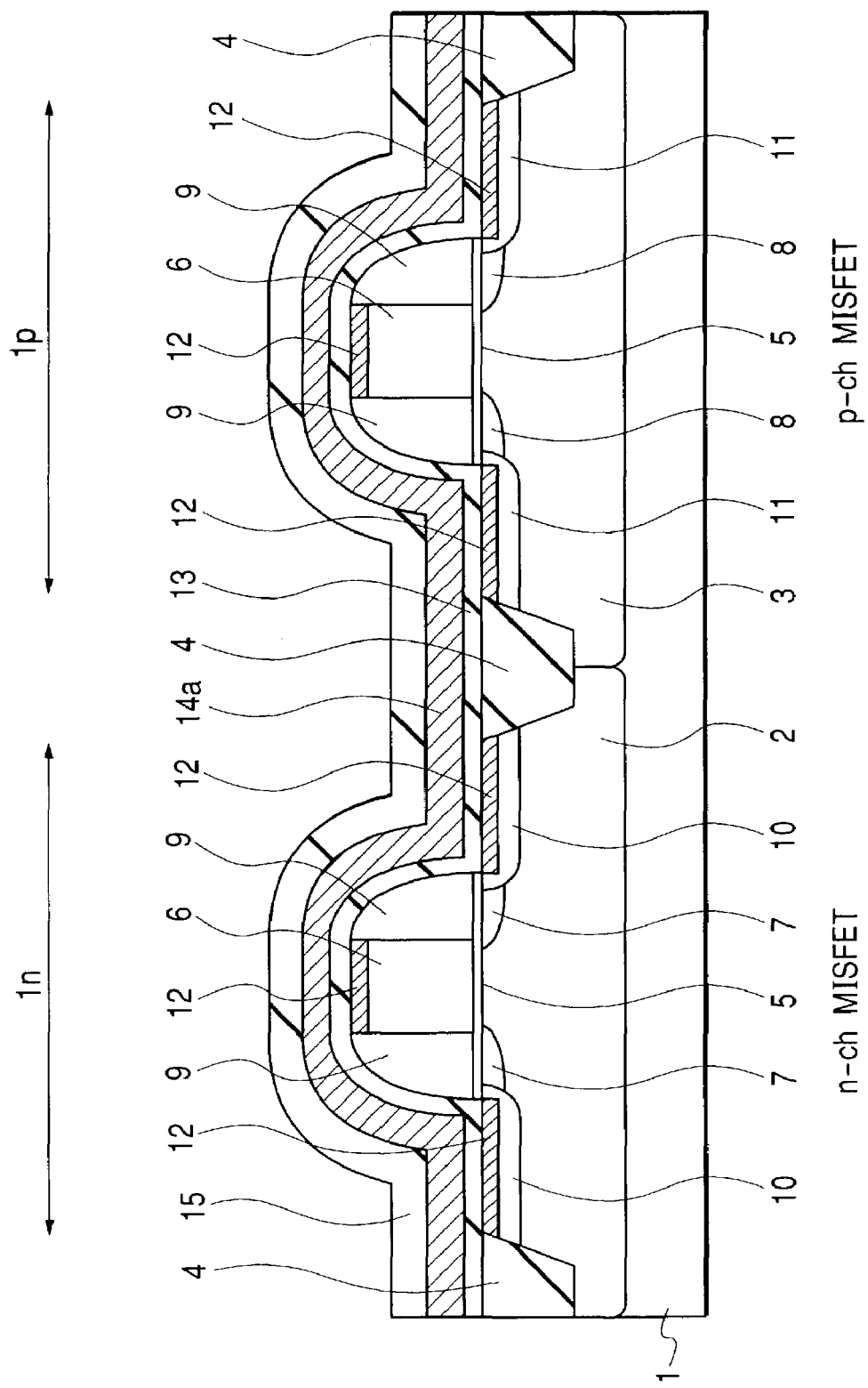
FIG. 12 is a schematic cross-sectional view of the semiconductor device at a manufacturing step following that of FIG. 11.

As illustrated in FIG. 12, an insulating film 15, that is made of, for example, a silicon oxide film of about 50 nm thick, is formed by CVD all over the circuit formation surface of the p type substrate 1, including the upper surfaces of the n-type and p-type MISFETs. By this step, the silicon nitride film 14a is covered with the insulating film 15.

Figure 13:
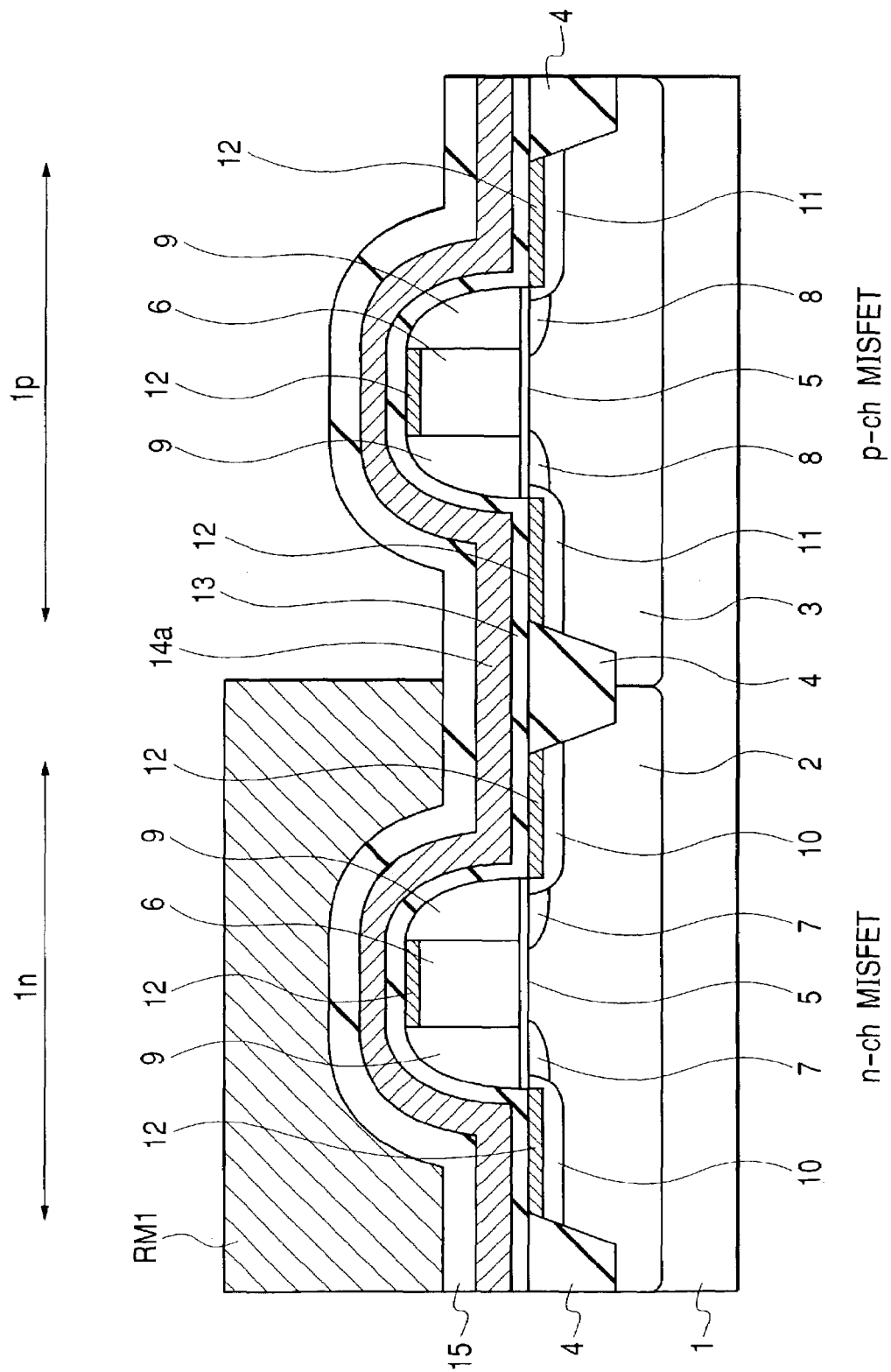
FIG. 13 is a schematic cross-sectional view of the semiconductor device at a manufacturing step following that of FIG. 12.
Figure 14:
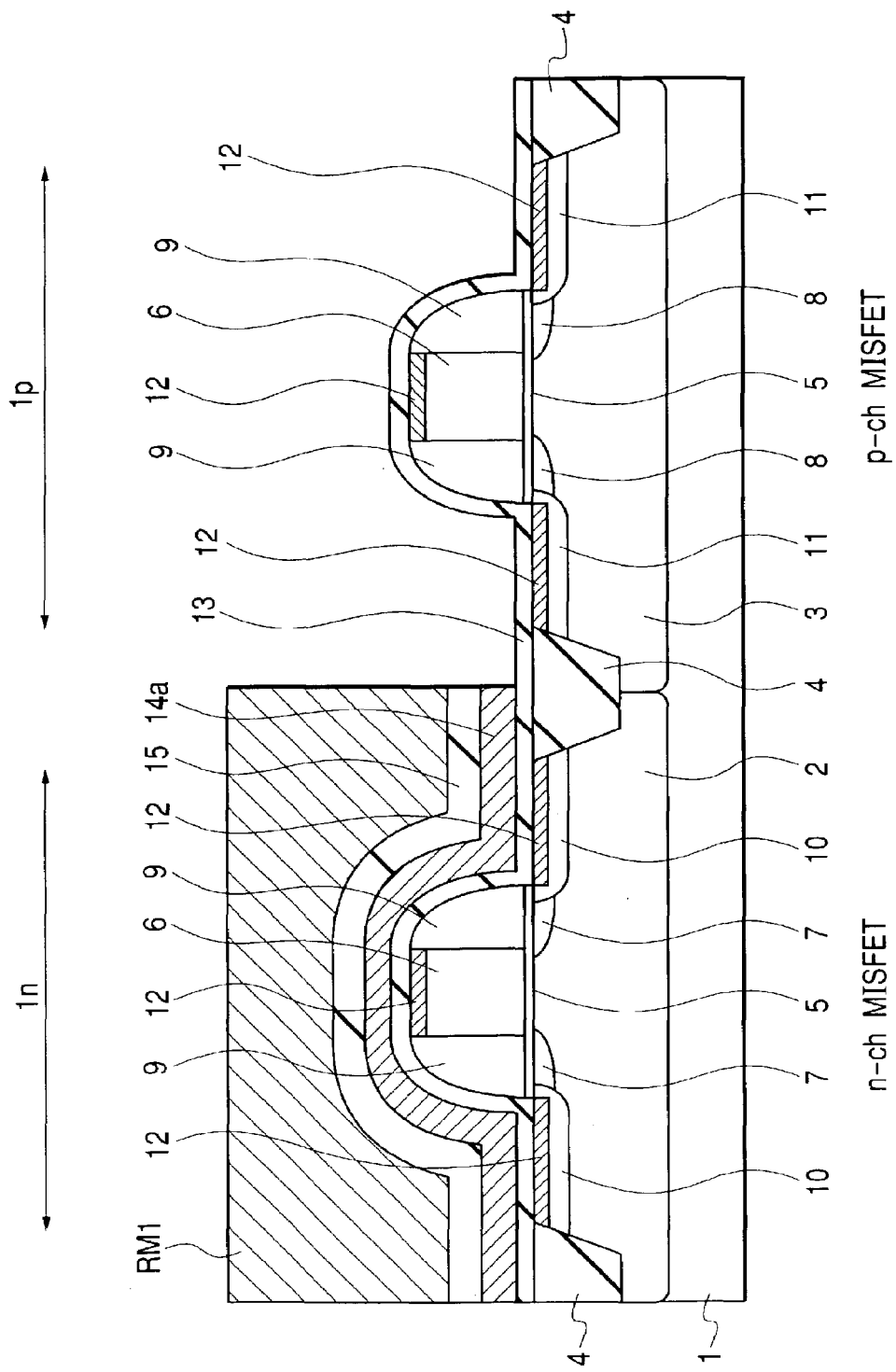
FIG. 14 is a schematic cross-sectional view of the semiconductor device at a manufacturing step following that of FIG. 13.

As illustrated in FIG. 13, a photoresist mask RM1 selectively covering the upper surface of the nMIS formation region 1n (n-type MISFET) is formed over the insulating film 15.

With this photoresist mask RM1 as an etching mask, the insulating film 15 and silicon nitride film 14a are successively removed by etching from the upper surface of the pMIS formation region 1p (the upper surface of p-type MISFET). For the removal of the insulating film 15 and the silicon nitride film 14a, wet etching and isotropic dry etching are employed, respectively.

By the above-described step, the silicon nitride film 14a is selectively formed over the n-type MISFET so as to cover its gate electrode 6. Owing to the silicon nitride film 14a selectively formed in the above-described manner, a tensile stress is generated selectively in the channel formation region of the n-type MISFET.

Also by this step, an inconvenience of inevitable etching of the silicide layer 12 over the surface of the gate electrode 6, the silicide layer 12 over the surface of the p type semiconductor region 11 and sidewall spacers 9 owing to the overetching upon removal can be suppressed, because these silicide layers 12 and sidewall spacers 9 are covered with the insulating film 13. In short, the insulating film 13 plays the role of an etching stopper upon removal of the silicon nitride film 14a.

Without the insulating film 13 in this step, a problem occurs owing to the overetching of the silicon nitride film 14a upon removal. A detailed description will be made of this problem later.

Figure 15:
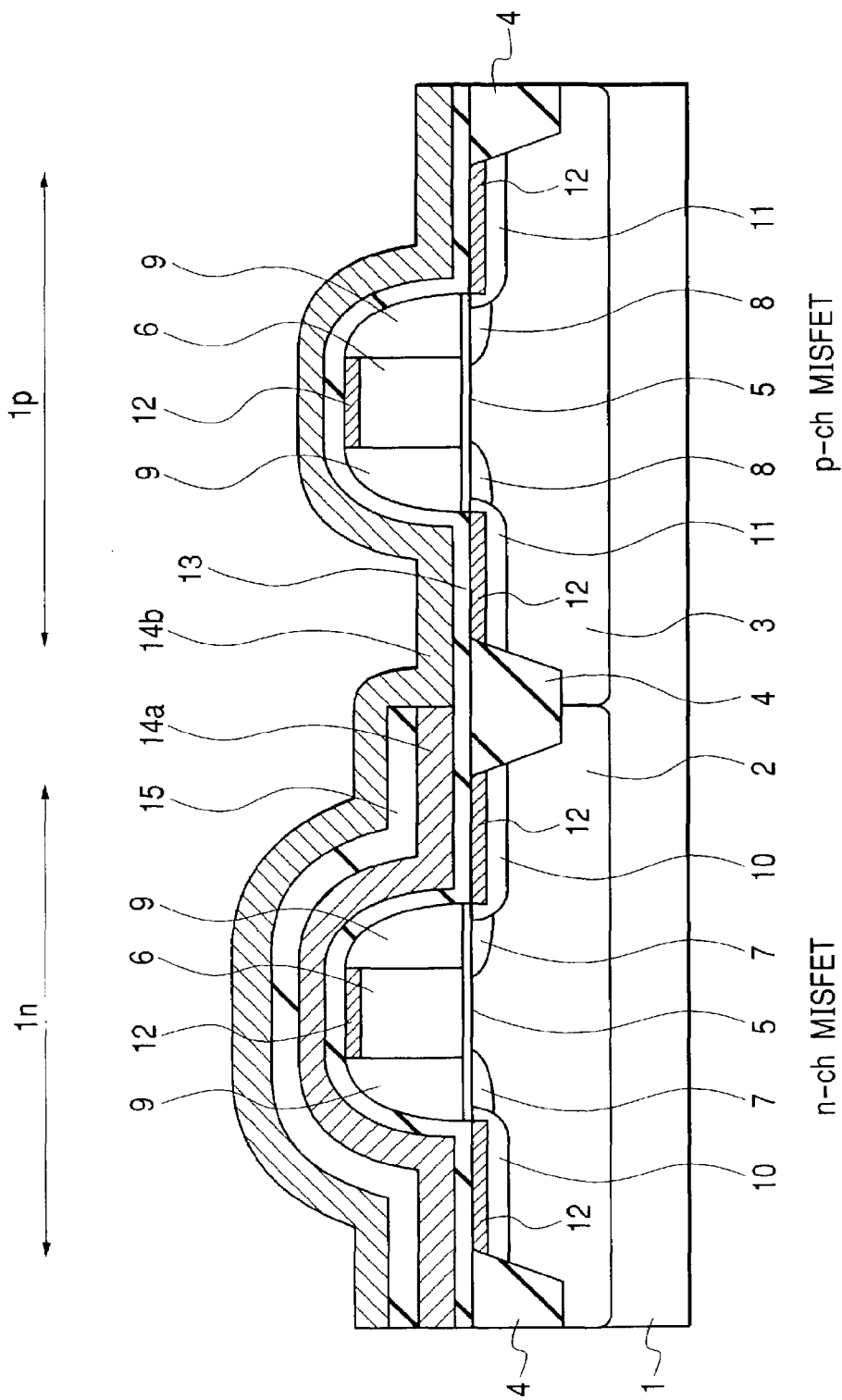
FIG. 15 is a schematic cross-sectional view of the semiconductor device at a manufacturing step following that of FIG. 14.

As illustrated in FIG. 15, after removal of the photoresist mask RM1, a silicon nitride film 14b of about 100 nm thick is formed, as an insulating film, by plasma CVD all over the circuit formation surface of the p-type substrate 1, including the upper surface of the insulating film 15. This silicon nitride film 14b is formed, for example, under the condition of RF power of 600 to 700 W or chamber inner pressure of 5 to 10 Torr.

By this step, the n-type and p-type MISFETS are covered with the silicon nitride film 14b, while the silicon nitride film 14a over the n-type MISFET is covered with the silicon nitride film 14b via the insulating film 15.

Figure 16:
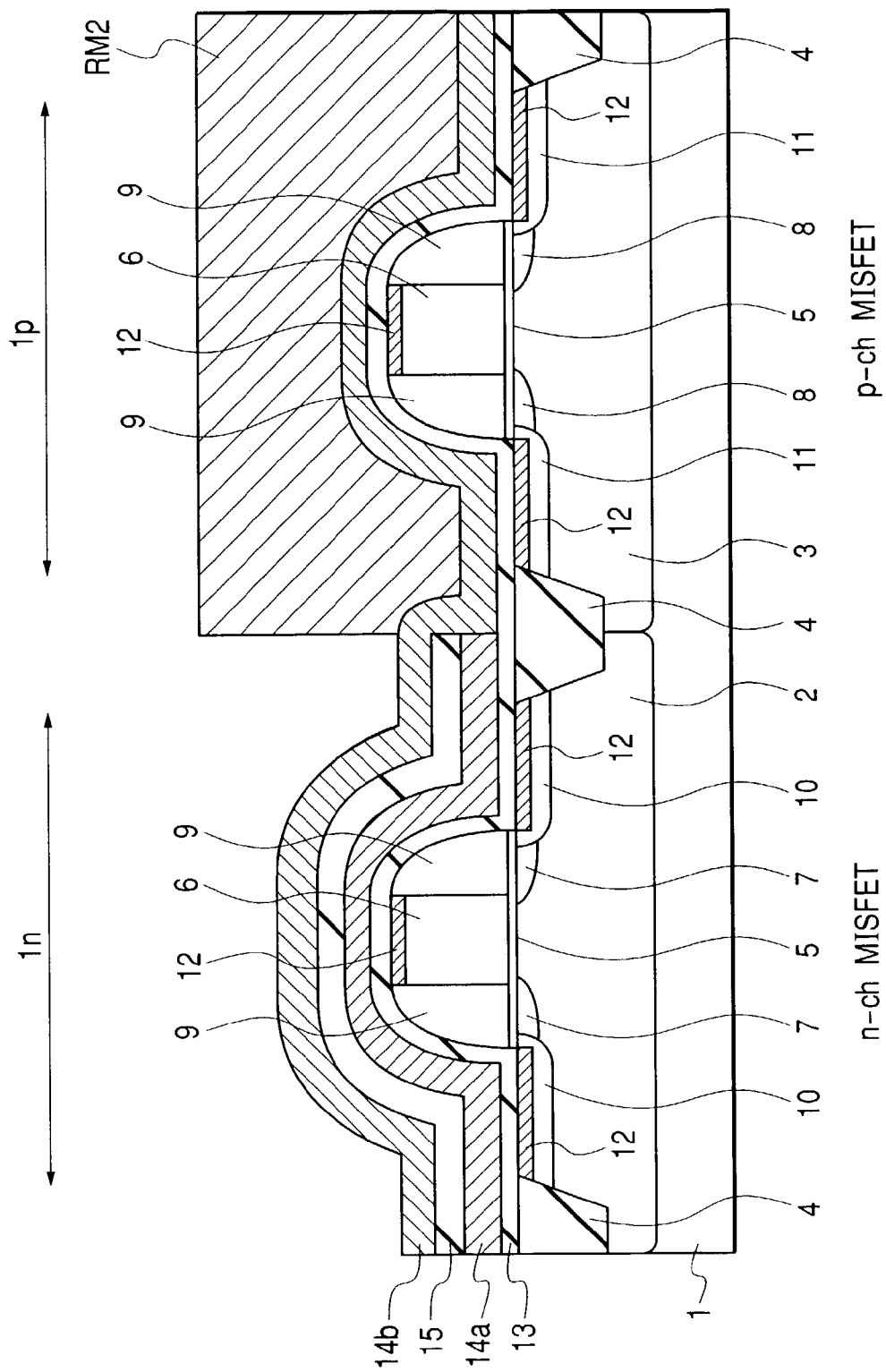
FIG. 16 is a schematic cross-sectional view of the semiconductor device at a manufacturing step following that of FIG. 15.

As illustrated in FIG. 16, a photoresist mask RM2 for selectively covering the upper surface of the pMIS formation region 1p (p-type MISFET) is formed over the silicon nitride film 14b.

Figure 17:
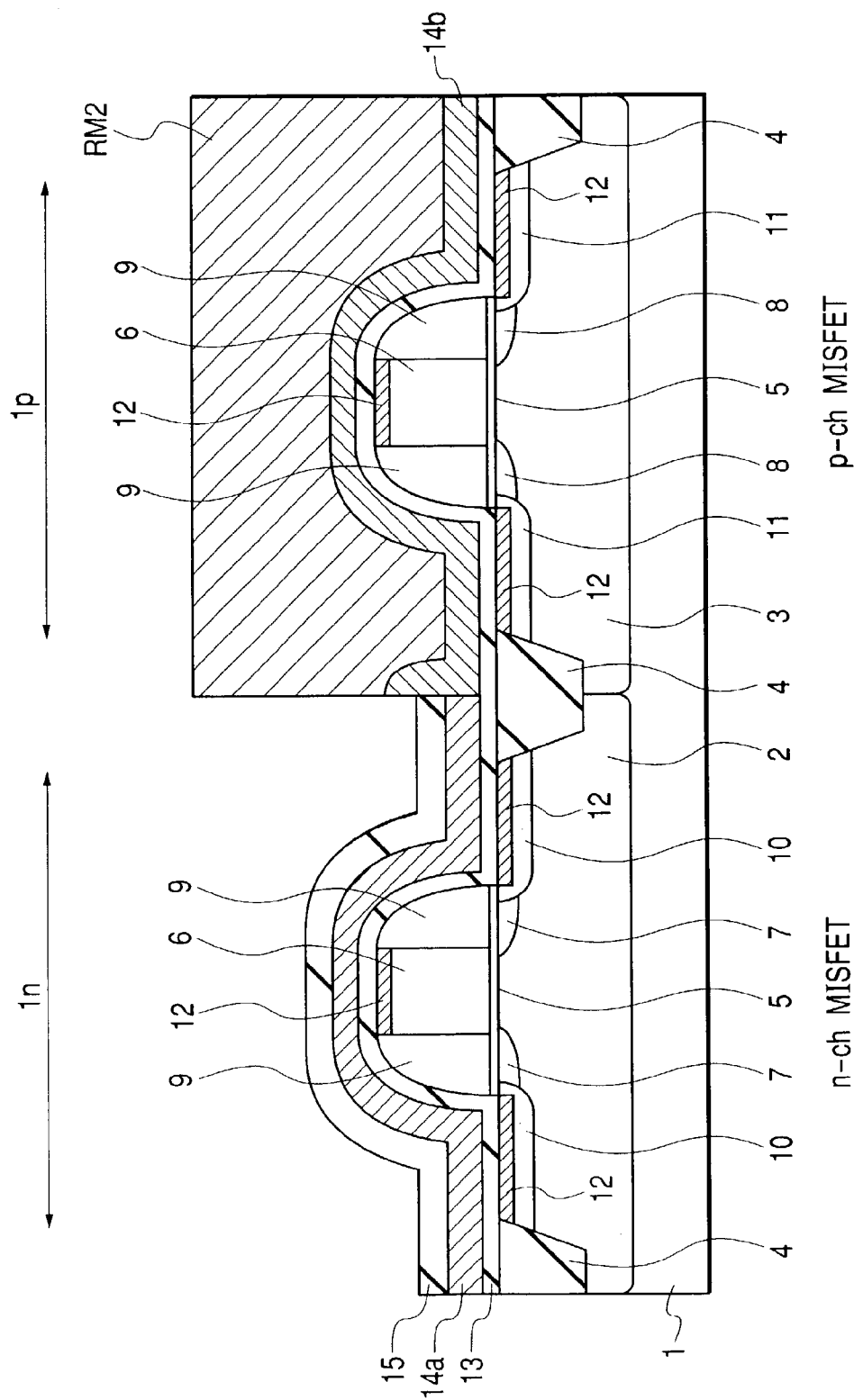
FIG. 17 is a schematic cross-sectional view of the semiconductor device at a manufacturing step following that of FIG. 16.

Using this photoresist mask RM2 as an etching mask, the silicon nitride film 14b is removed by etching, as illustrated in FIG. 17, from the upper surface of the nMIS formation region 1n (upper surface of the n-type MISFET). The silicon nitride film 14b is removed by isotropic dry etching.

By this step, the silicon nitride film 14b is selectively formed over the p-type MISFET so as to cover its gate electrode 6. Owing to the silicon nitride film 14b that is selectively formed in such a manner, a compressive stress is generated selectively in the channel formation region of the p-type MISFET.

In this step, since the silicon nitride film 14a over the n-type MISFET is covered with the insulating film 15, an inconvenience of removal of the silicon nitride film 14a by overetching upon removal of the silicon nitride film 14b can be suppressed. In short, the insulating film 15 plays the role of an etching stopper upon removal of the silicon nitride film 14b.

Figure 18:
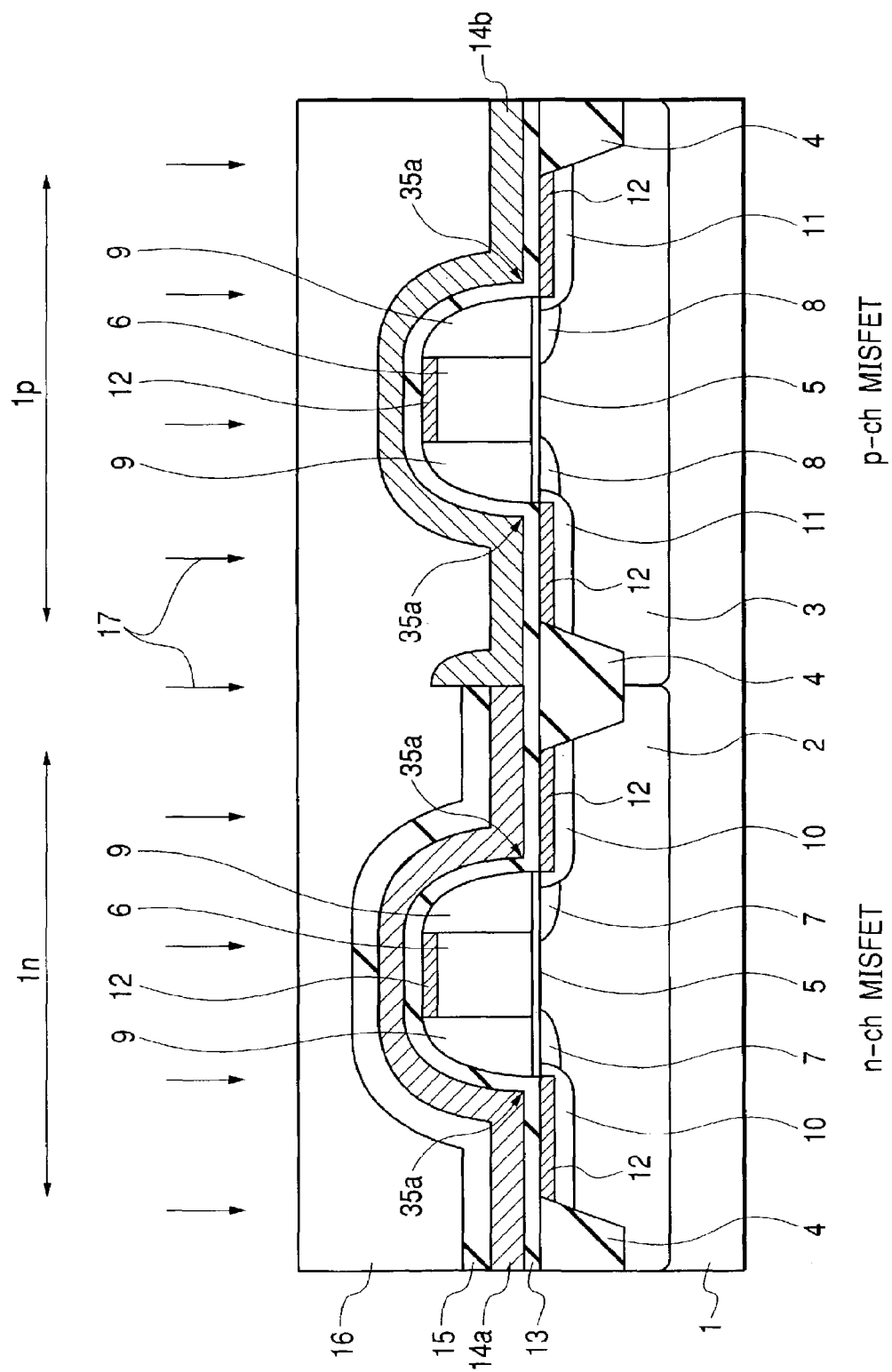
FIG. 18 is a schematic cross-sectional view of the semiconductor device at a manufacturing step following that of FIG. 17.

After removal of the photoresist mask RM2, an interlayer insulating film 16, that is made of, for example, a silicon oxide film, is formed by plasma CVD all over the circuit formation surface of the p type substrate 1, including the upper surfaces of the n-type and p-type MISFETS, as illustrated in FIG. 18, followed by planarization of the surface of the interlayer insulating film 16 by CMP.

As illustrated in FIG. 18, an impurity 17, such as Ar, Ge, Si, As, Sb, In or $BF_2$, is introduced into the interlayer insulating film 16 to destroy the crystallinity in the interlayer insulating film 16. In this step, the stress of the interlayer insulating film 16 is relaxed so that the influence of the stress of the interlayer insulating film 16 on the channel formation region of MISFET can be suppressed. When the cross-section of the interlayer insulating film 16 is observed, the mark of the destruction remains clearly.

Figure 19:
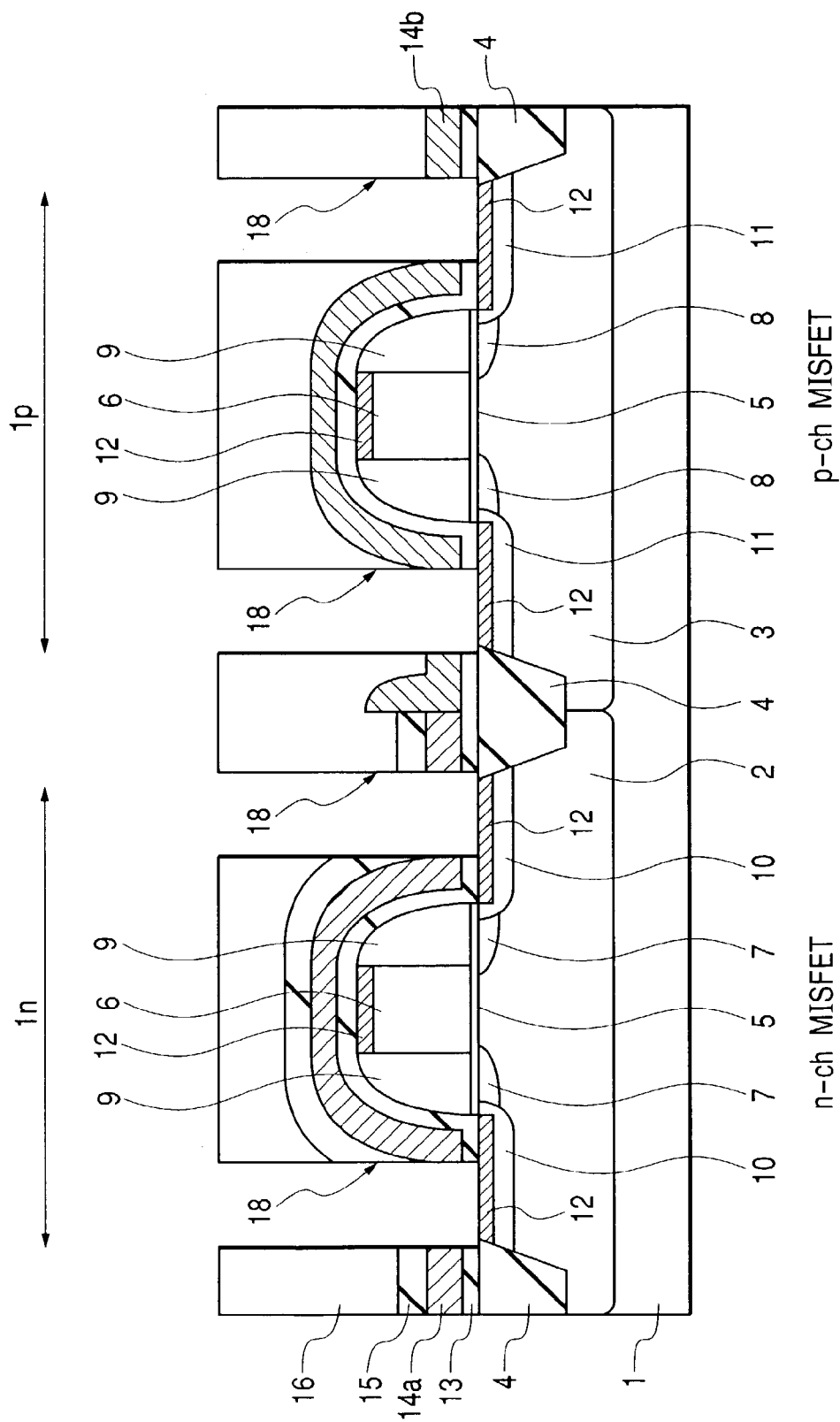
FIG. 19 is a schematic cross-sectional view of the semiconductor device at a manufacturing step following that of FIG. 18.

As illustrated in FIG. 19, source-drain contact holes 18 extending from the surface of the interlayer insulating film 16 to the silicide layer 12 are then formed over the semiconductor regions (11, 12). These source-drain contact holes 18 are formed by the SAC technique using silicon nitride films (14a, 14b) as an etching stopper. More specifically, photoresist masks having opening patterns for the contact holes are formed over the interlayer insulating film 16 at positions opposite to the semiconductor regions (10, 11). Using the photoresist masks as an etching mask, the interlayer insulating film 16, insulating film 15, silicon nitride films (14a, 14b) and insulating film 13 are etched successively by anisotropic etching. The etching of the interlayer insulating film 16 and insulating film 15 is conducted under conditions permitting them to have an etching selectivity over the silicon nitride films (14a, 14b). The silicon nitride films (14a, 14b) are etched under conditions permitting these films to have an etching selectivity over the insulating film 13. The insulating film 13 is etched under the conditions permitting it to have an etching selectivity over the silicide layer 12 and p type substrate 1. The insulating film 13 may be etched by overetching upon removal of the silicon nitride films (14a, 14b).

In a similar manner to that employed for the formation of the source-drain contact holes 18, a gate contact hole extending from the surface of the interlayer insulating film 16 to the silicide layer 12 is formed over the gate electrode 6 (however this is not illustrated).

A conductive plug 19 is then formed by embedding a conductive substance inside of the source-drain contact hole 18 and inside of the gate contact hole, followed by the formation of an interconnect 20 over the interlayer insulating film 16, whereby a structure as illustrated in FIG. 1 can be formed.

Next, the present invention will be described together with the problems found by the present inventors during development of the present invention.

Figure 20:
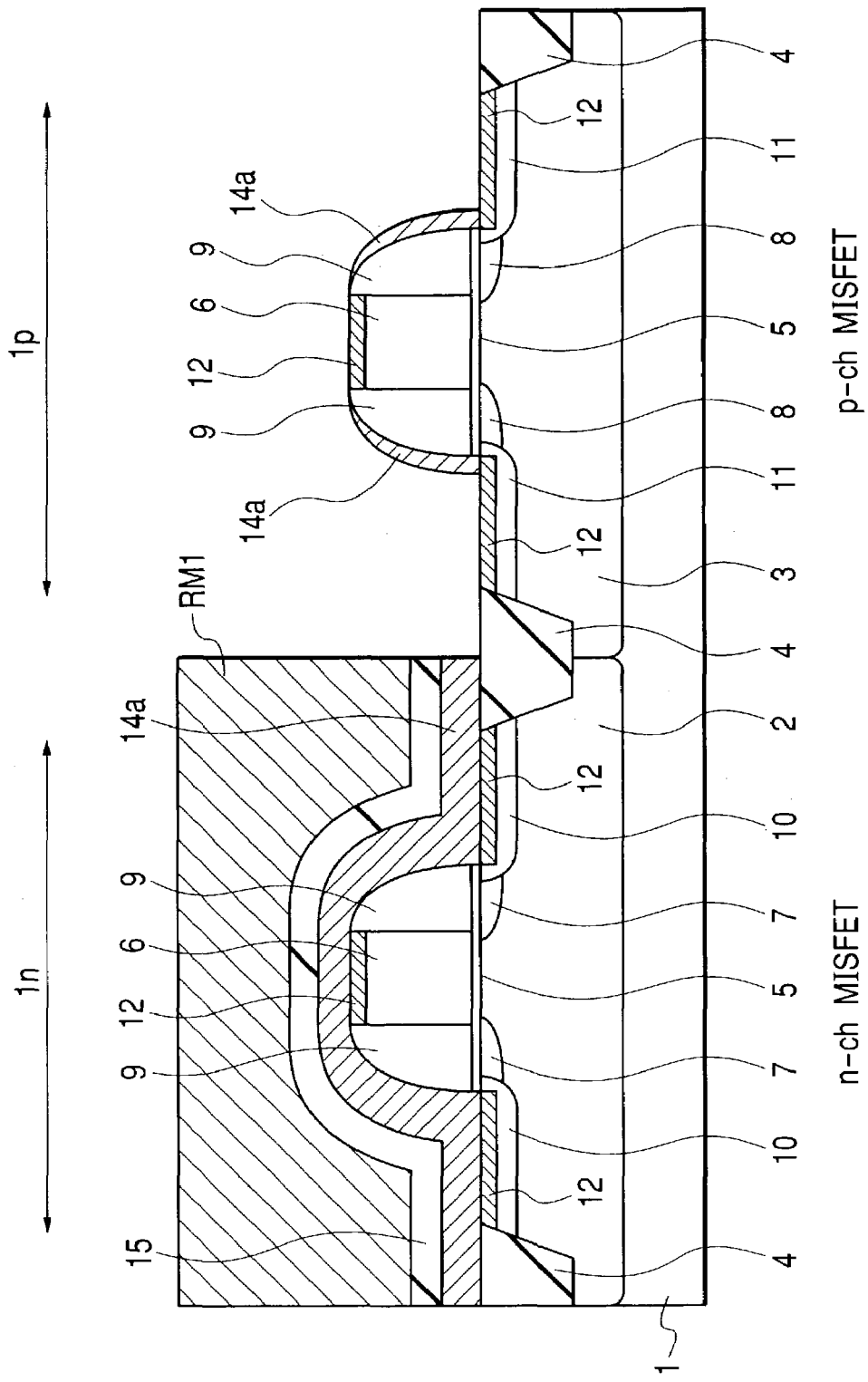
FIG. 20 is a schematic cross-sectional view illustrating a problem found by the present inventors during the development of the present invention.
Figure 21:
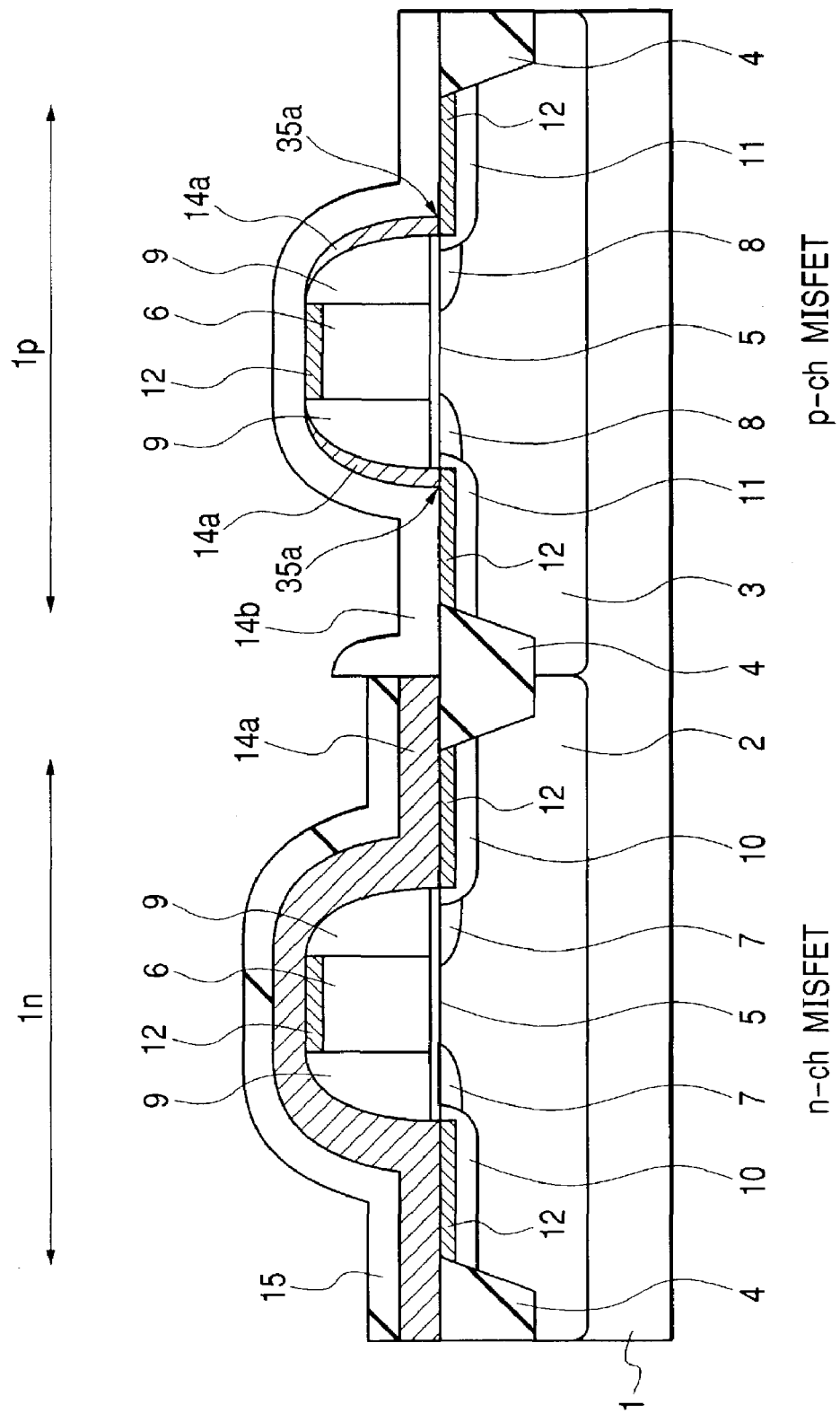
FIG. 21 is a schematic cross-sectional view illustrating another problem found by the present inventors during the development of the present invention.
Figure 22:
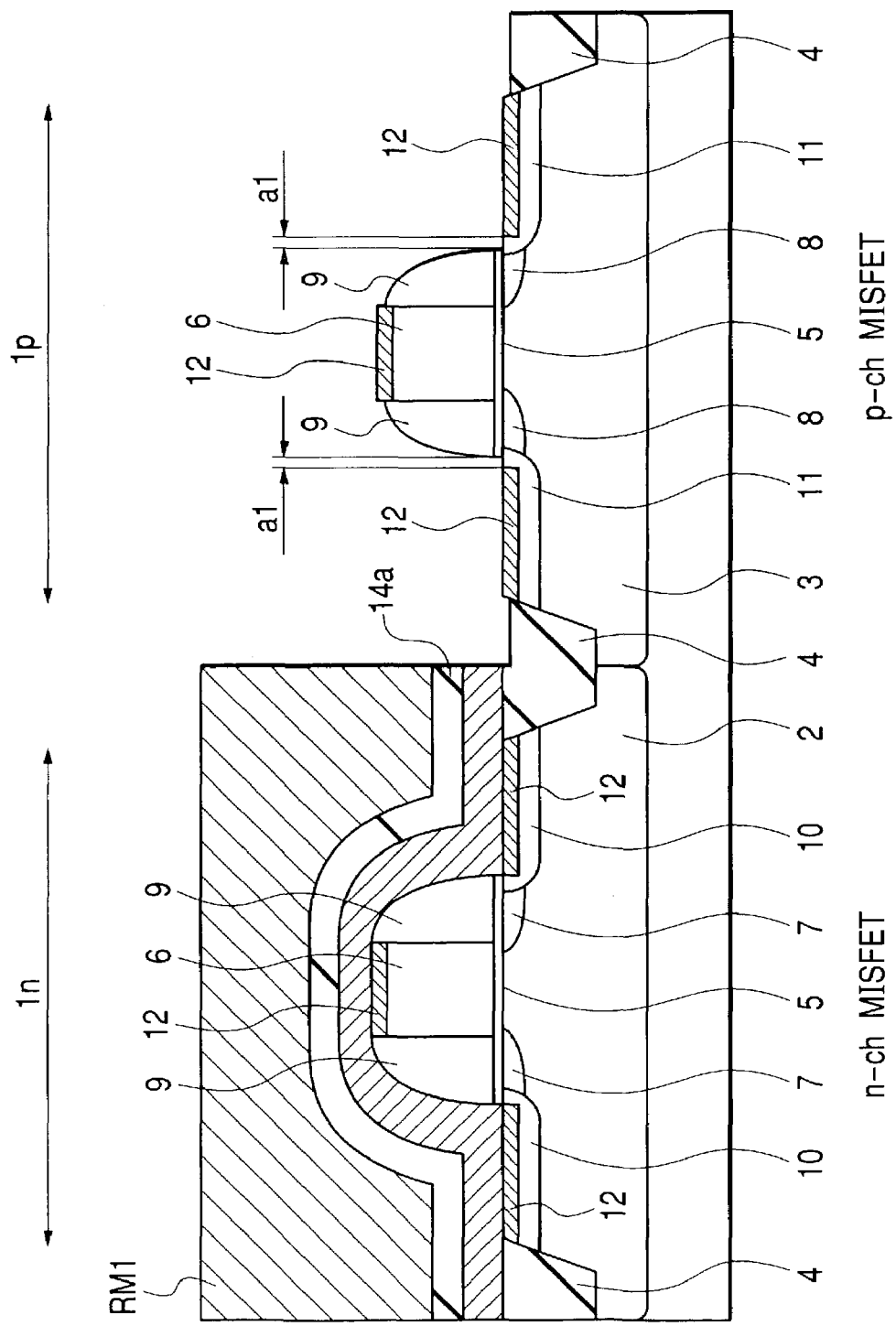
FIG. 22 is a schematic cross-sectional view illustrating a further problem found by the present inventors during the development of the present invention.

Upon removal of the silicon nitride film 14a over the p-type MISFET by anisotropic dry etching, a portion of the silicon nitride film 14a remains on the sidewall of the sidewall spacers 9, as illustrated in FIG. 20, because the silicon nitride film 14a extending along the sidewall of the sidewall spacers 9 seems substantially thick upon execution of the anisotropic dry etching. If the silicon nitride film 14b is formed over the pMISFET without removing the portion of the silicon nitride film 14a, the stress of the silicon nitride film 14b concentrates on the foot of the step portion 35a formed by the gate electrode 6, sidewall spacers 9 and the portion of the silicon nitride film 14a, as illustrated in FIG. 21, causing the starting point of the stress of the silicon nitride film 14b to be spaced from the channel formation region of the p-type MISFET owing to the silicon nitride film 14a remaining on the sidewall of the sidewall spacers 9, thereby reducing the effect of the stress of the silicon nitride film 14b for generating a compressive stress in the channel formation. In addition, the silicon nitride film 14a having a reverse stress action remains on the sidewall of the sidewall spacers 9, so that the effect of the silicon nitride film 14b for generating a compressive stress in the channel formation region is reduced further. It is therefore effective to remove the silicon nitride film 14a from the p-type MISFET by isotropic dry etching, which is free from the formation of an etching remnant at the step portion.

Isotropic dry etching of the silicon nitride film 14a from the upper portion of the p-type MISFET is however accompanied with another problem.

For isotropic etching of a silicon nitride film, a fluoride gas, such as $CF_4$ or $CF_6$, is usually employed. Upon isotropic etching, the silicon nitride film has an etching selectivity over a silicon oxide film or silicide layer, but does not have it over silicon.

Upon isotropic plasma etching of the silicon nitride film 14a, the silicon nitride film 14a has an etching selectivity over sidewall spacers 9 made of a silicon oxide film, but they are etched a little by overetching upon removal of the silicon nitride film 14a, whereby the whole film thickness of the sidewall spacers 9 decreases towards the gate electrode 6. The silicide layer 12 on the surface of the p type semiconductor regions 11 are formed in alignment with the sidewall spacers 9. By a retreat in the film thickness of the sidewall spacers due to overetching, upon removal of the silicon nitride film 14a, an exposed portion a1 of silicon is inevitably formed between the sidewall spacers 9 and the silicide layer 12. Upon isotropic plasma etching of the silicon nitride film, it has no etching selectivity over silicon, so that the p type substrate 1 is etched from the exposed portion 1a by overetching upon removal of the silicon nitride film 14a, causing an inconvenience, such as peeling of the gate electrode 6.

Upon isotropic plasma etching, the silicon nitride film 14a has an etching selectivity over the silicide layer 12, but the silicide layer 12 is etched a little by the overetching upon removal of the silicon nitride film 14a and the thickness of the silicide layer 12 decreases. The silicide layer 12 is disposed on the surface of the gate electrode 6 or on the surfaces of the p type semiconductor regions 11 in order to suppress an increase in gate resistance or an increase in the source-drain current due to miniaturization of the MISFET. An effect of suppressing an increase in the gate resistance or in the source-drain current caused by miniaturization of the MISFET inevitably lowers when the thickness of the silicide layer 12 decreases owing to overetching upon removal of the silicon nitride film 14a.

In the case of the p-type MISFET having a salicide structure, since the silicide layer 12 serves as an etching stopper, the polycrystalline silicon film below the silicide layer 12 of the gate electrode 6, and the p type semiconductor region 11 below the silicide layer 12 of the source-drain regions are not etched by overetching upon removal of the silicon nitride film 14a. In the case of a structure free from the silicide layer 12 on the surface of the gate electrode 6 or on the surface of the p type semiconductor regions 11, on the other hand, the polycrystalline silicon film of the gate electrode 6 and the p type semiconductor region 11 of the source-drain regions are reduced in film thickness owing to etching, leading to an increase in the gate resistance and source-drain resistance. An increase in the gate resistance causes a lowering of the switching speed, while an increase in the source-drain resistance causes a deterioration in the current driving capacity.

For the removal of the silicon nitride film 14a from the upper surface of the p-type MISFET, isotropic dry etching, which does not form an etching remnant at the step portion, is effective, but the above-described problem must be resolved in order to remove the silicon nitride film 14a by isotropic dry etching.

The investigation by the present inventors has revealed that the problem relating to the retreat in the thickness of the sidewall spacers 9 can be overcome by, prior to formation of the silicon nitride film 14a over the n-type and p-type MISFETs so as to cover their gate electrodes 6, covering at least the upper surface of the end portion of the silicide layer 12, on the side of the sidewall spacers, of the p type semiconductor regions 11 with an insulating film capable of serving as an etching stopper.

The problem relating to etching of the silicide layer 12 can be overcome by, prior to the formation of the silicon nitride film 14a over the n-type and p-type MISFETs so as to cover their gate electrodes 6, covering the whole surface of the silicide layer 12 with an insulating film capable of serving as an etching stopper.

The problem relating to a structure having no silicide layer 12 can be overcome by, prior to the formation of the silicon nitride film 14a over the n-type and p-type MISFETs so as to cover their gate electrodes 6, covering the surface of the gate electrode 6 and the surface of the p type semiconductor regions 11 with an insulating film capable of serving as an etching stopper.

As the insulating film, a film over which the silicon nitride film 14a has an etching selectivity upon isotropic plasma etching thereof, for example, a silicon oxide film, is desired.

In the above-described Embodiment 1, as illustrated in FIGS. 10 and 11, the insulating film 13 made of a silicon oxide film is formed by CVD prior to the formation of the silicon nitride film 14a. When the insulating film 13 is formed by CVD, that is, a deposition method, the silicide layer 12 on the surface of the gate electrode 6, the silicide layer 12 on the surface of the p type semiconductor regions 11, the end portion of the silicide layer 12 on the surface of the p type semiconductor regions 11, said end portion existing on the side of the sidewall spacers 9, and the sidewall spacers 9 can be covered with the insulating film 13.

Accordingly, the silicon nitride film 14b is removed from the p-type MISFET, while covering the silicide layer 12 on the surface of the gate electrodes 6, the silicide layer 12 on the surface of the p type semiconductor regions 11, the end portion of the silicide layer 12 on the surface of the p type semiconductor regions 11, said end portion existing on the side of the sidewall spacers 9, and the sidewall spacers 9 with the insulating film 13, so that the problems relating to the retreat in the thickness of the sidewall spacers 9 and etching of the silicide layer 12 can be overcome at the same time.

As described above, a tensile stress and a compressive stress are applied to the channel formation region of the n-type MISFET and the channel formation region of the p-type MISFET, respectively, resulting in an increase in the drain current in both the n-type MISFET and p-type MISFET according to the intensity of the stress working on the channel formation region of each of the n-type MISFET and p-type MISFET.

The stresses working on the channel formation regions of the n-type MISFET and p-type MISFET can be controlled, respectively, so that a ratio of the drain current between the n-type MISFET and the p-type MISFET can be controlled freely.

The drain current of the n-type MISFET and that of the p-type MISFET can be increased simultaneously, making it possible to enhance the speed of a semiconductor device having n-type and p-type MISFETs.

The problems relating to the retreat in the thickness of the sidewall spacers 9 or etching of the silicide layer 12, which will otherwise occur upon removal of the silicon nitride film 14a from the upper surface of the p-type MISFET by isotropic dry etching, can be overcome, making it possible to provide a semiconductor device having a high production yield and high reliability.

In order to change the film stress by changing the method of forming the silicon nitride film, any one of the below-described methods, as well as a method of changing the RF power, can be adopted.

(1) The raw material gas is changed. For the formation of the silicon nitride film 14a, $SiH_4$, $NH_3$ and $N_2$ are used, while for the formation of the silicon nitride film 14b, only $SiH_4$ and $N_2$ are used.

(2) The film formation temperature is changed. The temperature upon formation of the silicon nitride film 14a is set higher than that of the silicon nitride film 14b.

(3) The pressure is changed. The pressure upon formation of the silicon nitride film 14a is set to be higher than that of the silicon nitride film 14b.

Any two or three of the above-described methods may be used in combination. What is important is to adjust the stress of the silicon nitride film 14a toward the side of the tensile stress and to adjust the stress of the silicon nitride film 14b toward the side of the compressive stress.

When a single-wafer thermal CVD method is used for the formation of a silicon nitride film, the lower the pressure upon film formation or the higher the temperature upon film formation, the film stress can be made to lean toward the side of a tensile stress. Such conditions are therefore suited for the formation of the silicon nitride film 14a.

Figure 24:
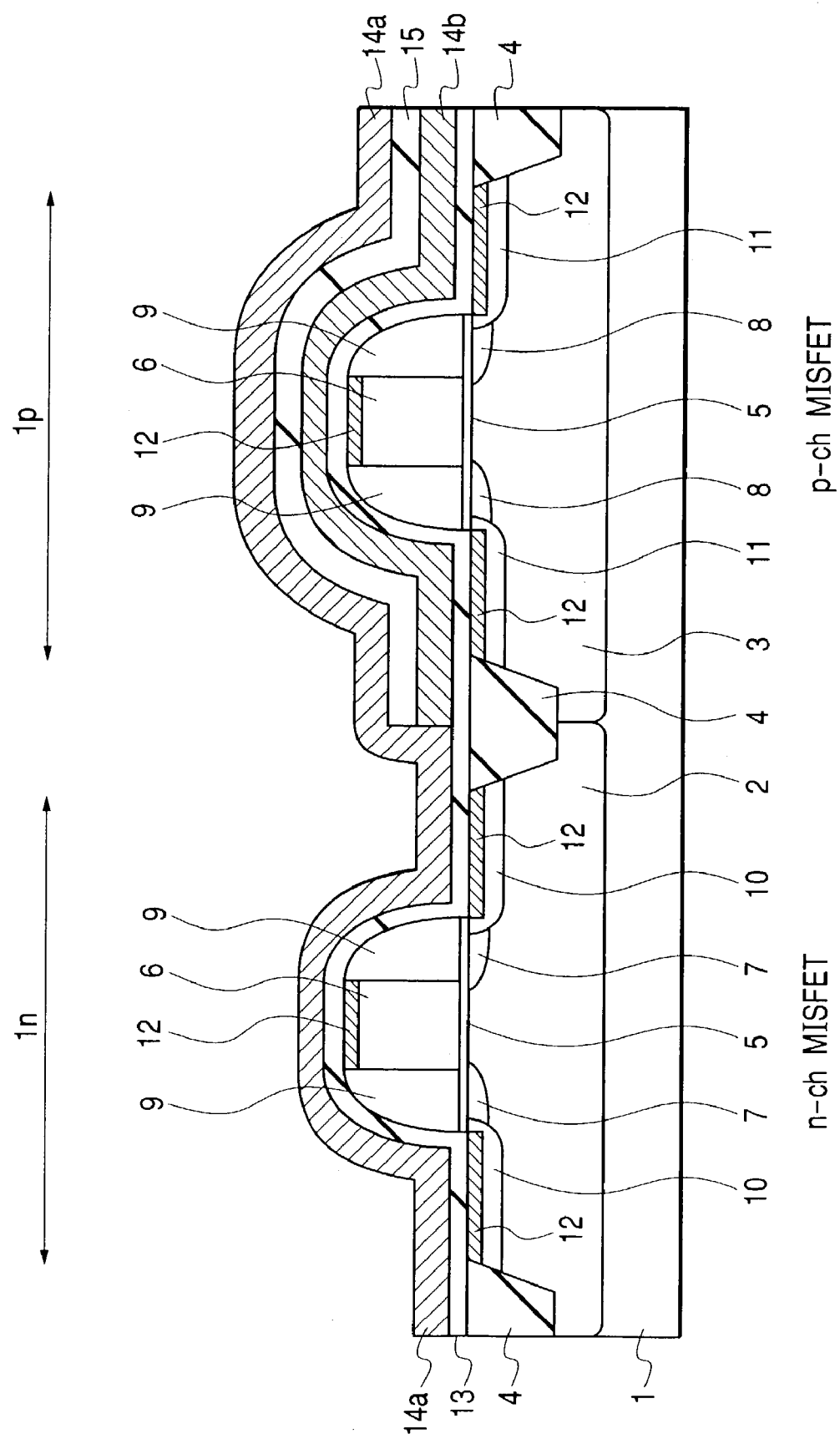
FIG. 24 is a schematic cross-sectional view illustrating an example of a modification of Embodiment 1 of the present invention.

FIG. 24 is a schematic cross-sectional view of a semiconductor device, at a manufacturing step thereof, which is an example of a modification of Embodiment 1 of the present invention. In FIG. 24, the n-type MISFET is illustrated on the left side, while the p-type MISFET is illustrated on the right side.

In the description of Embodiment 1, the silicon nitride film 14a was formed prior to the silicon nitride film 14b, but, as illustrated in FIG. 24, the silicon nitride film 14b may be formed prior to the silicon nitride film 14a. Also in such a case, a tensile stress and a compressive stress can be applied respectively to the channel formation regions of the n-type MISFET and p-type MISFET so that the drain currents of the n-type MISFET and p-type MISFET can be increased simultaneously.

By isotropic plasma etching, while covering the silicide layer 12 on the surface of the gate electrode 6, the silicide layer on the surface of the n-type semiconductor regions 10, the end portion of the silicide layer 12 on the surface of the n type semiconductor regions 10, said end portion being on the side of the sidewall spacers 9, and the sidewall spacers 9 with the insulating film 13, the silicon nitride film 14b can be removed from the upper surface of the n-type MISFET without causing problems relating to the retreat in the thickness of the sidewall spacers 9 or the etching of the silicide layer 12.

In Embodiment 1 and the modification thereof, the insulating film 13 made of a silicon oxide film was used as an etching stopper upon removal of the silicon nitride film 14a, but not only it, but also another insulating film, may be used insofar as it is a film over which the silicon nitride film 14a has an etching selectivity upon isotropic etching.

Embodiment 2

Figure 25:
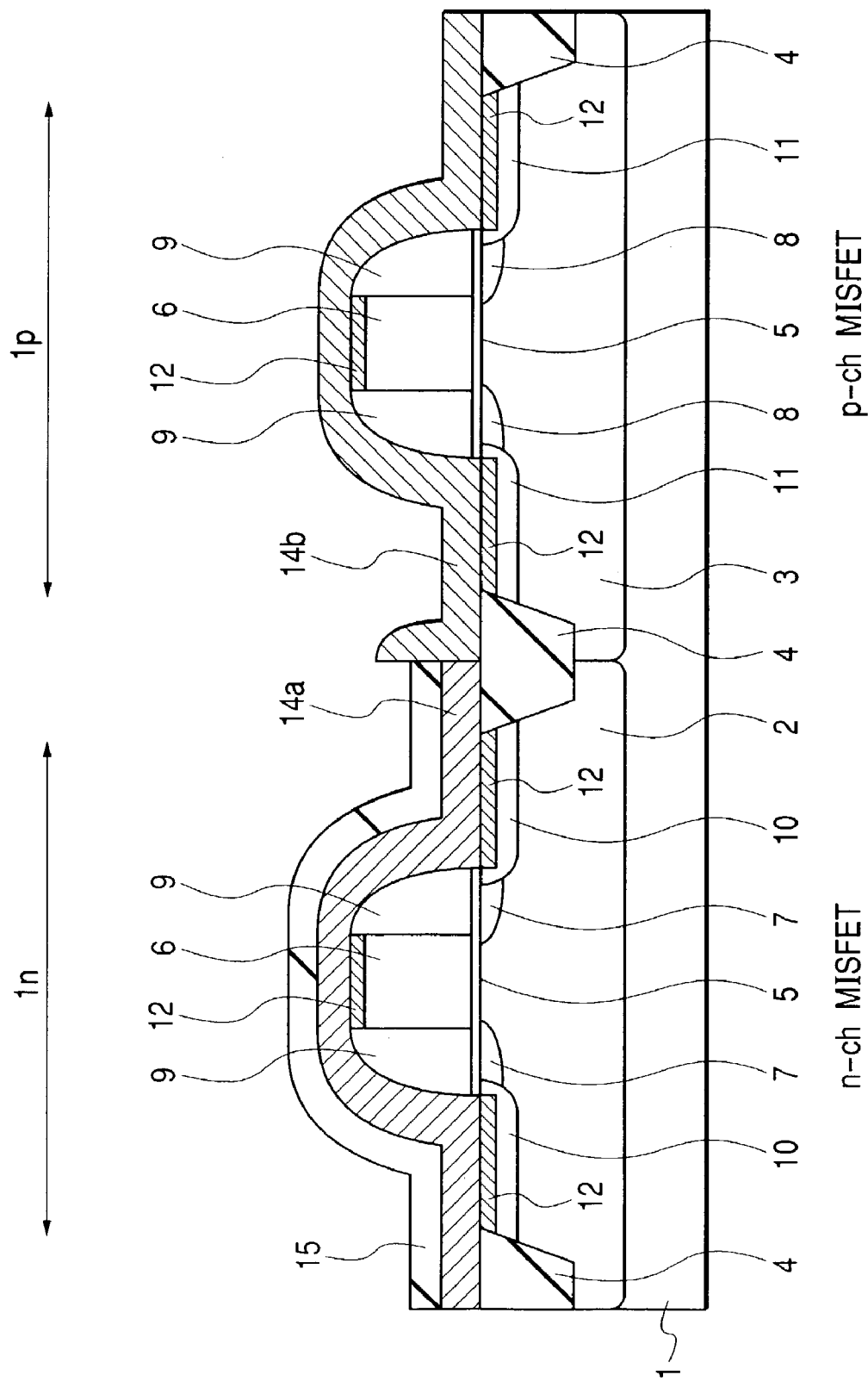
FIG. 25 is a schematic cross-sectional view illustrating the rough constitution of a semiconductor device according to Embodiment 2 of the present invention.

FIG. 25 is a schematic cross-sectional view illustrating the rough constitution of a semiconductor device according to Embodiment 2 of the present invention.

Figure 27:
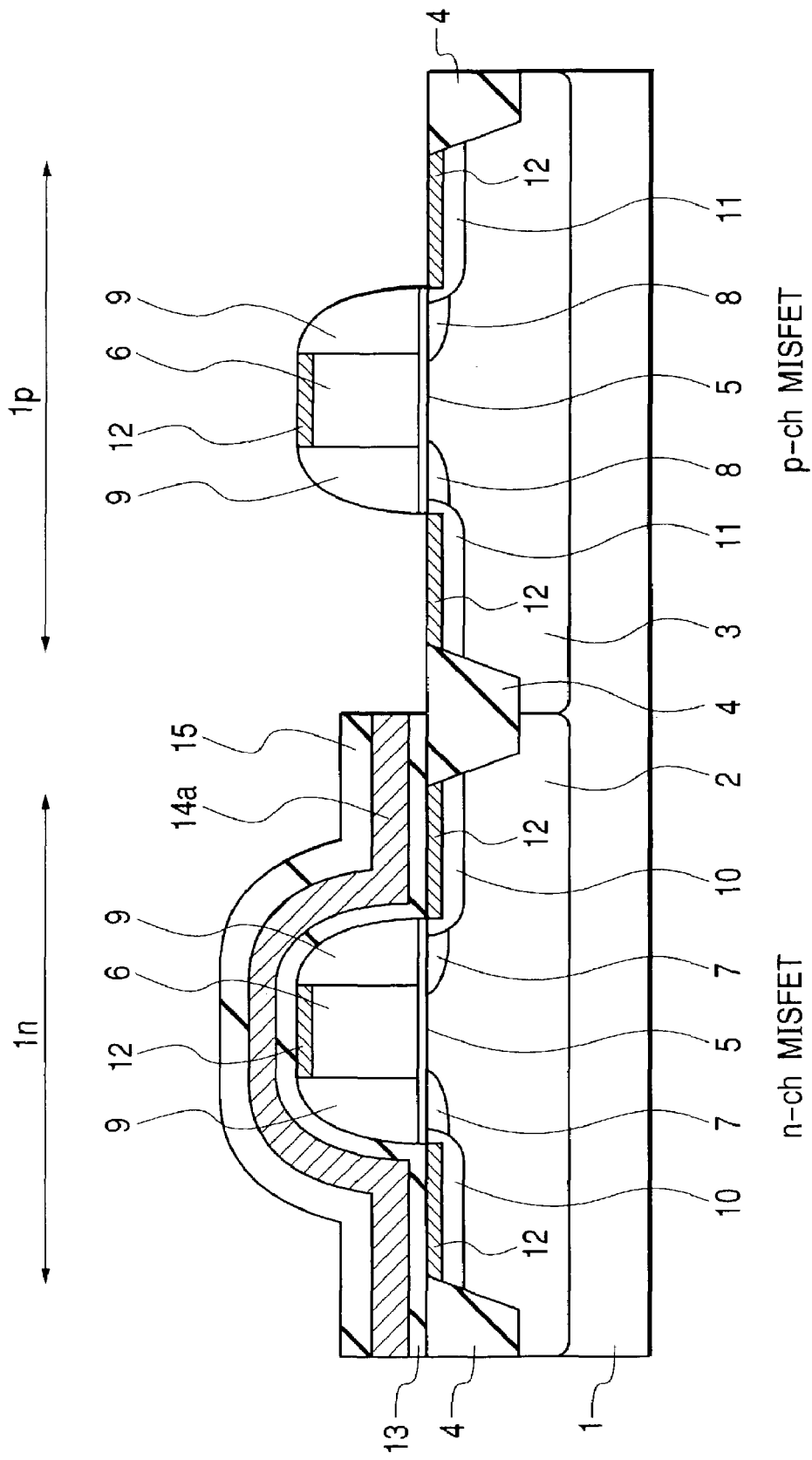
FIG. 27 is a schematic cross-sectional view illustrating the semiconductor device of Embodiment 2 at another manufacturing step thereof.

FIGS. 26A, 26B and 27 are each a schematic cross-sectional view of the semiconductor device, at a manufacturing step thereof, according to Embodiment 2 of the present invention. In FIGS. 25 to 27, an n-type MISFET is illustrated on the lift side, while a p-type MISFET is illustrated on the right side.

As illustrated in FIG. 25, the semiconductor device of Embodiment 2 is similar to that of Embodiment 1 except that the insulating film 13 serving as an etching stopper is removed.

When the insulating film 13 is left as in Embodiment 1 (refer to FIG. 18), the stress of the silicon nitride films (14a, 14b) concentrates on the foot of the step portion 35a, that is defined by the gate electrode 6, sidewall spacers 9 and insulating film 13, and the starting point of the stress of the silicon nitride films (14a, 14b) departs from the channel formation region of the MISFET by the insulating film 13 remaining on the sidewall of the sidewall spacers 9, resulting in a decrease in the effect of the stress of the silicon nitride films (14a, 14b) for generating a stress in the channel formation region. It is therefore desired to removed the insulating film 13, if possible.

When the silicon nitride film 14a is formed prior to the silicon nitride film 14b as in Embodiment 1, the insulating film 13 is necessary in the step of removing the silicon nitride film 14a on the p-type MISFET. When the silicon nitride film 14b is formed prior to the silicon nitride film 14a as in the modification of Embodiment 1, the insulating film 13 is necessary in the step of removing the silicon nitride film 14b from the upper surface of the n-type MISFET. The insulating film 13 is therefore removed in consideration of these steps.

Upon formation of the silicon nitride film 14a prior to the silicon nitride film 14b, the insulating film 13 is removed from the upper surface of the n-type MISFET prior to the step of forming the silicon nitride film 14a as illustrated in FIG. 26A, and it is removed from the upper surface of the p-type MISFET after the removal of the silicon nitride film 14a from the upper surface of the p-type MISFET, as illustrated in FIG. 26B, which corresponds to FIG. 13, and in FIG. 27. In other words, as illustrated in FIGS. 26B and 27, the insulating film 13 on the p-type MISFET is removed after removal of the insulating film 15 and the silicon nitride film 14a from the upper surface of the p-type MISFET.

Upon formation of the silicon nitride film 14b prior to the silicon nitride film 14a, the insulating film 13 is removed from the upper surface of the p-type MISFET prior to the step of forming the silicon nitride film 14b, and the insulating film 13 is removed from the upper surface of the n-type MISFET after removal of the silicon nitride film 14b from the upper surface of the n-type MISFET. The removal of the insulating film 13 on the n-type MISFET is performed while covering the upper surface of the p-type MISFET with, for example, a photoresist mask, while the removal of the insulating film 13 on the p-type MISFET is performed while covering the upper surface of the n-type MISFET with, for example, a photoresist mask.

It is desired to employ isotropic dry etching, which does not leave any remnant on the step portion, for the removal of the insulating film from the upper surface of the n-type MISFET or p-type MISFET. As isotropic dry etching of the insulating film 13 made of a silicon oxide film, isotropic plasma etching using a $CF_3$ gas or a mixed gas of $CF_4$ with $H_2$ is usually employed. In this isotropic plasma etching, the insulating film 13 has a sufficient etching selectivity over silicon or a silicide layer so that the p type substrate 1, silicide layer 12, sidewall spacers 9 and the like are not etched excessively.

In Embodiment 2, the insulating film 13 was removed from the upper surface of each of the n-type MISFET and p-type MISFET, but it is possible to leave the insulating film 13 on either one of them.

Embodiment 3

Figure 28:
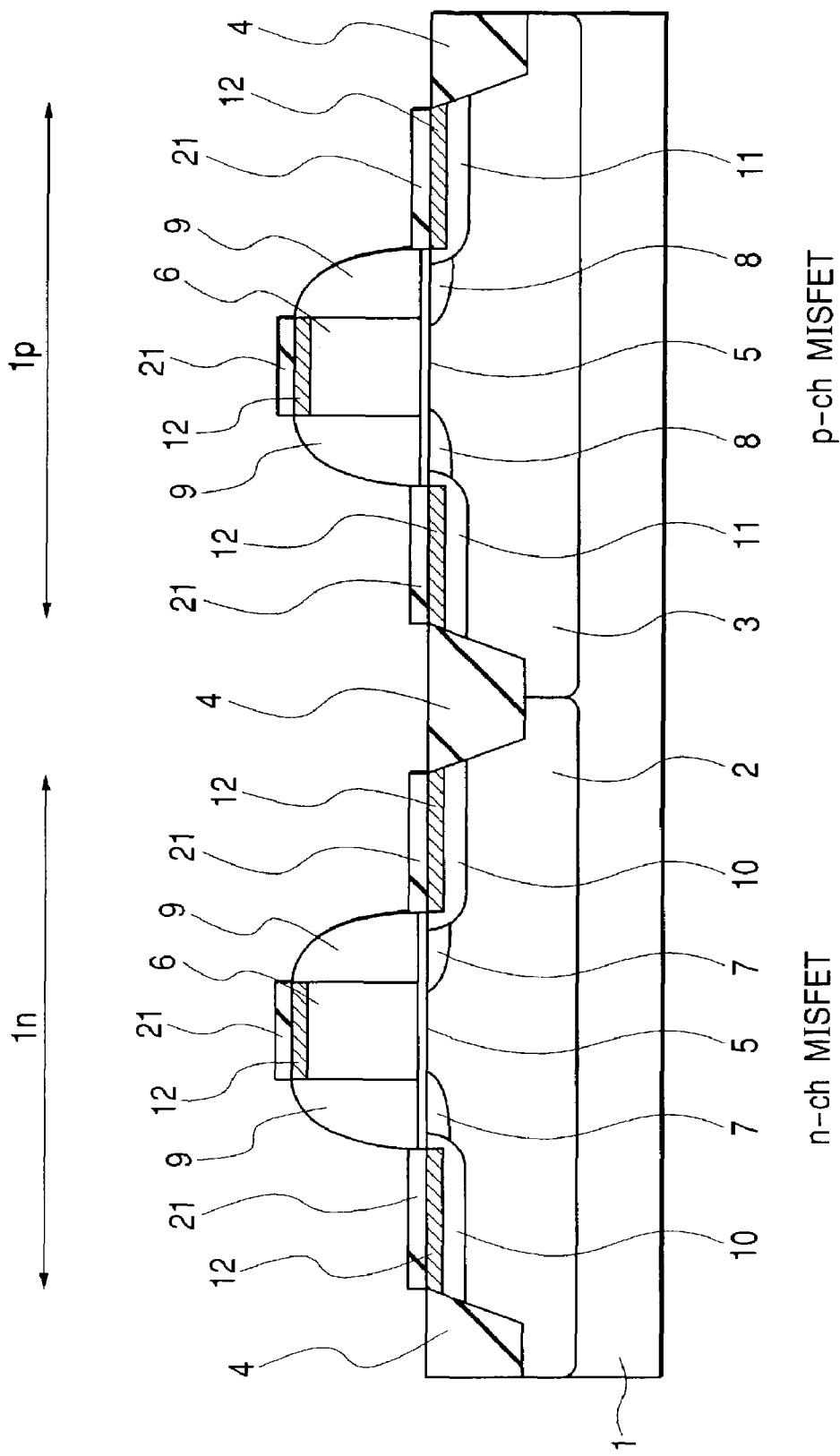
FIG. 28 is a schematic cross-sectional view of a semiconductor device according to Embodiment 3 of the present invention at a manufacturing step thereof.

FIG. 28 is a schematic cross-sectional view of a semiconductor device, at a manufacturing step thereof, according to Embodiment 3 of the present invention. In FIG. 28, the left side illustrates an n-type MISFET, while the right side illustrates a p-type MISFET.

In Embodiment 1, the insulating film 13 made of a silicon oxide film formed by the deposition method was used as an etching stopper upon removal of the silicon nitride film 14a. In Embodiment 3, on the other hand, an insulating film 21, made of a silicon oxide film formed by the thermal oxidation method, is used as an etching stopper upon removal of the silicon nitride film 14a. The formation of the insulating film 21 by the thermal oxidation method is conducted after the step of forming the n-type and p-type MISFETs having a salicide structure, but before the step of forming the silicon nitride films 14a, 14b.

By the thermal oxidation method, the insulating film 21 can be formed selectively so as to cover therewith the silicide layer 12 on the surface of the gate electrode 6, and the silicide layer 12 on the surface of the semiconductor regions (10, 11). Therefore, this insulating film 21 can suppress an inconvenience which will otherwise occur upon removal of the silicon nitride films (14a, 14b) by isotropic dry etching even if the silicon nitride film 14a is formed prior to the silicon nitride film 14b, as in Embodiment 1, or the silicon nitride film 14b is formed prior to the silicon nitride film 14a, as in the modification of Embodiment 1.

Embodiment 4

Figure 29:
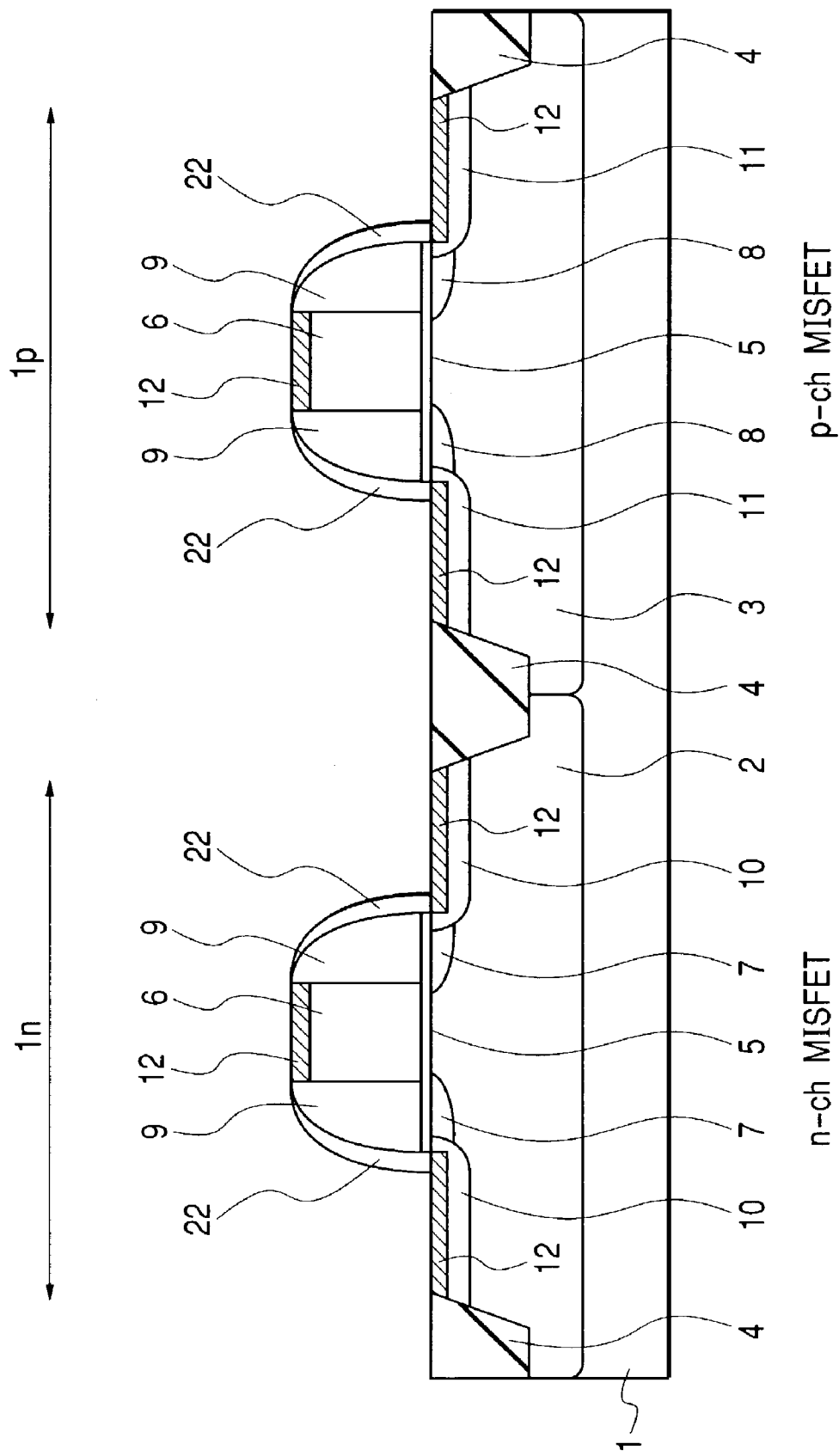
FIG. 29 is a schematic cross-sectional view of a semiconductor device according to Embodiment 4 of the present invention at a manufacturing step thereof.

FIG. 29 is a schematic cross-sectional view of a semiconductor device, at a manufacturing step thereof, according to Embodiment 4 of the present invention. In FIG. 29, the left side illustrates an n-type MISFET, while the right side illustrates a p-type MISFET.

In Embodiment 1, the insulating film 13 made of a silicon oxide film formed by the deposition method was used as an etching stopper upon removal of the silicon nitride film 14a. In this Embodiment 4, on the other hand, sidewall spacers 22 formed on the side walls of the sidewall spacers 9 using a silicon oxide film are employed as an etching stopper upon removal of the silicon nitride film 14a. The sidewall spacers 22 are formed after the formation of the n-type and p-type MISFETs having a salicide structure, but before the formation of the silicon nitride films 14a, 14b. Sidewall spacers 22 are formed in a similar manner to that employed for the formation of the sidewall spacers 9.

By forming the sidewall spacers 22 made of a silicon oxide film on the sidewalls of the sidewall spacers 9, the end portion of the silicide layer 12 on the surface of the semiconductor regions (10, 11), said end portion being on the side of the sidewall spacers 9, and the sidewall spacers 9 can be covered with the sidewall spacers 22 so that an inconvenience which otherwise occur upon removal of the silicon nitride films (14a, 14b) by isotropic dry etching, particularly an inconvenience relating to the retreat in the thickness of the sidewall spacers, can be suppressed, even if the silicon nitride film 14a is formed prior to the silicon nitride film 14b, as in Embodiment 1, or the silicon nitride film 14b is formed prior to the silicon nitride film 14a, as in the modification of Embodiment 1.

In this Embodiment 4, the sidewall spacers 22 made of a silicon oxide film were used as an etching stopper upon removal of the silicon nitride films (14a, 14b). Not only them, but also another insulating film, may be employed insofar as it is a film over which the silicon nitride films (14a, 14b) have a sufficient etching selectivity.

Embodiment 5

Figure 30A:
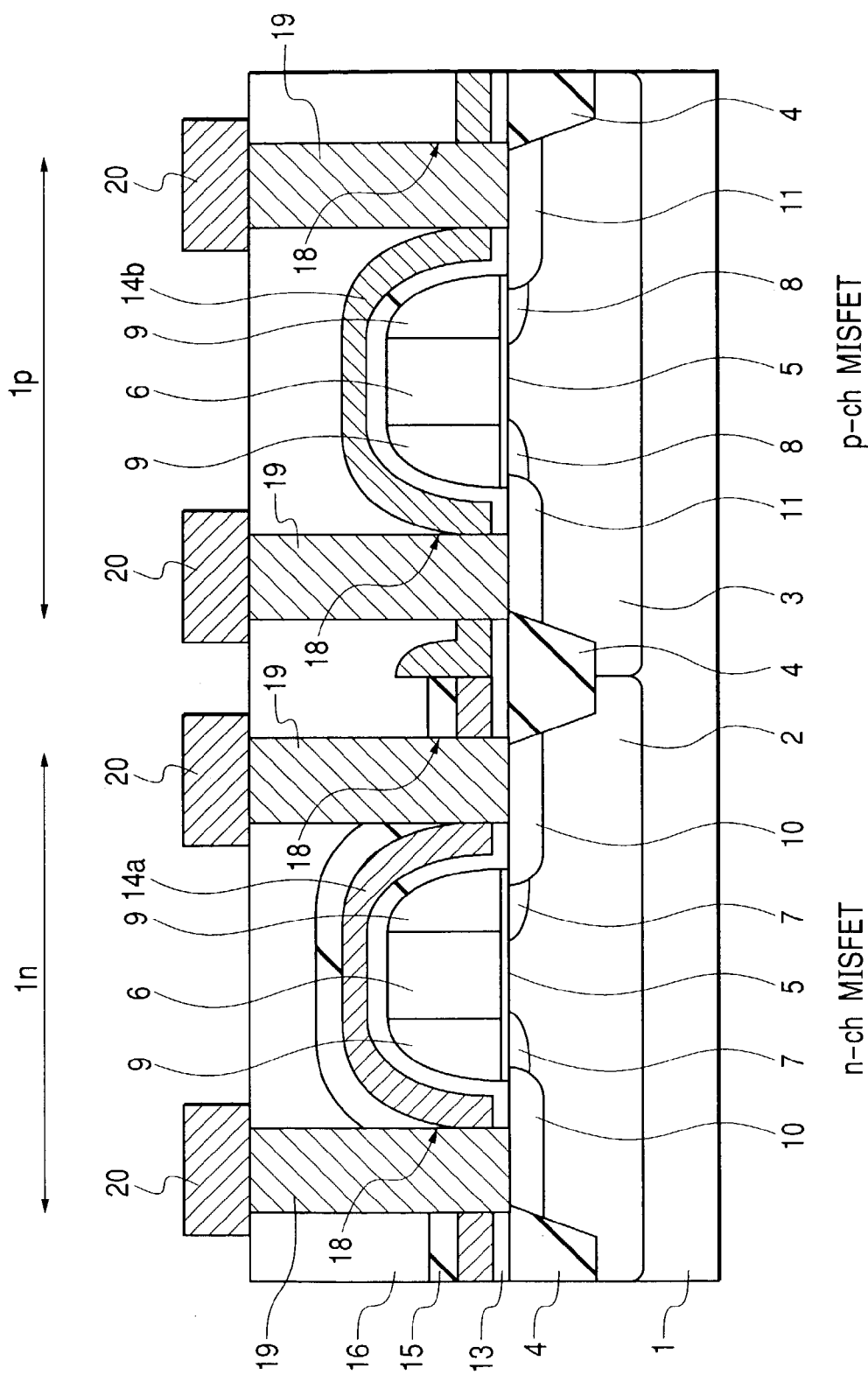

FIGS. 30A and 30B are each a schematic cross-sectional view illustrating the rough constitution of a semiconductor device according to Embodiment 5 of the present invention. In FIGS. 30A and 30B, the left side illustrates an n-type MISFET, while the right side illustrates a p-type MISFET.

In Embodiment 1, the present invention was applied to a semiconductor device having a complementary MISFET with a salicide structure. In this Embodiment 5, on the other hand, the present invention is applied to a semiconductor device having a complementary MISFET without a silicide layer.

As illustrated in FIG. 30A, the semiconductor device of Embodiment 5 is similar to that of Embodiment 1, except for the structure of the n-type and p-type MISFETs. More specifically, the n-type and p-type MISFETS of Embodiment 5 have a structure free of a silicide layer on the surface of the gate electrode and on the surface of the semiconductor regions (10, 11).

The semiconductor device of Embodiment 5 is formed in a similar manner to that employed in Embodiment 1, except for the step of forming a silicide layer.

Figure 23:
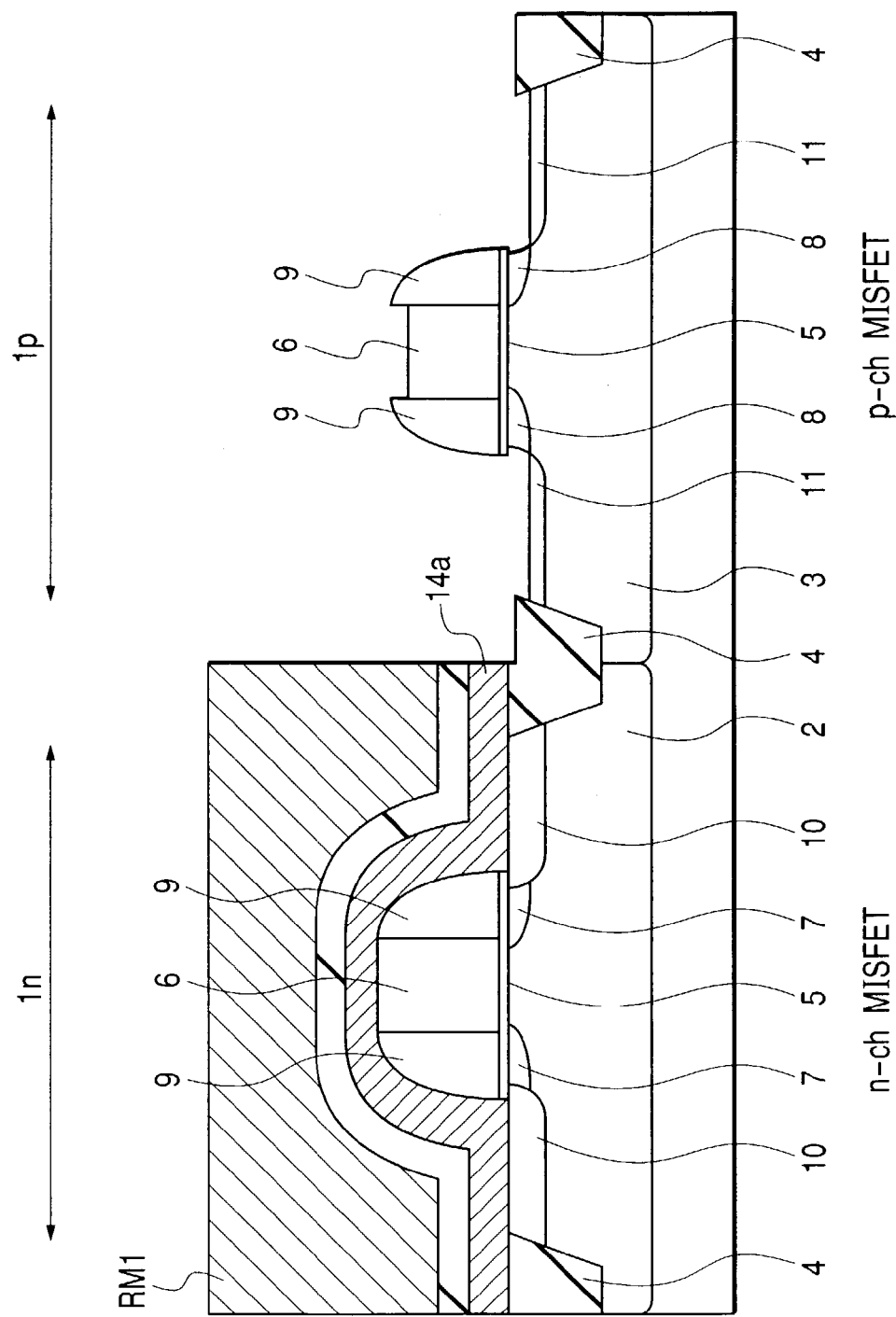
FIG. 23 is a schematic cross-sectional view illustrating a still further problem found by the present inventors during the development of the present invention.

Upon removal of the silicon nitride film 14a from the upper surface of the p-type MISFET by isotropic dry etching, the silicide layer 12 serves as an etching stopper when the p-type MISFET has a salicide structure as in Embodiment 1, making it possible to avoid etching of the polycrystalline silicon film below the silicide layer 12 of the gate electrode 6, or etching of the p-type semiconductor regions 11 below the silicide layer 12 in the source-drain regions owing to overetching. When the p-type MISFET has a structure free of the silicide layer 12 on the surface of the gate electrode 6 or on the surface of the p type semiconductor regions, the polycrystalline silicon film of the gate electrode 6 or the p type semiconductor regions 11 in the source-drain regions are etched inevitably, as illustrated in FIG. 23.

Such a problem can be overcome by covering, prior to the formation of the silicon nitride film 14a, the upper surfaces of the gate electrode 6 and the p type semiconductor regions 11 with the insulating film 13 serving as an etching stopper.

In this Embodiment 5, the insulating film 13 is employed as an etching stopper. This insulating film 13 is formed by the deposition method. The deposition method is capable of covering the upper surfaces of the gate electrode 6 and p type semiconductor regions 11 simultaneously with the insulating film 13, making it possible to suppress etching of the gate electrode 6 and p type semiconductor regions 11 at the same time.

In this Embodiment 5, the silicon nitride film 14a was formed prior to the silicon nitride film 14b. Similar effects are available even if the silicon nitride film 14b is formed prior to the silicon nitride film 14a.

In this Embodiment 5, the insulating film 13 was employed as an etching stopper, but similar effects are available even if an insulating film 21 formed by the thermal oxidation method is used as an etching stopper. Also in this Embodiment 5, the insulating film 13 serving as an etching stopper was not removed, but it may be removed as in Embodiment 2, as illustrated in FIG. 30B.

The MISFET of Embodiment 5 having no silicide layer is, for example, formed, together with the MISFET of any one of Embodiments 1 to 4 having a silicide layer, on one substrate, thereby constituting a MISFET and circuit which need a reduction in (junction) leakage current between the source region or drain region and the substrate. More specifically, a MISFET which needs a reduction in junction leakage current is constituted of the MISFET of Embodiment 5 having no silicide layer, while a MISFET which needs high-speed operation is constituted of the MISFET of any one of Embodiments 1 to 4 having a silicide layer, whereby a decrease in power consumption and high-speed operation can be accomplished.

The insulating film 13 can be deposited in one step over a MISFET having no silicide layer and a MISFET having a silicide layer, making it possible to fabricate a semiconductor device featuring low power consumption and high-speed operation, without increasing the number of manufacturing steps.

When a MISFET having a silicide layer and a MISFET having no silicide layer are formed on one substrate, the former MISFET may be free of the insulating film 13 serving as an etching stopper, as illustrated in FIG. 25, while the latter MISFET may have the insulating film 13 serving as an etching stopper, as illustrated in FIG. 30A.

In the above-described case, the time when the insulating film 13 is removed from the upper surface of the MISFET having a silicide layer varies depending on which film is formed first, a first film for generating a stress in the channel formation region of MISFET having a silicide layer or a second film for generating a stress in the channel formation region of the MISFET free of the silicide layer. For example, supposing that the MISFET having a silicide layer is an n-type type and the MISFET having no silicide layer is a p-type type, when the first film (silicon nitride film 14a) is formed first, the insulating film 13 over the MISFET having a silicide layer is removed selectively prior to the formation of the silicon nitride film 14a, as illustrated in FIG. 26 (refer to this drawing after the p-type MISFET on the right side is replaced with a p-type MISFET having no silicide layer). When the second film (silicon nitride film 14b) is formed first, on the other hand, the insulating film 13 over the MISFET having a silicide layer is removed selectively after selective removal of the silicon nitride film 14b from the upper surface of the MISFET having a silicide layer, but prior to the formation of the silicon nitride film 14a. When the MISFET having a silicide layer is a p-type type and the MISFET having no silicide layer is an n-type type, the insulating film 13 is selectively removed from the upper surface of the MISFET having a silicide layer in a similar manner. When the MISFET having a silicide layer and MISFET free of a silicide layer are formed on the same substrate, an insulating film serving as an etching stopper may be omitted, as illustrated in FIG. 25, in the case of a MISFET having a silicide layer, and, as illustrated in FIG. 30B, in the case of MISFET free of a silicide layer. By performing a step of removing the insulating film 13 common to the MISFET having a silicide layer and MISFET free of a silicide layer, the removal of the insulating film can be carried out by the same number of steps as shown in Embodiment 2, so that the number of manufacturing steps can be reduced.

Embodiment 6

FIG. 31 is a schematic cross-sectional view illustrating the rough constitution of a semiconductor device according to Embodiment 6 of the present invention. FIGS. 32 to 35 are each a schematic cross-sectional view of the semiconductor device, at a manufacturing step thereof, according to Embodiment 6 of the present invention. In FIGS. 31 to 35, the left side illustrates the n-type MISFET, while the right side illustrates the p-type MISFET.

In Embodiment 6, a film for generating a compressive strength in the channel formation region of the p-type MISFET is stacked over a film for generating a tensile strength in the channel formation region of the n-type MISFET, thereby increasing the drain current of each of the n-type and p-type MISFETs.

As illustrated in FIG. 31, the n-type and p-type MISFETs are each covered with the silicon nitride film 14a, while the p-type MISFET is covered with the silicon nitride film 14b.

In other words, only the silicon nitride film 14a exists on the n-type MISFET, while the silicon nitride films 14a, 14b exist on the p-type MISFET.

Since only the silicon nitride film 14a exists on the n-type MISFET, only a tensile stress of the silicon nitride film 14a is applied to the channel formation region of the n-type MISFET, while both a tensile stress of the silicon nitride film 14a and compressive stress of the silicon nitride film 14a are applied to the channel formation region of the p-type ISFET because the silicon nitride films 14a, 14b exist on the p-type MISFET. Accordingly, it is possible to generate a compressive stress in the channel formation region of the p-type MISFET by using at least the silicon nitride film 14b having a compressive stress larger in terms of absolute value than the tensile stress of the silicon nitride film 14a.

In Embodiment 6, the silicon nitride film 14b having a compressive stress is formed above the silicon nitride film 14a having a tensile stress so that the starting point of the film stress relative to the channel formation region of the p-type MISFET becomes farther in the silicon nitride film 14a than in the silicon nitride film 14a. Therefore, in such a case, it is desired to use the silicon nitride film 14b having at least twice as much tensile stress, in terms of absolute value, as that of the silicon nitride film 14a.

Next, the manufacturing process of the semiconductor device according to Embodiment 6 will be described with reference to FIGS. 32 to 35.

Figure 32:
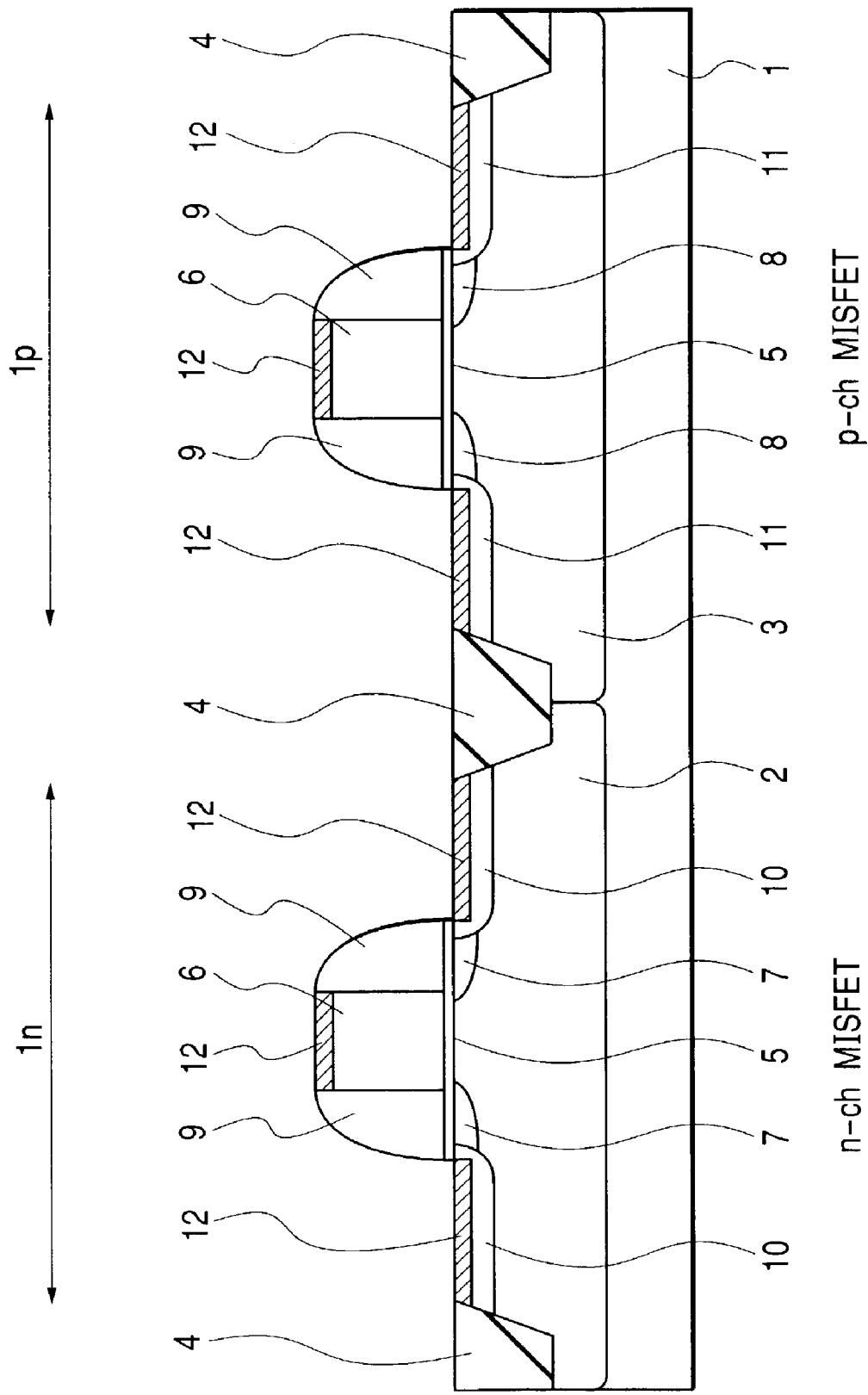
FIG. 32 is a schematic cross-sectional view illustrating the semiconductor device according to Embodiment 6 of the present invention at a manufacturing step thereof.

As illustrated in FIG. 32, n-type and p-type MISFETS having a salicide structure are formed in a similar manner to that employed in Embodiment 1.

Figure 33:
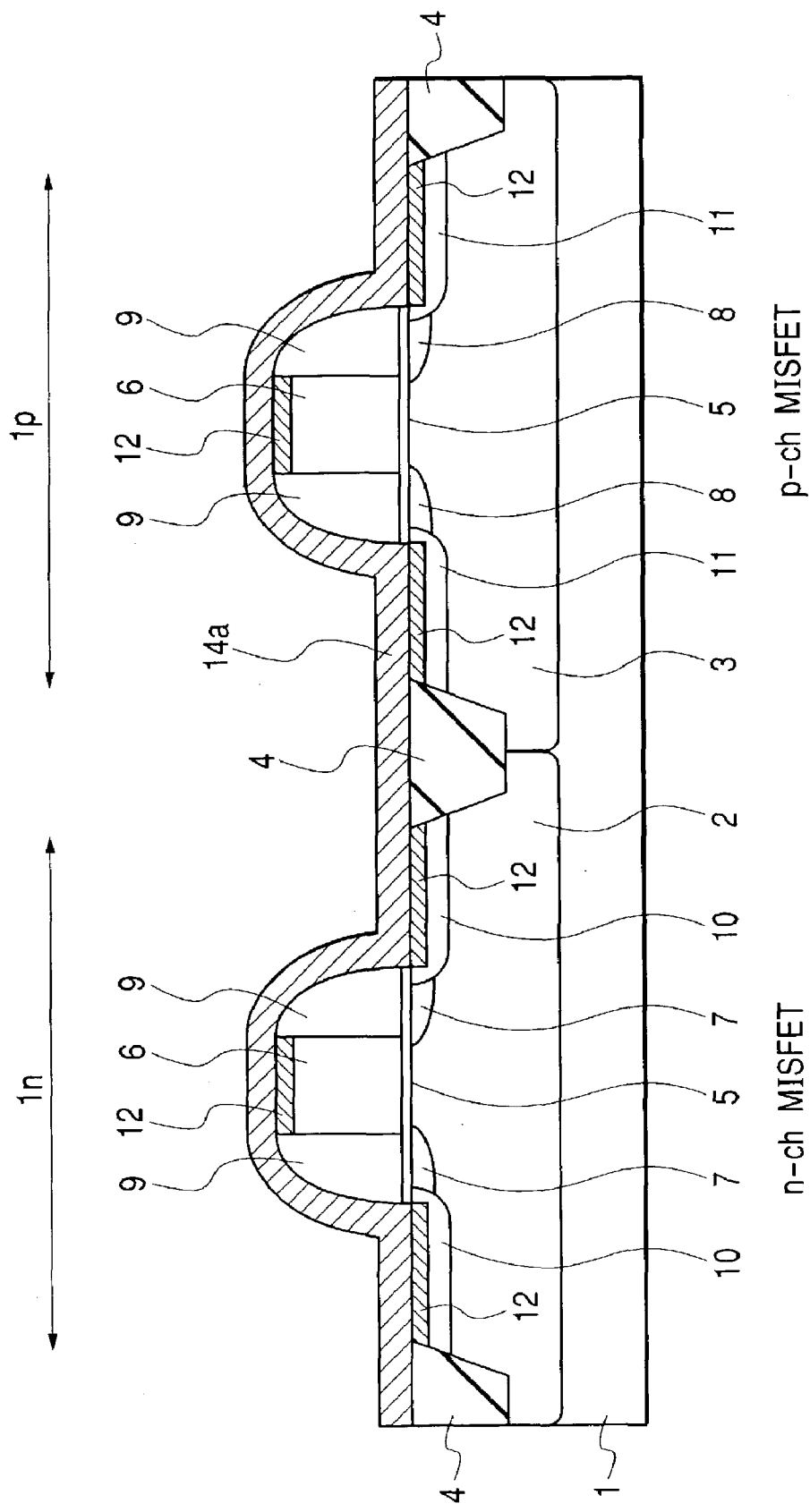
FIG. 33 is a schematic cross-sectional view of the semiconductor device at a manufacturing step following that of FIG. 32.

As illustrated in FIG. 33, a silicon nitride film 14a of about 100 to 120 nm thick is then formed by plasma CVD all over the circuit formation surface of a p type substrate 1, including the upper surfaces of n-type and p-type MISFETs. This silicon nitride film 14a is formed, for example, under the condition of an RF power ranging from 350 to 400 W.

Figure 34:
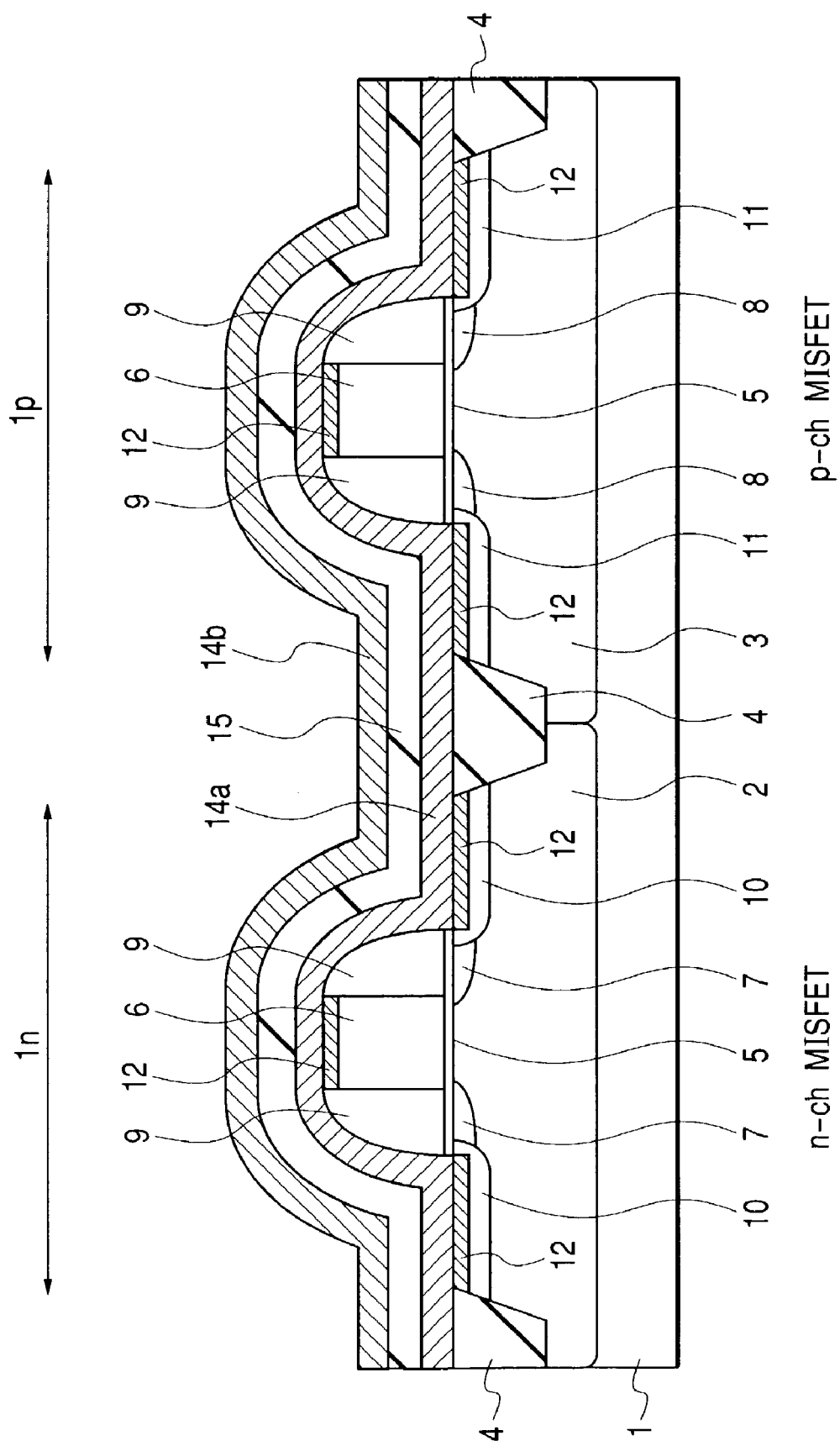
FIG. 34 is a schematic cross-sectional view of the semiconductor device at a manufacturing step following that of FIG. 33.

As illustrated in FIG. 34, an insulating film 15 made of, for example, a silicon oxide film of about 50 nm thick is formed by CVD all over the surface of the p type substrate 1, including the upper surfaces of the n-type and p-type MISFETS, followed by the formation of a silicon nitride film 14b of about 100 to 200 nm thick by plasma CVD all over the surface of the p type substrate 1, including the upper surfaces of the n-type and p-type MISFETs. The silicon nitride film 14b is formed, for example, under the condition of an RF power ranging from 600 to 700 W.

In the above-described step, the silicon nitride film 14b, having a compressive stress at least greater in terms of absolute value than a tensile stress of the silicon nitride film 14a, is formed so as to generate a compressive stress in the channel formation region of the p-type MISFET. In this Embodiment, the silicon nitride film 14b was formed to have at least twice the tensile stress, in terms of absolute value, as that of the tensile stress of the silicon nitride film 14a.

Figure 35:
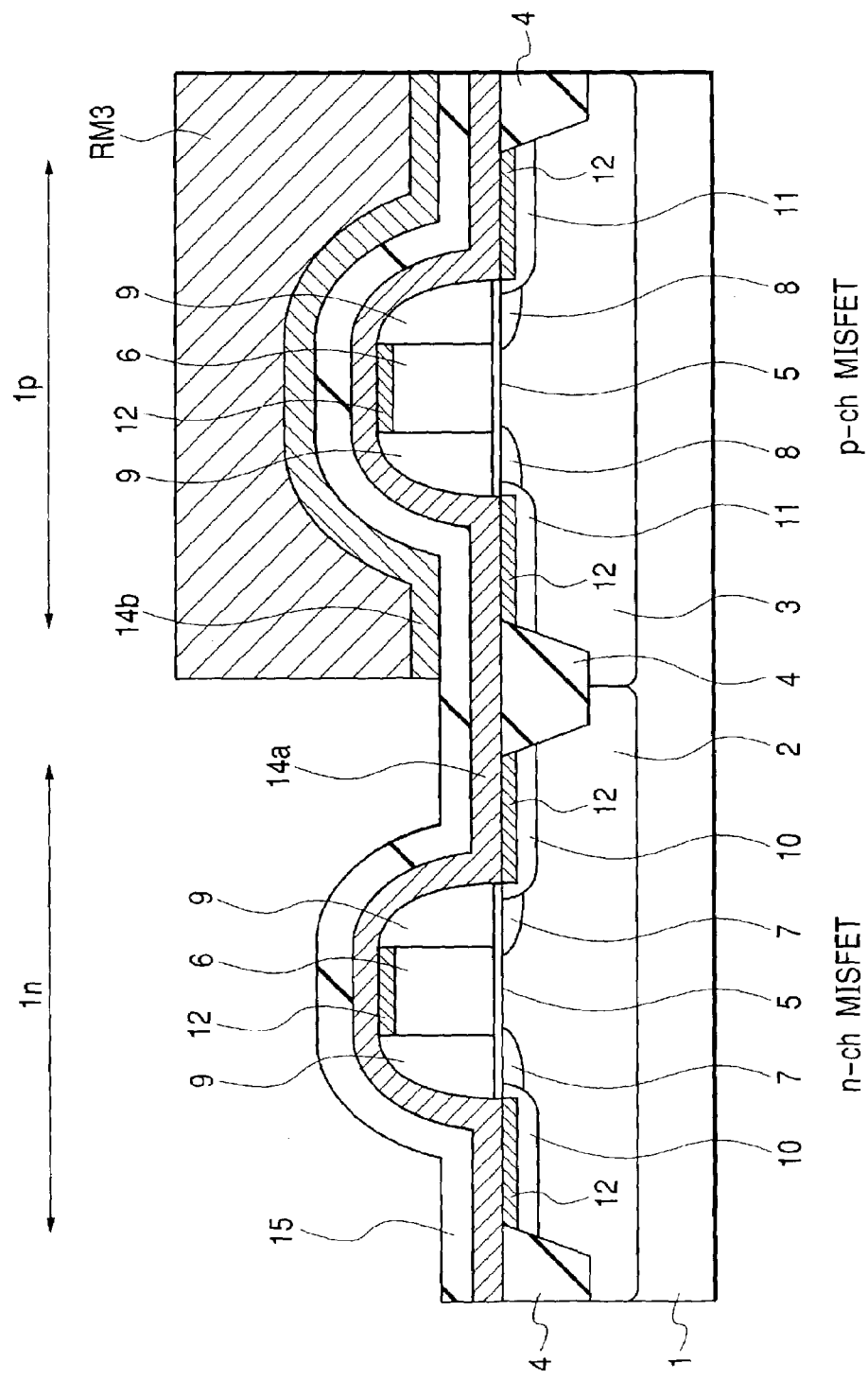
FIG. 35 is a schematic cross-sectional view of the semiconductor device at a manufacturing step following that of FIG. 34.

Over the silicon nitride film 14b, a photoresist mask RM3 is formed to selectively cover therewith the upper surface of the p-type MISFET, followed by etching with the photoresist mask RM3, serving as an etching mask to remove the silicon nitride film 14b over the n-type MISFET, as illustrated in FIG. 35. The silicon nitride film 14b is removed by isotropic dry etching.

The photoresist mask RM3 is then removed, leaving the structure as illustrated in FIG. 31.

As described above, a compressive stress can be generated in the channel formation region of the p-type MISFET by forming the silicon nitride film 14a over the n-type and p-type MISFETs and then selectively forming the silicon nitride film 14b, having a compressive stress greater in terms of absolute value than the tensile stress of the silicon nitride film 14a, over the p-type MISFET. Therefore, in this Embodiment, it is possible to increase the drain currents of the n-type MISFET and the p-type MISFET simultaneously.

In this Embodiment 6, since the silicon nitride film 14a over the p-type MISFET is not removed, formation of the insulating film 13, serving as an etching stopper, as in Embodiment 1, is not necessary. Therefore, compared with Embodiment 1, the number of manufacturing steps can be reduced.

In this Embodiment 6, the formation of the silicon nitride film 14a covering the n-type and p-type MISFETs was followed by the formation of the silicon nitride film 14b covering only the upper surface of the p-type MISFET. The silicon nitride film 14b covering only the upper surface of the p-type MISFET may be formed prior to the formation of the silicon nitride film 14a covering the upper surface of the n-type and p-type MISFETs. In this case, however, an insulating film serving as an etching stopper becomes necessary upon removal of the silicon nitride film 14b, as in Embodiment 1.

Figure 36:
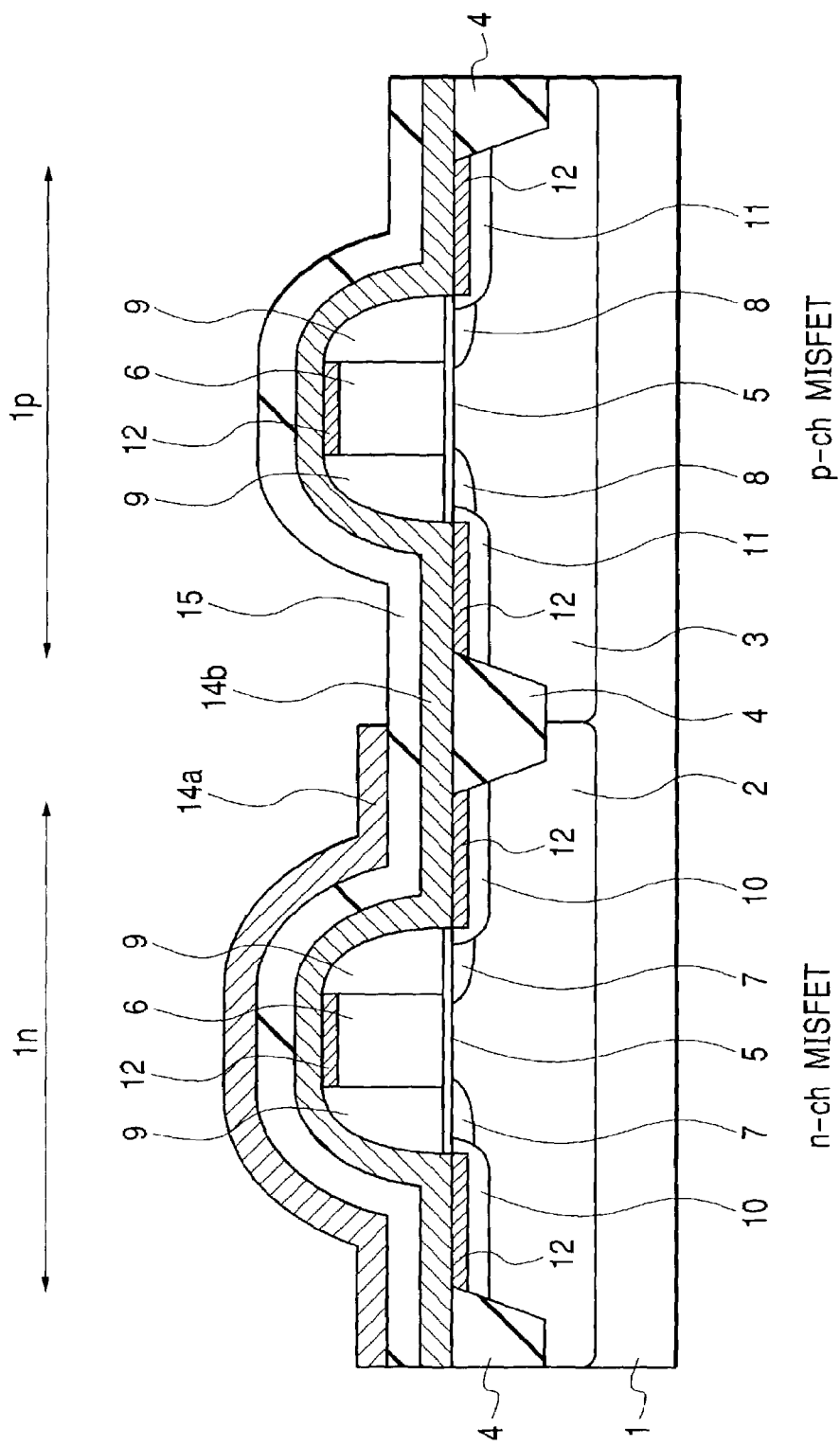
FIG. 36 is a schematic cross-sectional view illustrating an example of a modification of Embodiment 6 of the present invention.

FIG. 36 is a schematic cross-sectional view illustrating the rough constitution of a semiconductor device, which represents an example of a modification of Embodiment 6 of the present invention. In FIG. 36, the n-type MISFET is illustrated on the left side, while the p-type MISFET is illustrated on the right side.

In Embodiment 6, the drain currents of the n-type and p-type MISFETs were increased simultaneously by forming over the n-type and p-type MISFETs the silicon nitride film 14a having a tensile stress, and then selectively forming, over the p-type MISFET, the silicon nitride film 14b having a compressive stress greater in terms of absolute value than the tensile stress of the silicon nitride film 14a. As illustrated in FIG. 36, after formation of the silicon nitride film 14b having a compressive stress over the n-type and p-type MISFETs, the silicon nitride film 14a, having a tensile stress greater in terms of absolute value than the compressive stress of the silicon nitride film 14b, may be selectively formed over the n-type MISFET. In this case, the drain currents of the n-type MISFET and p-type MISFET can be increased simultaneously.

In FIG. 36, the formation of the silicon nitride film 14b covering the upper surfaces of the n-type and p-type MISFETs was followed by the formation of the silicon nitride film 14a covering only the upper surface of the n-type MISFET. The silicon nitride film 14a covering only the upper surface of the n-type MISFET may be formed prior to the formation of the silicon nitride film 14b covering the upper surfaces of the n-type and p-type MISFETs. In this case, however, an insulating film serving as an etching stopper upon removal of the silicon nitride film 14b becomes necessary, as in Embodiment 1.

Embodiment 7

Figure 37:
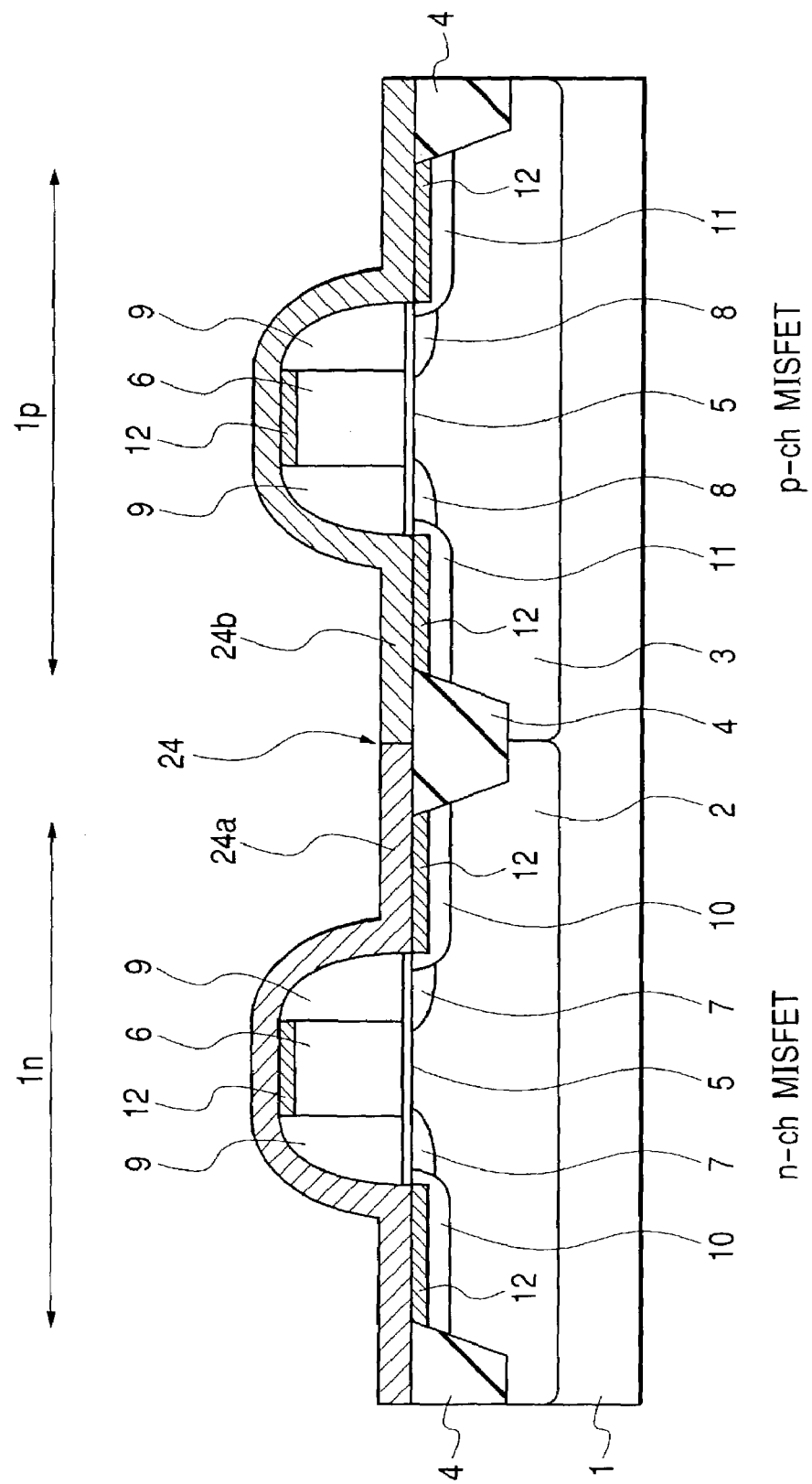
FIG. 37 is a schematic cross-sectional view illustrating the rough constitution of a semiconductor device according to Embodiment 7 of the present invention.
Figure 38:
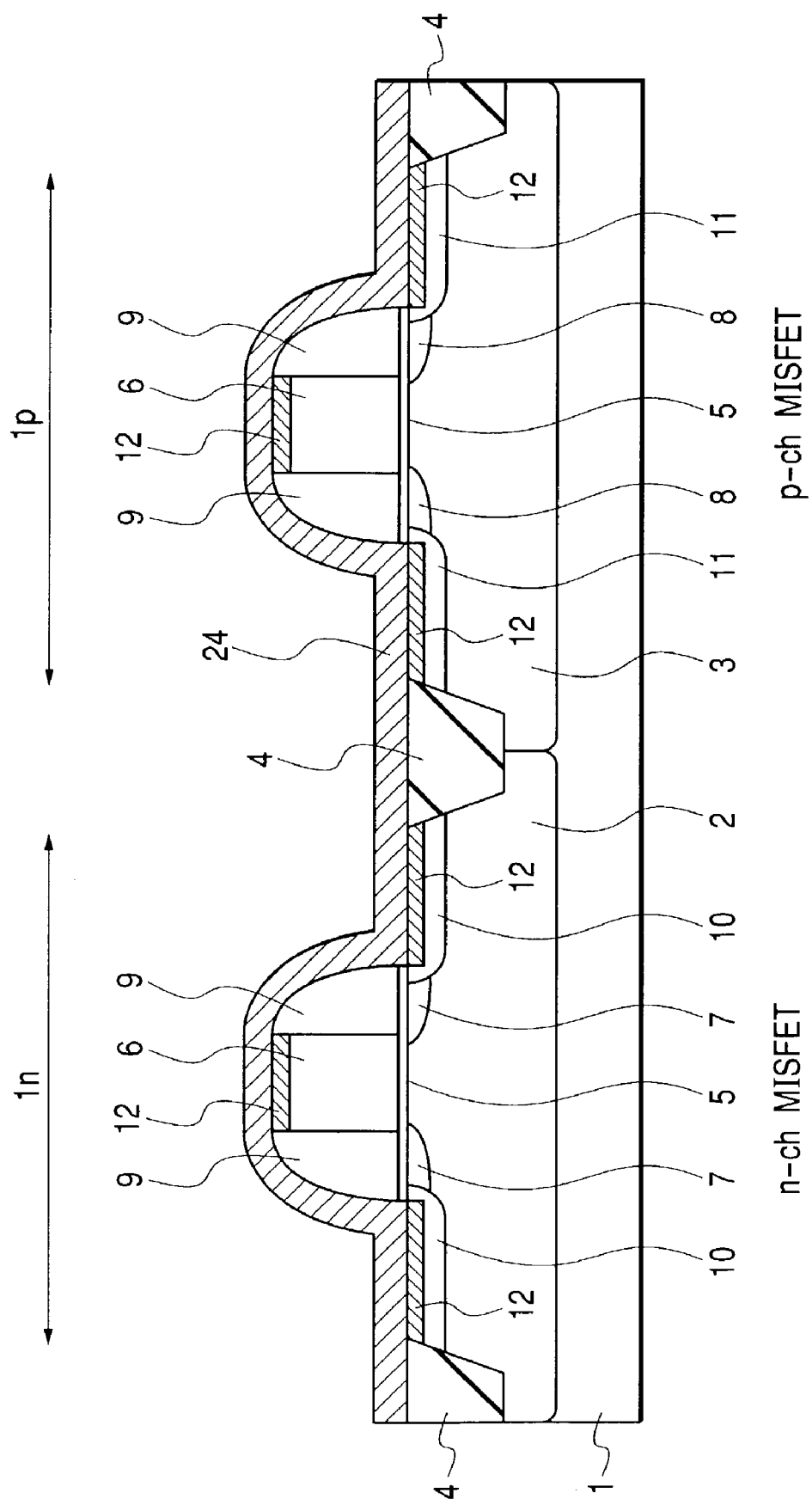
FIG. 38 is a schematic cross-sectional view of the semiconductor device according to Embodiment 7 of the present invention at a manufacturing step thereof.
Figure 39:
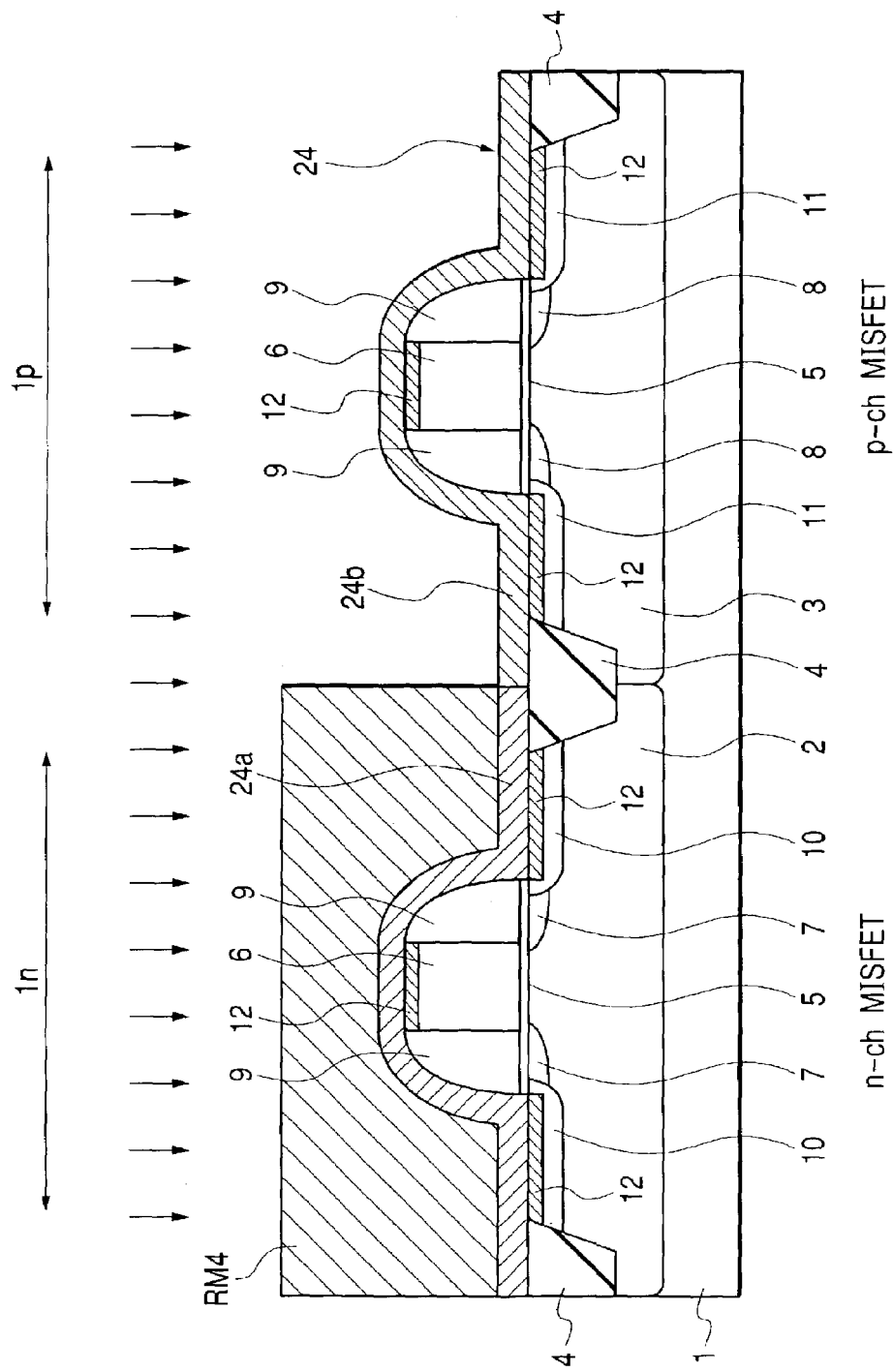
FIG. 39 is a schematic cross-sectional view of the semiconductor device at a manufacturing step following FIG. 38.

FIG. 37 is a schematic cross-sectional view illustrating the rough constitution of a semiconductor device according to Embodiment 7 of the present invention. FIGS. 38 and 39 are each a schematic cross-sectional view of the semiconductor device, at a manufacturing step thereof, according to Embodiment 7 of the present invention. In FIGS. 37 to 39, a n-type MISFET is illustrated on the left side, while a p-type MISFET is illustrated on the right side.

This Embodiment 7 aims at an increase in the drain currents of the n-type and p-type MISFETs by the use of one silicon nitride film.

As illustrated in FIG. 37, the n-type and p-type MISFETs are covered with a silicon nitride film 24. This silicon nitride film 24 has two portions, that is, a first portion 24a for generating a tensile stress in the channel formation region of the n-type MISFET and a second portion 24b for generating a compressive stress in the channel formation region of the p-type MISFET. The first portion 24a is formed over the n-type MISFET to cover its gate electrode 6, while the second portion 24b is formed over the p-type MISFET to cover its gate electrode 6. The second portion 24b is higher than the first portion 24a in the concentrations of Si and N. Next, the process of manufacture of the semiconductor device of this Embodiment 7 will be described with reference to FIGS. 37 to 39.

After formation of the n-type and p-type MISFETS having a salicide structure in a similar manner to Embodiment 1, a silicon nitride film 24 for generating a tensile stress in the channel formation region of the n-type MISFET is formed, as illustrated in FIG. 38, by plasma CVD all over the circuit formation surface of the p type substrate 1, including the upper surfaces of the n-type and p-type MISFETs. The silicon nitride film 24 is formed, for example, under the condition of an RF power ranging from 350 to 400 W.

A photoresist mask RM4 covering the n-type MISFET and having an opening over the p-type MISFET is formed over the silicon nitride film 24. Using the photoresist mask RM4 as a mask, Si and N are introduced, as illustrated in FIG. 39 by the ion implantation method, into the silicon nitride film 24 (into the silicon nitride film 24 over the p-type MISFET) that is exposed from the photoresist mask RM4. To attain introduction of these elements uniformly in the film depth direction, this ion implantation is conducted under the conditions of an acceleration energy permitting the peak value (Rp) of the element concentration in the depth direction to be about half of the film thickness and a dose of $1 \times 10^{15}/cm^2$.

By the above-described step, the silicon nitride film 24 having the first portion 24a, and the second portion 24b that is higher in element concentration than the first portion 24a, is formed.

After removal of the photoresist mask RM4, the second portion 24b of the silicon nitride film 24 is activated by heat treatment.

By this step, the second portion 24b of the silicon nitride film 24 undergoes volume expansion and is converted into a film generating a compressive stress in the channel formation region of the p-type MISFET. As a result, as illustrated in FIG. 37, the silicon nitride film 24 has the first portion 24a for generating a tensile stress in the channel formation region of the n-type MISFET and a second portion 24b for generating a compressive stress in the channel formation region of the p-type MISFET.

By forming the silicon nitride film 24 to have the above-described structure, the drain currents of the n-type MISFET and p-type MISFET can be increased simultaneously also in Embodiment 7.

Moreover, in Embodiment 7, the silicon nitride film 24 over the p-type MISFET is not removed, so that the formation of the insulating film 13, serving as an etching stopper, as in Embodiment 1, is not necessary. Therefore, the number of manufacturing steps can be decreased compared with that of Embodiment 1.

Furthermore, in Embodiment 7, the drain currents of the n-type and p-type MISFETs can be controlled simultaneously to show an increase by one silicon nitride film 24 so that it is necessary to carry out a covering step with a silicon nitride film only once. Compared with Embodiment 1, the covering step with a silicon nitride film and its removal step can be omitted, leading to simplification of the manufacturing steps.

Figure 40:
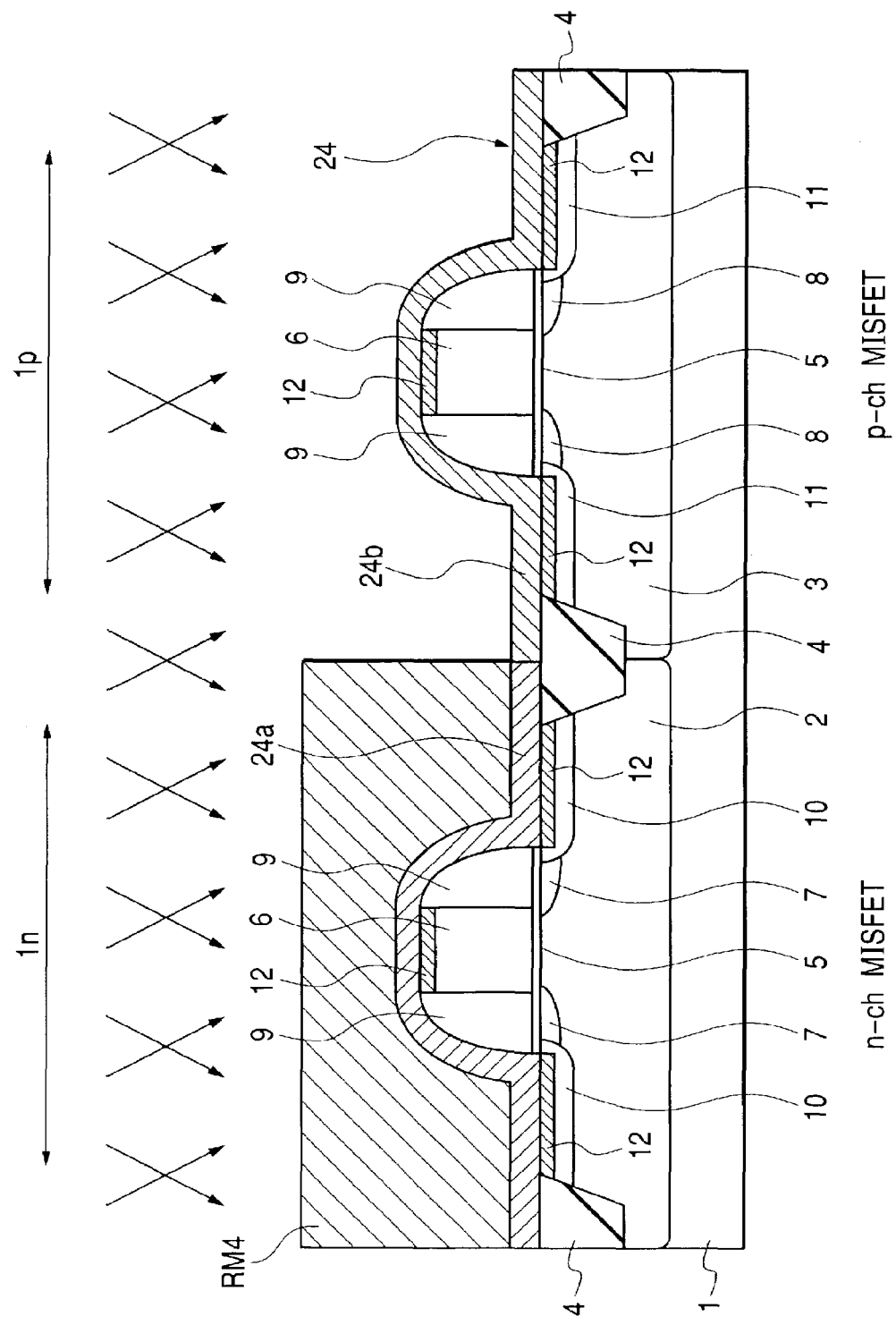
FIG. 40 is a schematic cross-sectional view illustrating an example of a modification of Embodiment 7 of the present invention.

FIG. 40 is a schematic cross-sectional view of a semiconductor device, at a manufacturing step thereof, according to an example of a modification of Embodiment 7 of the present invention.

In Embodiment 7, elements, that is, Si and N, were introduced perpendicularly to the p type substrate 1. As illustrated in FIG. 40, they may be introduced obliquely to the p type substrate 1. In this way, elements can be introduced also into the gate sidewall portion (step portion) of the silicon nitride film 24 covering the sidewalls of the sidewall spacers 9, which brings about an improvement in the compressive stress generating effect.

Embodiment 8

Figure 41:
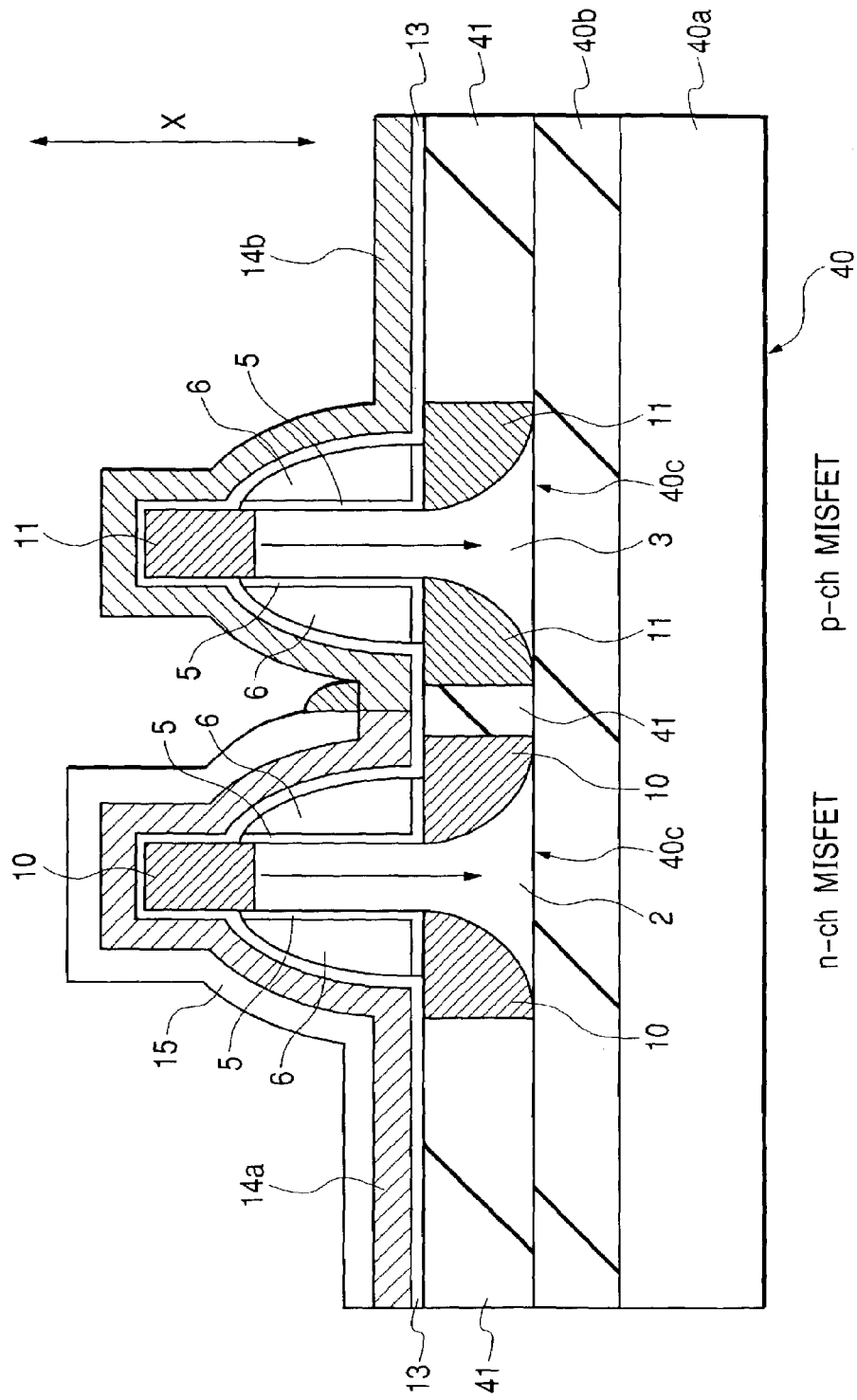
FIG. 41 is a schematic cross-sectional view illustrating the rough constitution of a semiconductor device according to Embodiment 8 of the present invention.

FIG. 41 is a schematic cross-sectional view illustrating the rough constitution of a semiconductor device according to Embodiment 8 of the present invention.

In Embodiment 8, the present invention is applied to a semiconductor device having a complementary MISFET with a vertical double gate structure.

As illustrated in FIG. 41, the semiconductor device of Embodiment 8 is composed mainly of a semiconductor substrate (which will hereinafter simply be called a "substrate") having an SOI (Silicon On Insulator) structure. The substrate 40 has, for example, a semiconductor layer 40a, an insulating layer 40b disposed over the semiconductor layer 40a, and a semiconductor layer 40c disposed over the insulating layer 40b. The semiconductor layers 40a and 40c are each made of, for example, single crystal silicon, while the insulating layer 40b is made of, for example, silicon oxide.

The semiconductor layer 40c is divided into a plurality of element formation portions. Each element formation portion has either an n-type MISFET or a p-type MISFET. In the semiconductor layer 40c on which the n-type MISFET is to be formed, a p type well region 2 is disposed, while the semiconductor layer 40c on which the p-type MISFET is to be formed, an n type well region 8 is disposed. Each of the semiconductor layers 40c is encompassed with an insulating film 41 disposed over the insulating film 40b, whereby they are separated and electrically isolated.

The n-type and p-type MISFETs of this Embodiment 8 have a double gate structure in which the semiconductor layer 40c to be used as a channel formation region is sandwiched, in the plane direction (surface direction) of the substrate 40, by two gate electrodes 6. In addition, the n-type and p-type MISFETS have a vertical structure permitting flow of a drain current in the thickness direction of the substrate 40.

The silicon nitride film 14a for generating a tensile stress in the channel formation region of the n-type MISFET is formed over the n-type MISFET to cover these two gate electrodes 6, while the silicon nitride film 14b for generating a compressive stress in the channel formation region of the p-type MISFET is formed over the p-type MISFET to cover the two gate electrodes 6.

In Embodiment 8, the n-type and p-type MISFETs have a double gate structure in which the semiconductor layer 40c used as a channel formation region is sandwiched, in the plane direction of the substrate 40, by two gate electrodes 6, which doubles the influence of the stress caused by the silicon nitride film and heightens the drain current increasing ratio compared with the conventional type having a single gate structure.

Embodiment 9

Figure 42:
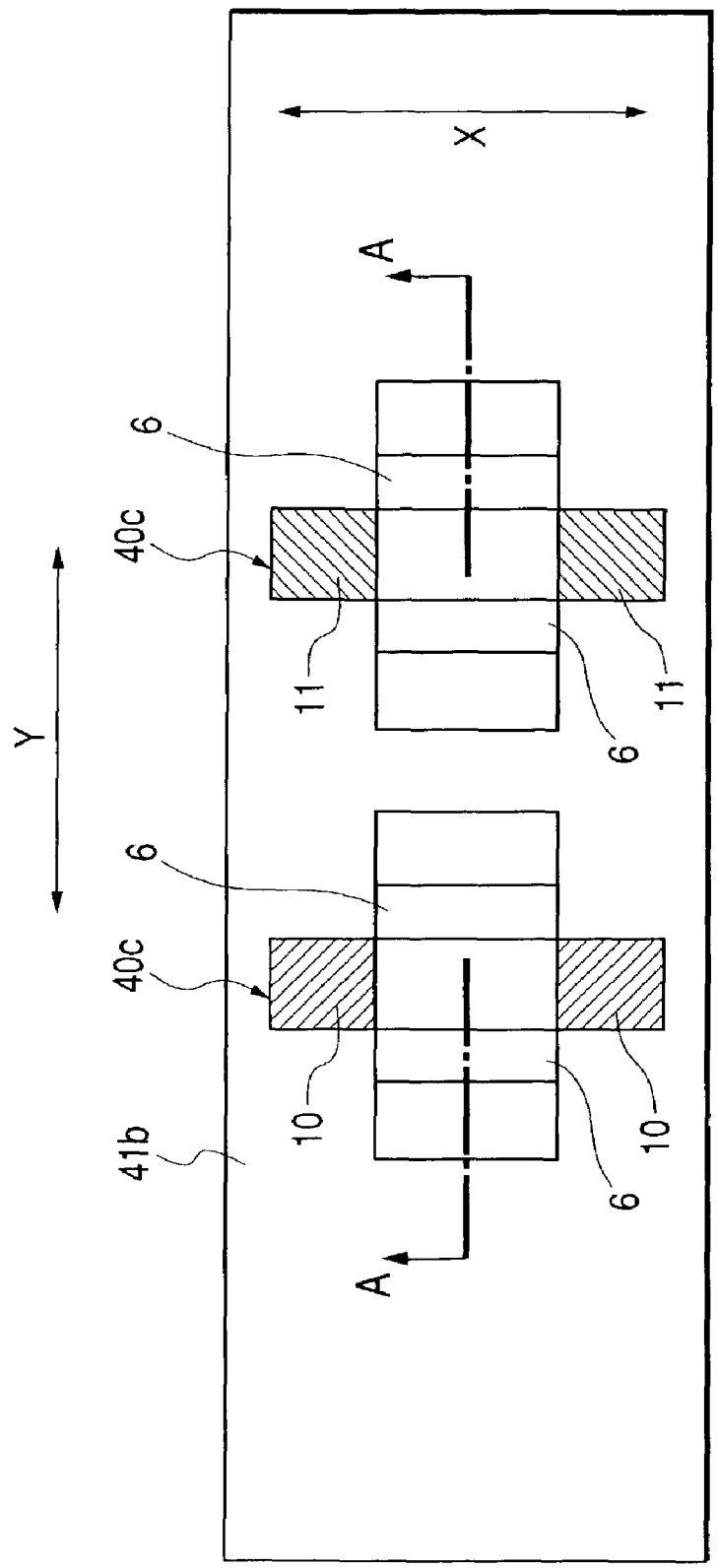
FIG. 42 is a schematic plane view illustrating the rough constitution of a semiconductor device according to Embodiment 9 of the present invention.
Figure 43:
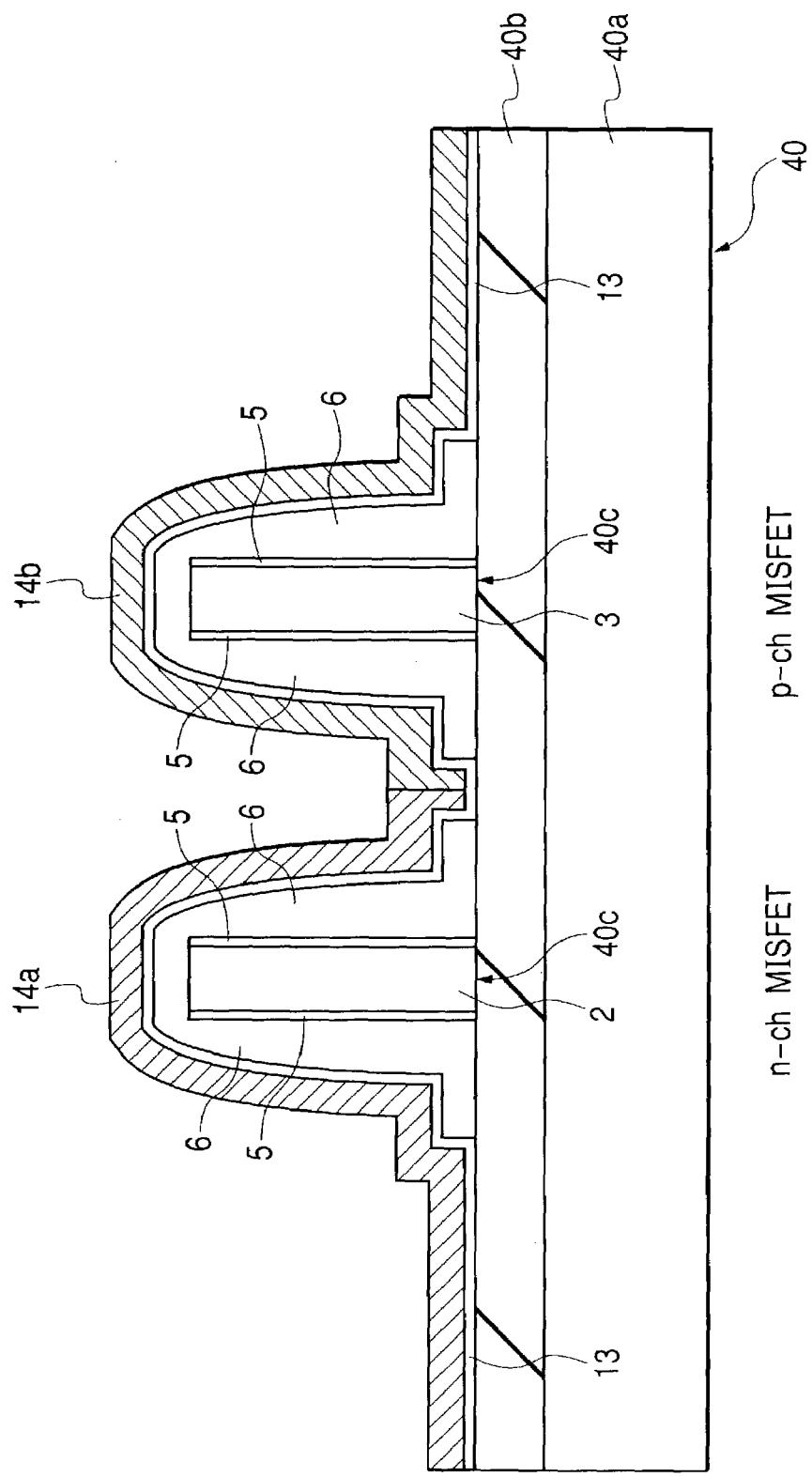
FIG. 43 is a schematic cross-sectional view taken along a line A—A of FIG. 42.

FIG. 42 is a schematic plane view illustrating the rough constitution of a semiconductor device according to Embodiment 9 of the present invention, and FIG. 43 is a schematic cross-sectional view taken along a line A—A of FIG. 42.

In Embodiment 9, the present invention is applied to a semiconductor device having a complementary MISFET with a horizontal double gate structure.

As illustrated in FIGS. 42 and 43, n-type and p-type MISFETs of this Embodiment 9 have a double gate structure in which a semiconductor layer 40c to be used as a channel formation region is sandwiched, in the plane direction of a substrate 40, by two gate electrodes 6. The n-type and p-type MISFETs have a horizontal structure permitting flow of a drain current in the plane direction of the semiconductor substrate 40.

The silicon nitride film 14a for generating a tensile stress in the channel formation region of the n-type MISFET is formed over the n-type MISFET to cover two gate electrodes 6 thereof, while the silicon nitride film 14b for generating a compressive stress in the channel formation region of the p-type MISFET is formed over the p-type MISFET to cover two gate electrodes 6 thereof.

In Embodiment 9, the double gate structure of the n-type and p-type MISFETs, in which the semiconductor layer 40c to be used as a channel formation region is sandwiched, in the plane direction of the substrate 40, by two gate electrodes 6, doubles the influence of the stress caused by the silicon nitride film and heightens the drain current increasing ratio compared with the conventional type having a single gate structure.

Embodiment 10

Figure 44:
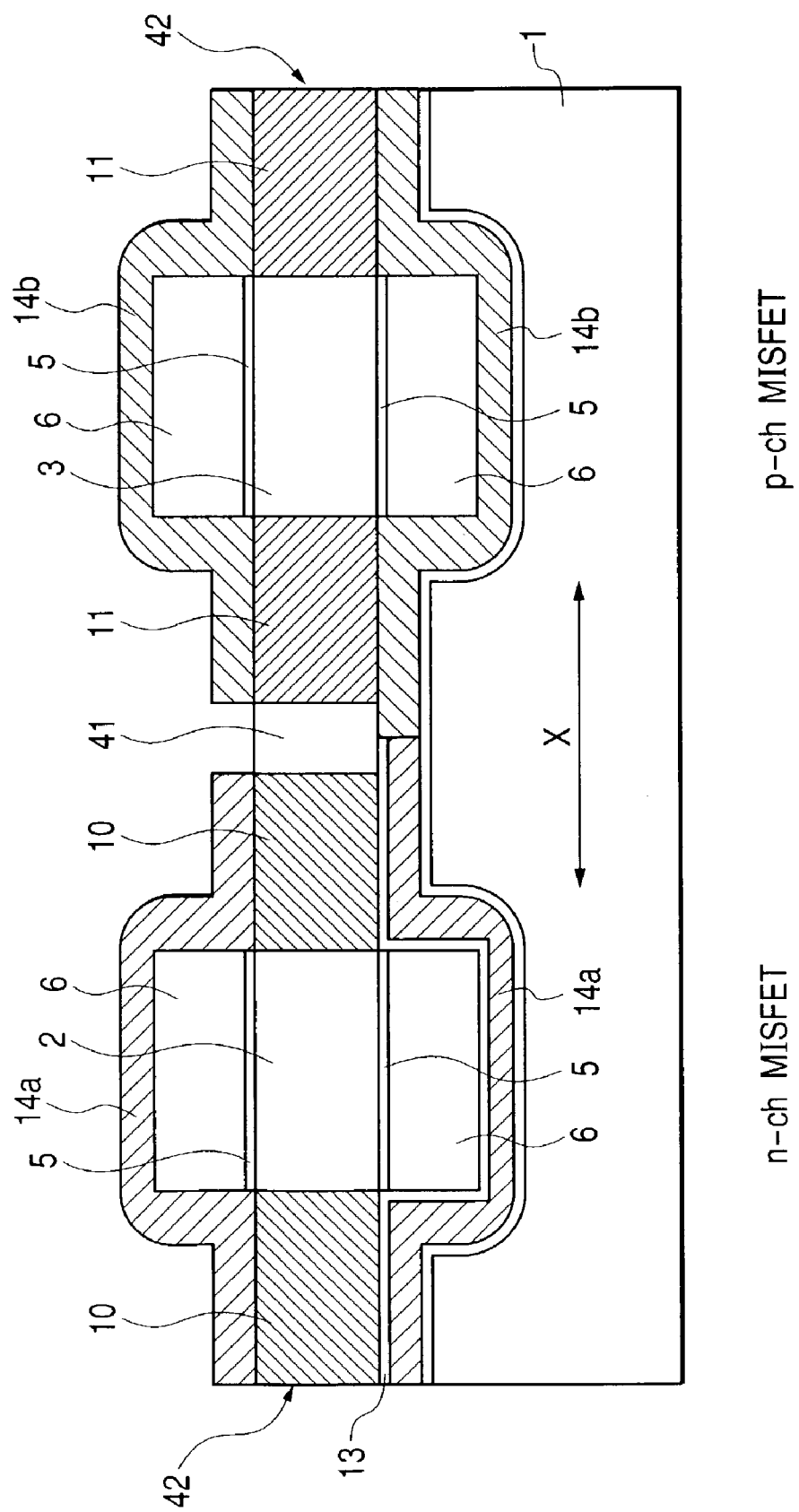
FIG. 44 is a schematic cross-sectional view illustrating the rough constitution of a semiconductor device according to Embodiment 10 of the present invention.

FIG. 44 is a schematic cross-sectional view illustrating the rough constitution of a semiconductor device according to Embodiment 10 of the present invention.

In Embodiment 10, the present invention is applied to a semiconductor device having a complementary MISFET with a horizontal double gate structure.

As illustrated in FIG. 44, the semiconductor device according to Embodiment 10 is composed mainly of a p type substrate 1. Over the main surface of the p type substrate 1, a semiconductor layer 42 is disposed. This semiconductor layer 42 is divided into a plurality of element formation portions, and each portion has either an n-type MISFET or a p-type MISFET. In the semiconductor layer 42 on which the n-type MISFET is to be formed, a p type well region 2 is disposed, while in the semiconductor layer 42 on which the p-type MISFET is to be formed, an n-type well region 3 is disposed. The semiconductor layers 42 are each encompassed by an insulating film 41 disposed over the p type substrate 1, and they are separated and electrically isolated.

The n-type and p-type MISFETs of this Embodiment 10 have a double gate structure in which the semiconductor layer 42 to be used as a channel formation region is sandwiched by two gate electrodes 6 in the thickness direction of the p type substrate 1. In addition, the n-type and p-type MISFETs have a horizontal structure permitting flow of a drain current in the plane direction of the substrate 40.

The n-type MISFET is sandwiched, in the thickness direction of the p type substrate 1, by two silicon nitride films 14a for generating a tensile stress in its channel formation region. One of the silicon nitride films 14a is disposed between the p type substrate 1 and the n-type MISFET, while the other one is disposed to cover therewith the upper surface of the n-type MISFET.

The p-type MISFET is sandwiched, in the thickness direction of the p type substrate 1, by two silicon nitride films 14b for generating a compressive stress in its channel formation region. One of the silicon nitride films 14b is disposed between the p type substrate 1 and the p-type MISFET, while the other one is disposed to cover therewith the upper surface of the p-type MISFET.

In Embodiment 10, the n-type and p-type MISFET have a double gate structure in which the semiconductor layer 40c to be used as a channel formation region is sandwiched between two gate electrodes 6 in the depth direction of the substrate 40. In addition, covering with two silicon nitride films doubles the influence of the stress caused by the silicon nitride film and heightens the drain current increasing ratio compared with the conventional type having a single gate structure.

The invention made by the present inventors has been described specifically with reference to various Embodiments. It is needless to say the present invention is not limited to or by these Embodiments, and the disclosed features can be changed within a range not departing from the gist of the invention.

For example, by application of the structure of the present invention to the peripheral circuit or logic circuit of at least the memory system of products having a memory system, such as a SRAM (Static Random Access Memory), DRAM (Dynamic Random Access Memory) and flash memory, higher-performance memory products are made available.

Advantages available by the typical features and aspects of the invention disclosed in the present application will be described below.

The present invention makes it possible to increase the drain current (to improve the current driving capacity) of an n-channel conductivity type electric field transistor and a p-channel conductivity type electric field transistor.

The present invention makes it possible to freely set the drain current ratio between an n-channel conductivity type electric field transistor and a p-channel conductivity type electric field transistor.

What is claimed is:

1. A method of manufacturing a semiconductor device having an n-channel conductivity type field effect transistor and a p-channel conductivity type field effect transistor, each formed over a semiconductor substrate, comprising steps of:
(a) forming first sidewall spacers over a semiconductor region between each of gate electrodes of said n channel conductivity type and p channel conductivity type field effect transistors and an element isolation region of said semiconductor substrate in alignment with each of said gate electrodes;
(b) forming, over the surface of said semiconductor region, a metal semiconductor reacted layer in alignment with said first sidewall spacers;
(c) forming second sidewall spacers over said metal-semicondutor reacted layer in self-alignment with said first sidewall spacers;
(d) forming, over said n-channel conductivity type and p-channel conductivity type field effect transistor, a first insulating film for generating a tensile stress in a channel formation region of said n-channel conductivity type field effect transistor so as to cover gate electrodes of said transistors;
(e) selectively removing said first insulating film from the upper surface of said p-channel conductivity type field effect transistor by etching;
(f) forming, over said n-channel conductivity type and said p-channel conductivity type field effect transistors, a second insulating film for generating a compressive stress in a channel formation region of said p-channel conductivity type field effect transistor so as to cover the gate electrodes of said transistors; and
(g) selectively removing said second insulating film from the upper surface of said n-channel conductivity type field effect transistor,
wherein said second sidewall spacers have etching selectivity over said first insulating film.

2. A method according to claim 1,
wherein said step (e) is effected by isotropic etching.

3. A method according to claim 1,
wherein said first and second insulating films are each an insulating film made of a silicon nitride film for self-aligning contact.

4. A method of manufacturing a semiconductor device having an n-channel conductivity type field effect transistor and a p-channel conductivity type field effect transistor, each formed over a semiconductor substrate, comprising steps of:
(a) forming first sidewall spacers over a semiconductor region between each of gate electrodes of said n channel conductivity type and p channel conductivity type field effect transistors and an element isolation region of said semiconductor substrate in alignment with each of said gate electrodes;
(b) forming, over the surface of said semiconductor region, a metal-semiconductor reacted layer in alignment with said first sidewall spacers;
(c) forming second sidewall spacers over said metal-semicondutor reacted layers in self-alignment with said first sidewall spacers;
(d) forming, over said n-channel conductivity type and p-channel conductivity type field effect transistors, a first insulating film for generating a compressive stress in a channel formation region of said p-channel conductivity type field effect transistor so as to cover the gate electrodes of said transistors;
(e) selectively removing said first insulating film from the upper surface of said n-channel conductivity type field effect transistor by etching;
(f) forming, over said n-channel conductivity type and said p-channel conductivity type field effect transistors, a second insulating film for generating a tensile stress in a channel formation region of said n-channel conductivity type field effect transistor so as to cover the gate electrodes of said transistors; and
(g) selectively removing said second insulating film over the p-channel conductivity type field effect transistor,
wherein said second sidewall spacers have etching selectivity over said first insulating film.

5. A method of manufacturing a semiconductor device having an n-channel conductivity type field effect transistor and a p-channel conductivity type field effect transistor, each formed over a semiconductor substrate, comprising steps of:
(a) forming sidewall spacers which cover the sidewalls of each of gate electrodes of said n-channel conductivity type and p-channel conductivity type field effect transistors;

(b) forming a first insulating film which at least covers said gate electrode and a semiconductor region of said p-channel conductivity type field effect transistor;

(c) forming a second insulating film for generating a tensile stress in a channel formation region of said n-channel conductivity type field effect transistor which covers said n-channel conductivity type and p-channel conductivity type field effect transistors;

(d) selectively removing said second insulating film from the upper surface of said p-channel conductivity type field effect transistor by etching;

(e) forming a third insulating film for generating a compressive stress in a channel formation region of said p-channel conductivity type field effect transistor which covers said n-channel conductivity type and p-channel conductivity type field effect transistors; and (f) selectively removing said third insulating film from the upper surface of said n-channel conductivity type field effect transistors, wherein said first insulating film has etching selectivity over said second insulating film.

6. A method according to claim 5, further comprising a step of forming source drain contact holes for said n-channel transistor and said p-channel transistor after said step (b) and (d).

7. A method according to claim 5,
wherein said first insulating film is a deposited film which covers said sidewall spacer of said p-channel conductivity type field effect transistor.

8. A method according to claim 5,
wherein said first insulating film is a deposited film which covers said sidewall spacer of said p-channel conductivity type field effect transistor, and
wherein a metal semiconductor reacted layer formed in alignment with said sidewall spacers is disposed over the surface of said semiconductor region.

9. A method according to claim 5,
wherein said first insulating film is a thermally oxidized film formed on said gate electrode and a semiconductor region of said p-channel conductivity type field effect transistor.

10. A method according to claim 5,
wherein said first insulating film is a thermally oxidized film formed on said gate electrode and a semiconductor region of said p-channel conductivity type field effect transistor.

11. A method according to claim 5,
wherein said step (d) is carried out by isotropic etching.

12. A method according to claim 5,
wherein said step (f) is carried out by isotropic etching.

13. A method according to claim 5,
wherein said insulating films are each a silicon nitride film for self-aligning contact.

14. A method according to claim 5, further comprising a step of forming a fourth insulating film over said second insulating film after said step (c) but before said step (d),
said step (d) including a step of selectively removing said fourth insulating film from the upper surface of said p-channel conductivity type field effect transistor.

15. A method according to claim 5,
wherein said first insulating film is a deposited film which covers said sidewall spacer of said p-channel conductivity type field effect transistor, and
wherein said method further comprises removing said deposited film on the side of said p-channel conductivity type field effect transistor after said step (d) but before said step (e).

16. A method according to claim 5,
wherein said first insulating film is a deposited film which covers said sidewall spacer of said p-channel conductivity type field effect transistor, and
wherein, in said step (b), removing said deposited film on the side of said n-channel conductivity type field effect transistor after forming said deposited film over said n-channel conductivity type and p-channel conductivity type field effect transistors.

17. A method according to claim 7,
wherein said first insulating film is a deposited film which covers said sidewall spacer of said n-channel conductivity type field effect transistor, and
wherein said method further comprises removing said deposited film on the side of said n-channel conductivity type field effect transistor after said step (d) but prior to said step (e).

18. A method according to claim 7,
wherein said first insulating film is a deposited film which covers said sidewall spacer of said n-channel conductivity type field effect transistor, and
wherein, in said step (b), removing said deposited film on the side of said p-channel conductivity type field effect transistor after forming said deposited film over said n-channel conductivity type and p-channel conductivity type field effect transistors.

19. A method of manufacturing a semiconductor device having an n-channel conductivity type field effect transistor and a p-channel conductivity type field effect transistor, each formed over a semiconductor substrate, comprising steps of:

(a) forming sidewall spacers which cover the sidewalls of each of gate electrodes of said n-channel conductivity type and p-channel conductivity type field effect transistors;

(b) forming a first insulating film which at least covers said gate electrode and a semiconductor region of said n-channel conductivity type field effect transistor;

(c) forming a second insulating film for generating a compressive stress in a channel formation region of said p-channel conductivity type field effect transistor which covers said n-channel conductivity type and p-channel conductivity type field effect transistors;

(d) selectively removing said second insulating film from the upper surface of said n-channel conductivity type field effect transistor by etching;

(e) forming a third insulating film for generating a tensile stress in a channel formation region of said n-channel conductivity type field effect transistor which covers said n-channel conductivity type and p-channel conductivity type field effect transistors; and (f) selectively removing said third insulating film from the upper surface of said p-channel conductivity type field effect transistor, wherein said first insulating film has etching selectivity over said second insulating film.

20. A method according to claim 19, further comprising a step of forming source drain contact holes for said n-channel transistor and said p-channel transistor after said steps (b) and (d).

21. A method according to claim 19, further comprising the step of forming a fourth insulating film over said second insulating film after said step (c) but before said step (d),
said step (d) including a step of selectively removing said fourth insulating film from the upper surface of said n-channel conductivity type field effect transistor.

* * * * *